United States Patent [19]
Yoshizumi et al.

[11] Patent Number: 5,444,012
[45] Date of Patent: Aug. 22, 1995

[54] METHOD FOR MANUFACTURING SEMICONDUCTOR INTEGRATED CIRCUIT DEVICE HAVING A FUSE ELEMENT

[75] Inventors: Keiichi Yoshizumi, Kokubunji; Kazushi Fukuda, Kodaira; Seiichi Ariga, Ohme; Shuji Ikeda, Koganei; Makoto Saeki, Ohme; Kiyoshi Nagai, Kodaira; Soichiro Hashiba, Nagoya; Shinji Nishihara, Koganei; Fumiyuki Kanai, Houya, all of Japan

[73] Assignees: Hitachi, Ltd.; Hitachi ULSI Engineering Corp., both of Tokyo, Japan

[21] Appl. No.: 278,073

[22] Filed: Jul. 20, 1994

[30] Foreign Application Priority Data

Jul. 20, 1993 [JP] Japan ................... 5-178676

[51] Int. Cl.⁶ .................... H01L 21/70; H01L 27/00
[52] U.S. Cl. .................... 437/60; 437/228; 437/922; 148/DIG. 55
[58] Field of Search .............. 437/922, 52, 60, 228; 257/529; 148/DIG. 55

[56] References Cited

U.S. PATENT DOCUMENTS

| | | | |
|---|---|---|---|
| 4,455,194 | 6/1984 | Yabu et al. ................ | 156/653 |
| 5,025,300 | 6/1991 | Billing et al. .............. | 257/529 |
| 5,241,212 | 8/1993 | Motonami et al. .......... | 257/529 |

*Primary Examiner*—Olik Chaudhuri
*Assistant Examiner*—H. Jey Tsai
*Attorney, Agent, or Firm*—Antonelli, Terry, Stout & Kraus

[57] ABSTRACT

In depositing a silicon oxide film which constitutes part of a final passivation film onto a bonding pad formed on an interlayer insulating film, the silicon oxide depositing step is divided in two stages, and after the first deposition, the bonding pad is once exposed by etching, then the second deposition is performed, whereby the silicon oxide film which has thus been deposited in two stages is formed over a fuse element formed under the interlayer insulating film, while on the bonding pad is formed only the silicon oxide film deposited in the second stage. As a result, at the time of etching polyimide resin, silicon nitride film and silicon oxide film successively to expose the bonding pad, there remains a sufficient thickness of insulating film between the bottom of an aperture which is formed at the same time and the fuse element. Thereafter, an electrical test is conducted while applying a probe to the bonding pad and, where required, the fuse element located under the aperture is cut.

12 Claims, 49 Drawing Sheets

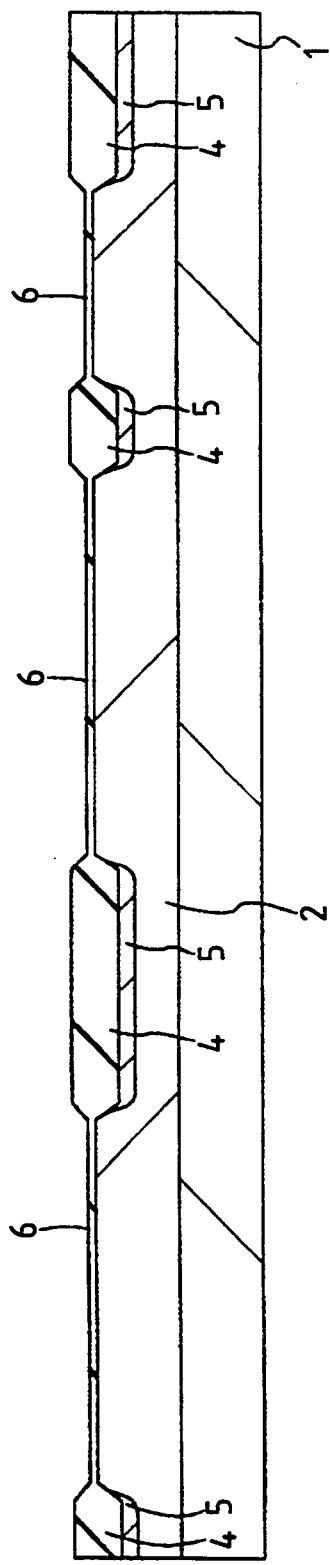
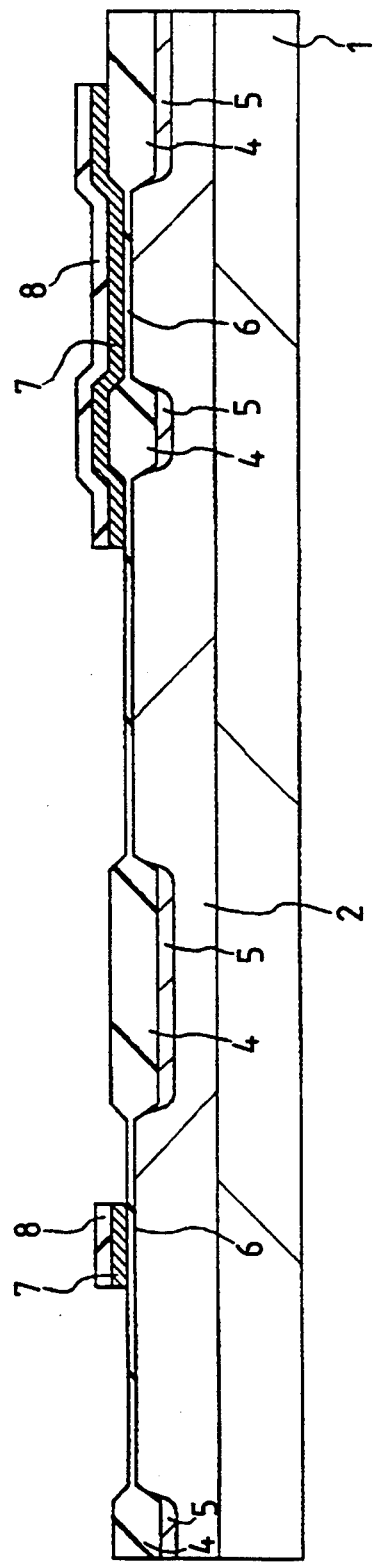

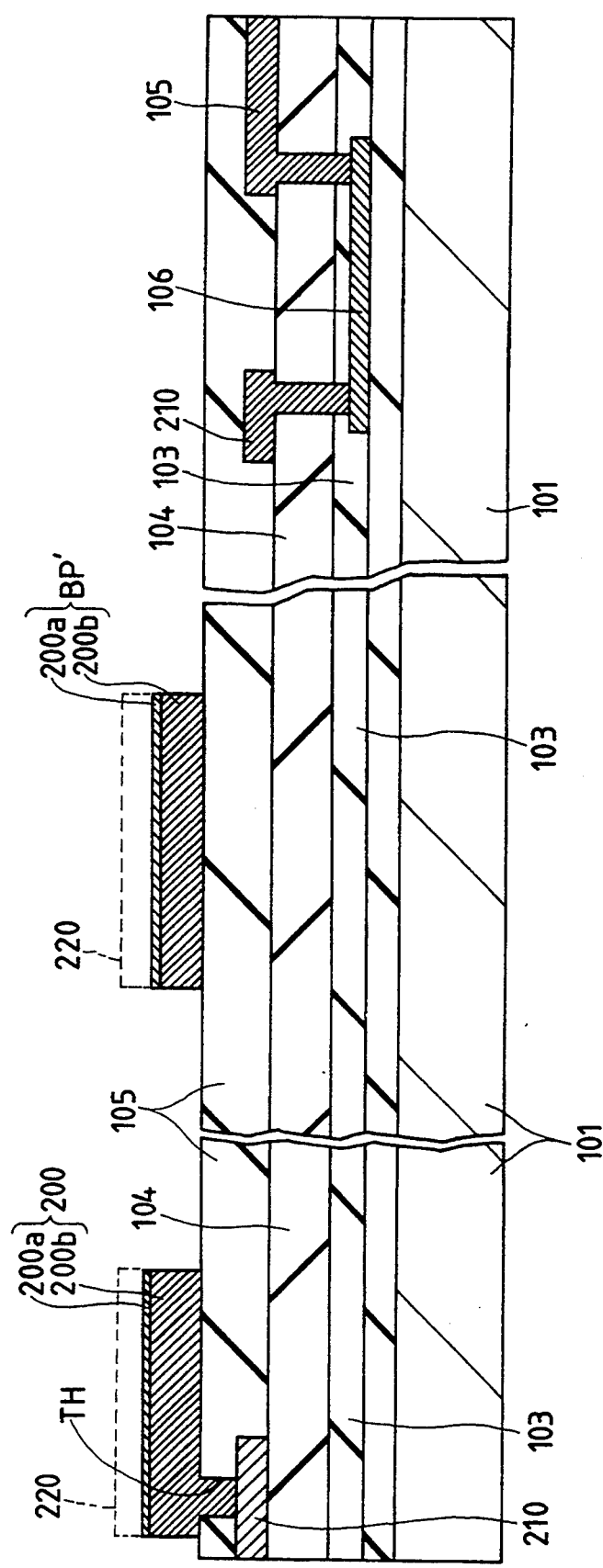

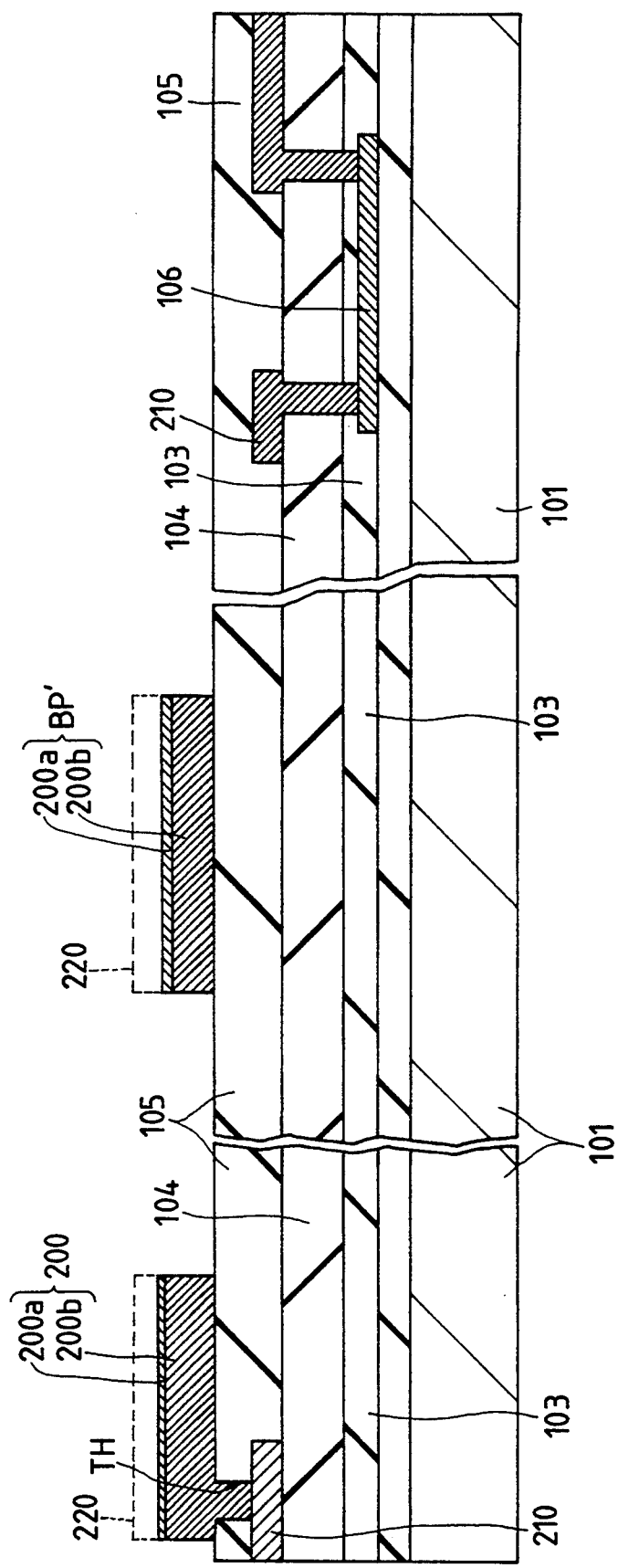

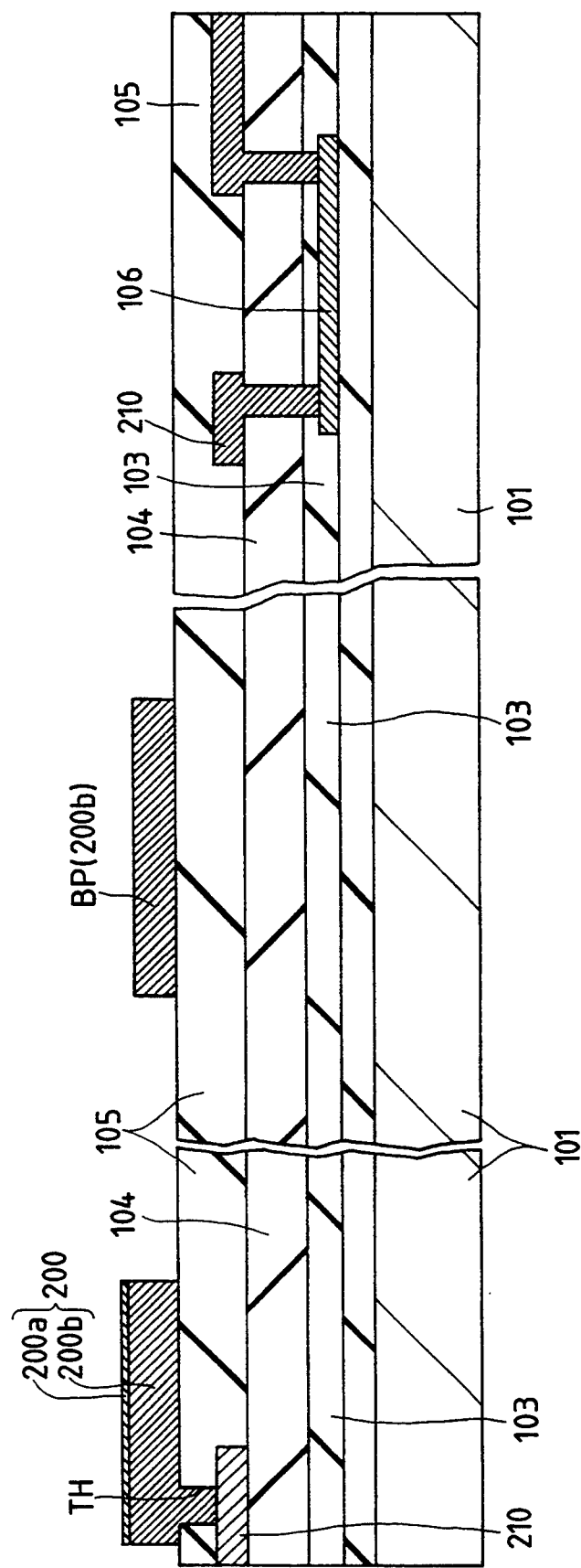

METHOD FOR MANUFACTURING SEMICONDUCTOR INTEGRATED CIRCUIT DEVICE HAVING A FUSE ELEMENT

BACKGROUND OF THE INVENTION

The present invention relates to a technique for manufacturing a semiconductor integrated circuit device, particularly a technique effective in application to a semiconductor integrated circuit device which uses a fuse of polysilicon to repair memory cell defects or make a fine adjustment of a semiconductor chip internal voltage.

Such semiconductor memories as a static random access memory (SRAM) and a dynamic random access memory (DRAM) are each provided with a redundancy circuit for repairing defects of some memory cells which occur in the memory manufacturing process. Switching from a defective memory cell to a spare memory cell formed in the redundancy circuit is usually performed by cutting a fuse of polysilicon. As to SRAM, it is described, for example, in U.S. Pat. No. 5,239,196 from Ser. No. 653,493 filed by the applicant in the present case on Feb. 11, 1991.

Further, the technique of providing an anti-reflection film for diminishing reflection from a base layer of resist at the time of patterning an aluminum wiring line using dry etching under the tendency to making the pattern size finer, is described, for example, in Nikkei Microdevice (published by Nikkei BP Co.) 1989 March Number, pp. 70–74. According to this literature, TiN is used on Al as an anti-reflection film in SRAM.

By providing such anti-reflection film, it is possible to form a finish pattern as designed and hence possible to make the wiring pattern size finer.

As to the anti-reflection film, it is also described in U.S. Pat. No. 4,910,122.

Reference will now be made to an example of a manufacturing (first manufacturing process) for a semiconductor memory provided with a fuse which technique has not been regarded as well known but has been studied by the present inventor. FIGS. 37 to 44 are each a sectional view of a principal portion of a semiconductor substrate (wafer), in which the right-hand side represents a fuse forming region, the central portion represents a bonding pad forming region and the left-hand side represents a wiring forming region.

First, as shown in FIG. 37A, top wiring layers 200b and 200a are successively laminated onto an interlayer insulating film 105 of a semiconductor substrate 101. For example, the wiring layer 200b is an aluminum alloy film, while the wiring layer 200a is an anti-reflection film constituted by titanium-tungsten (TiW) or titanium nitride (TIN). Both films are formed by a sputter deposition method for example. Thus, the top wiring layer is of a multilayer structure of metallic films, whose top is formed by the anti-reflection film. For example, the top wiring layer is a second metallic wiring layer.

Next, as shown in FIG. 38B, the top wiring layer is subjected to patterning according to a dry etching method using photoresist 220 to form a top wiring line 200 and a bonding pad BP'.

On the other hand, a polysilicon fuse 106 is disposed below interlayer insulating films 103, 104 and 105 because it is formed simultaneously with the formation of a gate electrode of MOSFET (Metal-Oxide-Insulator Field Effect Transistor). In this example, the interlayer insulating film 103 is constituted by a silicon oxide film, the interlayer insulating film 104 is constituted by a BPSG (Boron-doped Phospho Silicate Glass) film, and the interlayer insulating film 105 is constituted by a three-layer insulating film comprising silicon oxide film, spin on glass (SOG) film and silicon oxide film which are successively laminated together. The top wiring line 200 is connected an underlying writing layer 210 through a through hole TH. The wiring layer 210 is a first metallic wiring layer.

Then, as shown in FIG. 38, a silicon oxide film 107 which constitutes a part of a final passivation film is deposited on the interlayer insulating film 105. The silicon oxide film 107 is deposited to a thickness of, say, 400 nm or so.

Next, as shown in FIG. 39, by etching the silicon oxide film 107, a bonding pad BP is exposed and an aperture 108 is formed above the fuse 106. Then, a probe (not shown) is applied to the surface of the bonding pad BP and a first electrical test is conducted. In the first electrical test, the device is checked mainly for its low temperature characteristic. When a defective memory cell was found out as a result of this test, a laser beam is radiated to the fuse 106 through the interlayer insulating films 105, 104 and 103 located below the aperture 108 to cut the fuse 106, thereby switching from the defective memory cell to a spare memory cell.

In the step of exposing the bonding pad BP shown in FIG. 39, the anti-reflection film 200a formed on the bonding pad BP' is removed together with the interlayer insulating film 107 by etching, using a photoresist 230.

The reason for removal of the anti-reflection film 200a formed on the bonding pad BP' is as follows. In the first electrical test, light is directed to the bonding pad BP and the reflected light is detected to thereby detect the position of the pad BP, and after alignment, a probe is applied to the pad BP. In this case, if the anti-reflection film 200a is present on the bonding pad BP, the reflected light from the same pad will be weakened, thus making it impossible to detect the position of the bonding pad. Therefore, it is necessary to remove the anti-reflection film 200a on the bonding pad.

Next, as shown in FIG. 40, a silicon oxide film 107' is again deposited on the silicon oxide film 107 to cover the bonding pad BP and the aperture 108, and a silicon nitride film 109 is deposited thereon. Together with the underlying silicon oxide films 107 and 107' the silicon nitride film 109 constitutes a final passivation film. In this case, the silicon oxide film 107' is deposited at a thickness of, say, 400 nm or so by a plasma CVD (chemical vapor deposition) method for example, and the silicon nitride film 109 is deposited at a thickness of, say, 1.2 μm or so also by the plasma CVD method. As a result of the deposition of both films 107' and 109, the aperture 108 located above the fuse 106 is filled up by the final passivation film. Consequently, it is possible to prevent the occurrence of corrosion near the fuse 106 which is caused by the entry of moisture from the air through the aperture 108 after cutting of the fuse.

Then, as shown in FIG. 41, the silicon oxide film 107' is exposed by etching the silicon nitride film 109 positioned above the bonding pad BP, using a photoresist 240 as mask, and thereafter a polyimide resin 110 is applied onto the silicon nitride film 109, as shown in FIG. 4. The application of the polyimide resin 110 is made so as to give a film thickness of, say, 10 μm or so.

Next, as shown in FIG. 43, the silicon nitride film 109 and the silicon oxide film 107' are exposed by etching the polyimide resin 110 positioned above the bonding pad BP, using a photoresist 250 as mask. Further, after removal of the photoresist 250, the bonding pad BP is exposed by etching the silicon oxide film 107' using the silicon nitride film 109 as mask, as shown in FIG. 44. Thus, in this etching step, the silicon oxide film is removed selectively by using an etchant which exhibits a high selection ratio between silicon nitride film and silicon oxide film.

Next, there is performed the second electrical test in which the probe is applied to the surface of the bonding pad BP. In the second electrical test, the device is checked mainly for its high-temperature characteristic. By this test it is judged whether each chip on the semiconductor wafer is good or bad. In this way the semiconductor memory manufacturing process (wafer process) is completed.

Thus, in the above technique, the reliability of the fuse cutting aperture is ensured by coating the aperture completely with a final passivation film while keeping the increase in the number of manufacturing steps to a minimum.

However, since the manufacturing process involves a step of depositing the final passivation film (comprising silicon oxide film and silicon nitride film) during the period after the first electrical test until the second electrical test, it is likely that the device characteristics will be changed due to thermal damage, charge-up or any other heat treatment in the final passivation film depositing step and that a chip which was judged to be good in the first electrical test will become defective while going through subsequent steps.

Particularly, in connection with the SRAM described in the foregoing U.S. Pat. No. 5,236,196, the present inventor found out that there was a fear of change in device characteristics, e.g. Vth shift or decrease of Ids, in a p-channel load MISFET constituted by a polysilicon film formed on a driver MISFET.

For the purpose of avoiding the above-mentioned inconvenience, there has been proposed the following manufacturing process (second manufacturing process) shown in FIGS. 45 to 51A and not involving a step which causes a thermal damage between the first and second electrical tests.

First, as shown in FIG. 45A, top wiring layers 200b and 200a are successively laminated onto a semiconductor substrate 101 in the same manner as in the foregoing manufacturing process shown in FIG. 37A, [step (a) in FIG. 51A].

Next, as shown in FIG. 45B, a top wiring line 200 and a bonding pad BP' are formed in the same manner as in the foregoing manufacturing process shown in FIG. 37B, [step (b) in FIG. 51A].

Then, as shown in FIG. 45C, the other portion than a bonding pad forming region is covered with a photoresist (not shown), and only the anti-reflection film 200a on the bonding pad BP' is removed by etching, [step (c) in FIG. 51A].

On the other hand, by allowing the anti-reflection film 200a to remain in the top wiring line 200 except the portion corresponding to the bonding pad BP, it is made possible to diminish the occurrence of breaking of the wiring line 200 caused by electromigration, etc. Such a technique of providing an anti-reflection film (TIN) as a top layer in a multilayer structure of metallic films and diminishing electromigration is described in IEEE Transactions on Electron Devices, Vol. 40, No. 2, February 1993, pp.296–302.

Next, as shown in FIG. 46, a final passivation film (comprising silicon oxide film 107 and silicon nitride film 109) is deposited on an interlayer insulating film 105, [steps (d) and (e) in FIG. 51A]. The silicon oxide film is deposited at a thickness $t_1$ of 800 nm or so. Thus, in this manufacturing process, a thickness of about 800 nm is obtained at a time although in the foregoing first manufacturing process the silicone oxide film 107 was deposited in two stages each about 400 nm in thickness. The silicon nitride film 109 is deposited at a thickness of about 1.2 μm which is the same as in the first manufacturing process.

Then, as shown in FIG. 47, the silicon nitride film 109 above the bonding pad BP and that above a fuse 106 are etched using a photoresist 260 as mask to expose the silicon oxide film 107. Thereafter, the resist 260 is removed, and a polyimide resin 110 is applied onto the silicon nitride film 109, as shown in FIG. 48. In this case, the thickness of the resulting polyimide film is set at about 10 μm which is the same as in the first manufacturing process.

Next, as shown in FIG. 49, the polyimide resin 110 above the bonding pad BP and that above the fuse 106 are etched using a photoresist 270 as mask to expose the silicon nitride film 109 and the silicon oxide film 107, followed by removal of the resist 270. Then, as shown in FIG. 50, by etching the silicon oxide film 107 using the silicon nitride film 109 as mask, the bonding pad BP is exposed and at the same time an aperture 108 is formed above the fuse 106.

Next, the first electrical test is made while applying a probe to the surface of the bonding pad BP. When a defective memory cell was found out in this first electrical test, a laser beam is radiated to the fuse 106 through the interlayer insulating films 105, 104 and 103 located below the aperture 108 to cut the fuse, thereby switching from the defective memory cell to a spare memory cell.

Subsequently, there is conducted the second electrical test while applying the probe to the surface of the bonding pad BP. By this electrical test it is judged whether each chip on the semiconductor wafer is good or bad, and the semiconductor manufacturing process (wafer process) is completed.

Thus, in the second manufacturing process described above, two electrical tests and memory cell defect repair are performed continuously in the final stage of the wafer process. Unlike the first manufacturing process, therefore, there is no fear of change in device characteristics between the first and the second electrical test, so that it is possible to judge exactly whether a semiconductor chip is good or bad.

SUMMARY OF THE INVENTION

However, according to a study made by the present inventor, the second manufacturing process described above involves the problem that the aperture for cutting the fuse is less reliable.

More particularly, in the above second manufacturing process, the aperture 108 is formed above the fuse 108 simultaneously with etching the silicon oxide film 107 to expose the bonding pad BP (see FIG. 50). At this time, in order to expose the bonding pad BP completely, the silicon oxide film 107 which is very thick (800 nm or so in the above example, provided the actual thickness $t_1$ is about 700 nm because the surface of the silicon oxide film 107 is also etched to some extent at the time of etching the silicon nitride film 109 on the film 107) on the bonding pad BP is etched at a time in consideration of an over-etching volume, so that the interlayer insulating film 105 which constitutes the bottom of the aperture 108 is cut out deep. Consequently, the thickness of the interlayer insulating film 105 located below the aperture 108 becomes small, thus giving rise to the problem that the margin against the entry of moisture decreases. In more particular terms, moisture may enter the fuse 106 which is not cut as in FIG. 50, causing an increase in the resistance of the fuse 106 and corrosion in the vicinity of the fuse. Moreover, the interlayer insulating film 104 (BPSG film) which underlies the interlayer insulating film 105 may be exposed to the bottom of the aperture 108 due to scatter in the manufacturing process, thus resulting in that moisture enters from the bottom of the aperture 108 in a pressure cooker test for example and causes corrosion in the vicinity of the fuse.

In the foregoing second manufacturing process, the over-etching volume of the silicon nitride film 109 also increases at the time of etching the silicon oxide film 107 on the bonding pad BP. In other words, the thickness of the silicon nitride film 109 which is high in water resistance becomes smaller, so that it is impossible to ensure a sufficient margin against the entry of moisture and hence the reliability of the fuse aperture is further deteriorated.

In the foregoing first and second manufacturing processes, as shown in FIGS. 44 and 50, the bonding pad BP exposing step is carried out by etching the silicon oxide film 107 using the silicon nitride film 109 as mask. In this step, if the silicon oxide film and the anti-reflection film 200a on the bonding pad BP' are to be removed continuously by etching while allowing the anti-reflection film to remain on the bonding pad BP', as shown in FIG. 52A, it is impossible to take a selection ratio of the anti-reflection film 200a of TiW and the film 109 is largely over-etched, as shown in FIG. 52B. This is because the anti-reflection film 200a of TiW and the silicon nitride film 109 are etched by the same etchant. As a result, the silicon nitride film 109 is no longer present around the bonding pad BP and hence the bonding pad BP is corroded more easily by moisture. Consequently, the reliability of the device is deteriorated.

In the foregoing first and second manufacturing processes, it is necessary to provide a step of removing the anti-reflection film 200a on the bonding pad BP' prior to application of the polyimide resin 110 (see FIGS. 39 and 45C).

FIGS. 52A and 52B show only a fuse forming region.

In FIG. 50, if the thickness of the interlayer insulating film 105 is made larger, the depth of the through-hole TH which connects overlying and underlying wiring lines 200, 210 together becomes larger, resulting in increase of the aspect ratio at the time of forming the through-hole TH, and therefore it becomes impossible for the through-hole TH to open fully. For this reason, a limit is encountered in thickening the interlayer insulating film 105.

It is the object of the present invention to provide a technique which permits ensuring the reliability of the aperture for cutting the fuse and exact judgment as to whether each chip is good or bad while keeping an increasing in the number of manufacturing steps to a minimum.

The above and other objects and novel features of the present invention will become apparent from the following description and the accompanying drawings.

The following description is now provided about a typical one out of the inventions disclosed herein, with reference to FIG. 51B.

(1) A method for manufacturing a semiconductor integrated circuit device, comprising the steps of:

(a) providing a semiconductor substrate having a fuse formed on a main surface thereof;

(b) forming an interlayer insulating film over the fuse so as to cover the fuse and the main surface;

(c) forming a wiring line having a bonding pad forming region on the interlayer insulating film [steps (a) and (b) in FIG. 51B];

(d) forming a first insulating film (silicon oxide film) on both the wiring line and the interlayer insulating film so as to cover the main surface [step (c) in FIG. 51B];

(e) selectively removing the first insulating film on the bonding pad forming region of the wiring line by etching [step (d) in FIG. 51B];

(f) forming a second insulating film (silicon oxide film) on the bonding pad forming region and the first insulating film so as to cover the main surface [step (e) in FIG. 51B];

(g) selectively removing the second insulating film on the fuse and the bonding pad forming region by etching so as to expose the bonding pad forming region and form an aperture over the fuse; and (h) conducting an electrical test while applying a probe to the bonding pad forming region and, if necessary, cutting the fuse positioned below the said aperture.

In the above method (1), the wiring line in step (c) is composed of at least a metallic wiring line and an anti-reflection film on the metallic wiring line, and by the etching in step (e) there are removed the anti-reflection film on the bonding pad forming region of the wiring line and the first insulating film. (2) In the above method (1), a silicon nitride film is provided between the bottom of the aperture and the fuse. (3) In the above method (1), there is provided a guard ring constituted by the same wiring line layer as that of the wiring line having the bonding pad forming region.

According to the above means (1), at the time of depositing the silicon oxide film as a constituent of the final passivation film onto the bonding pad formed on the interlayer insulating film, this silicon oxide film depositing step is divided in two stages. More specifically, the bonding pad is once exposed after the first deposition and then the second deposition is performed, whereby the thickness of the silicon oxide film on the bonding pad can be made smaller. Consequently, at the time of etching the polyimide resin film and the silicon oxide film successively to expose the bonding pad, it is possible to let a sufficient thickness of insulating film remain between the bottom of the aperture formed at the same time and the fuse, whereby the reliability of the aperture for cutting fuse is improved against the entry of moisture. Besides, the over-etching volume of the silicon nitride film decreases when etching the silicon oxide film on the bonding pad, so that it is possible to ensure a sufficient margin against the entry of moisture.

According to the above means (1), moreover, since there are conducted electrical test and fuse cutting in the final step of the wafer process, there is no fear of variation in device characteristics after the electrical test, whereby it is made possible to exactly judge whether a semiconductor chip is good or bad and hence the reliability of the chip sorting step and yield are improved.

According to the above means (2), since the silicon nitride film which is high in water resistance is provided between the bottom of the aperture and the fuse, the moisture which has entered from the bottom the aperture can be prevented from reaching the fuse.

According to the above means (3), since the guard ring constituted by a wiring material is provided around the aperture, the moisture from the bottom of the aperture can be prevented from reaching the fuse.

BRIEF DESCRIPTION OF THE DRAWINGS

FIG. 12 is a sectional view of principal portions of the semiconductor substrate, showing a method for fabricating the semiconductor integrated circuit device according to the present invention;

FIG. 13 is a sectional view of a principal portions of the semiconductor substrate, showing the fabricating method;

FIGS. 37A and 37B are sectional views of principal portions of a semiconductor substrate, showing a first example (first manufacturing process) of how to fabricate a semiconductor integrated circuit device which the present inventor has studied;

FIGS. 45A, 45B and 45C are sectional views of principal portions of a semiconductor substrate, showing a second example (second manufacturing process) of how to fabricate a semiconductor integrated circuit device which the present inventor has studied;

DETAILED DESCRIPTION OF THE PREFERRED EMBODIMENTS

Figure 1:
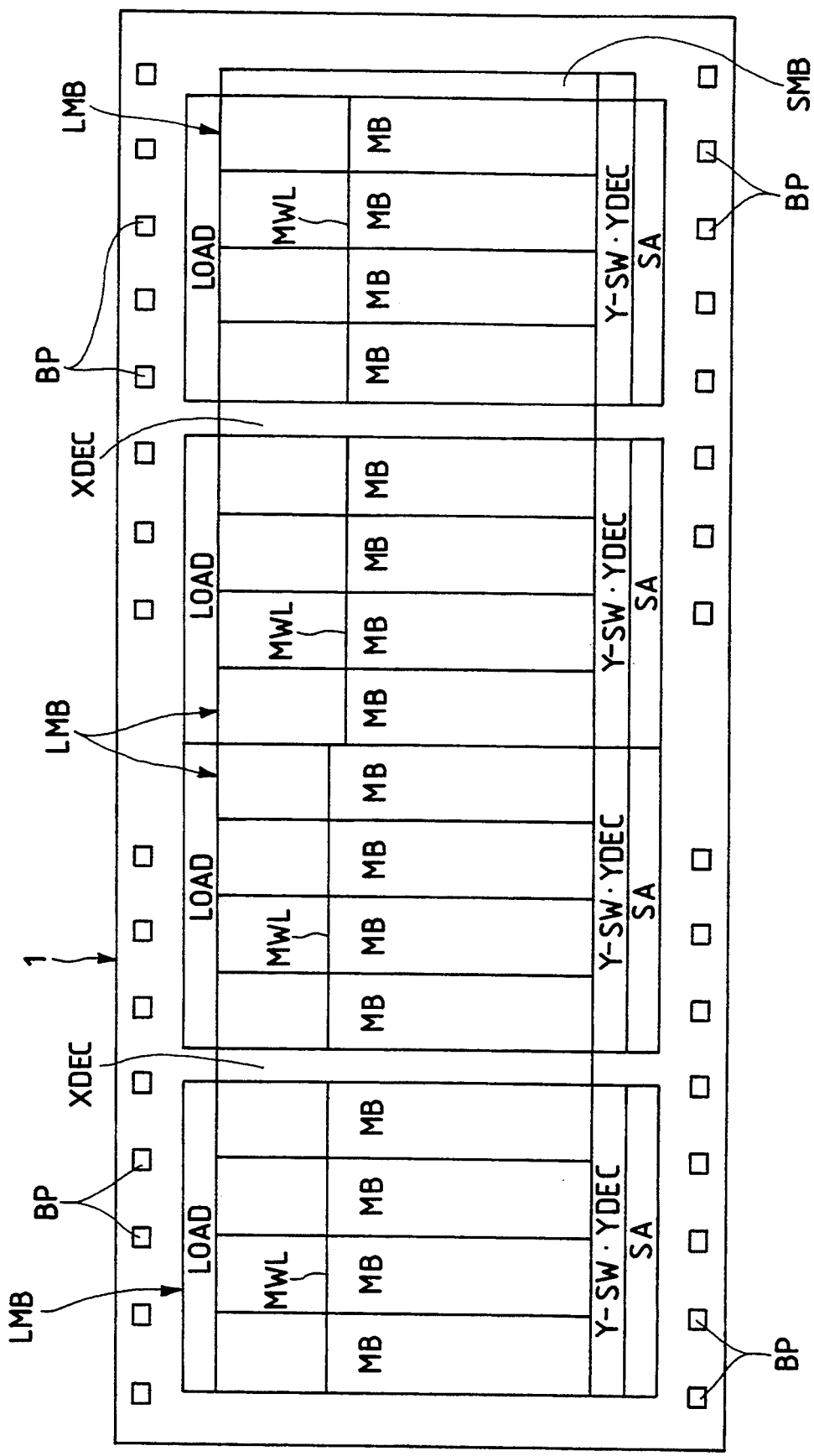
FIG. 1 is a schematic configuration diagram (chip layout) of the whole of a semiconductor integrated circuit device according to an embodiment of the present invention.

The present invention will be described in detail hereinunder by way of embodiments thereof. In all of the accompanying drawings for explanation of the embodiments, portions having the same functions are indicated by the same reference numerals, respectively, to omit repeated explanations thereof.

Figure 2:
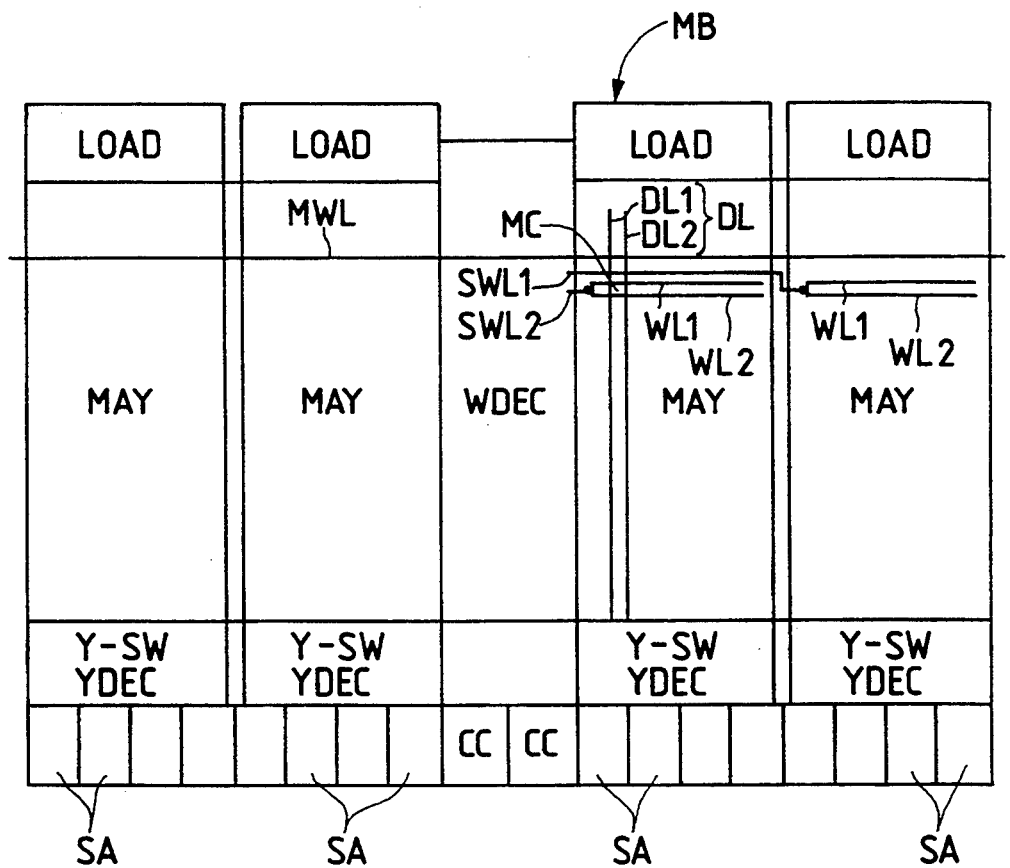
FIG. 2 is a partially enlarged diagram of FIG. 1.
Figure 3:
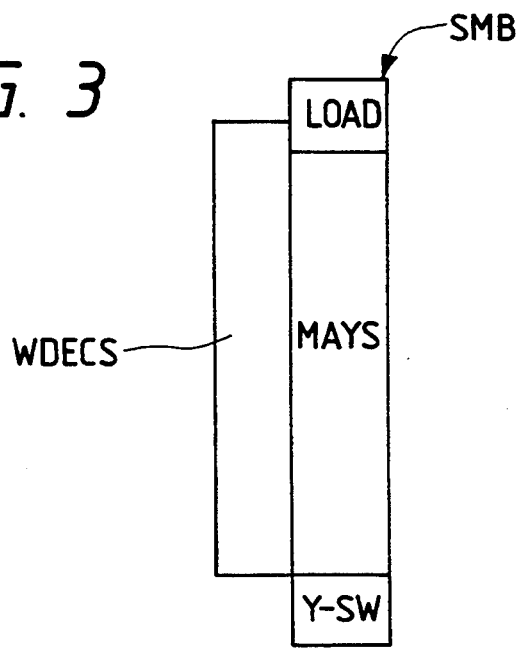
FIG. 3 is also a partially enlarged diagram of FIG. 1.

FIG. 1 is a schematic configuration diagram (chip layout) of the whole of SRAM embodying the present invention, and FIG. 2 is a partially enlarged diagram thereof.

First, with reference to FIGS. 1-10, 12-15 and 17-24, description will be directed to a circuit configuration of the entire SRAM according to this embodiment and a memory cell structure used therein. The contents thereof are basically the same as in the foregoing U.S. Pat. No. 5,239,196 and the contents of this literature are all incorporated herein by reference.

Figure 11:
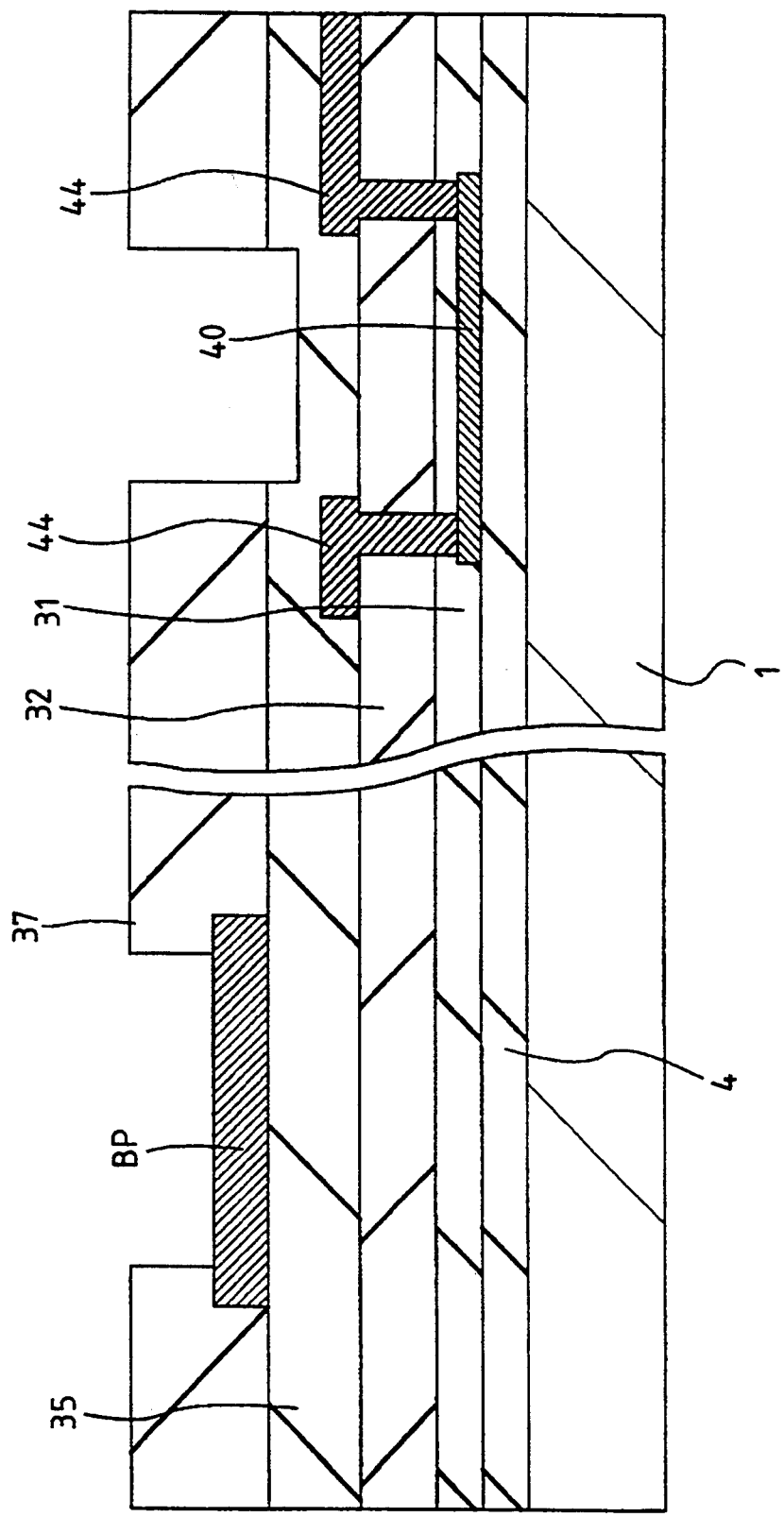
FIG. 11 is a sectional view of principal portions of the semiconductor substrate, showing a bonding pad and a fuse both formed in the semiconductor integrated circuit device.

FIG. 11 is a sectional view of principal portions of a fuse forming region in this embodiment.

FIGS. 16 and 25-32 are sectional views of principal portions, showing a process for forming a bonding pad and a fuse aperture, namely an aperture for cutting a fuse, both used in this embodiment.

On a main surface of a semiconductor chip 1 which is rectangular there is formed SRAM having a large capacity of, say, 4 to 16 Mbit though this point constitutes no special limitation. A memory cell region of the SRAM comprises four memory blocks, LMBs, each memory block LMB being divided into four memory blocks, MBs.

At one end of each LMB there is disposed a load circuit LOAD, while at the opposite end thereof are disposed Y selector circuit YSW, Y decoder circuit YDEC and sense amplifier circuit SA. Further, X decoder circuit XDEC is disposed between the memory block LMB located at the leftmost end of the main surface of the semiconductor chip 1 and the memory block adjacent thereto. Likewise, X decoder circuit XDEC is disposed between the memory block LMB located at the rightmost end of the main surface of the chip 1 and the memory block LMB adjacent thereto.

As shown in FIG. 2, the four memory blocks MB of each memory block LMB are each divided into four memory cell arrays MAY. Further, one word decoder circuit WDEC is disposed centrally of each memory block MB. The word decoder circuit WDEC is selected by the X decoder circuit XDEC through a main word line MWL which extends on the memory cell array MAY. The word decoder circuit WDEC selects a first word line $WL_1$ and a second word line $WL_2$ through a first subword line $SWL_1$ or a second subword line $SWL_2$ extending on the memory cell array MAY. At one end of the word decoder circuit WDEC is disposed a control circuit CC.

A complementary data line DL extends in a direction orthogonal to the first and second word lines $WL_1$, $WL_2$ extending on the memory cell array MAY. The complementary data line DL is composed of a first data line $DL_1$ and a second data line $DL_2$. One end of the complementary data line DL is connected to the load circuit LOAD, while the opposite end thereof is connected to the sense amplifier SA through the Y selector circuit YSW. A memory cell MC of SRAM is formed one in each region where the first and second word lines $WL_1$, $WL_2$ and the first and second data lines $DL_1$, $DL_2$ intersect each other in the memory cell array MAY.

As shown in FIG. 1, a redundancy circuit SMB is disposed at the rightmost end of the main surface of the semiconductor chip 1 in a position adjacent to the memory block LMB. In the redundancy circuit SMB is disposed a memory cell array MAYS for redundancy, as shown on a larger scale in FIG. 3. Further, in the memory array MAYS there are disposed a plurality of MCs having the same structure as that of the memory cell MC disposed in the memory cell array MAY.

As shown in FIG. 1, a plurality of bonding pads BP are disposed at the outermost peripheral portion of the semiconductor chip 1. Between the bonding pads BP and the redundancy circuit SMB is disposed a fuse for switching over a defective memory cell MC to a memory cell MC in the redundancy memory cell array MAYS, though not shown in the same figure. This defect repairing process for the memory cell, using such fuse, will be described rater.

Figure 4:
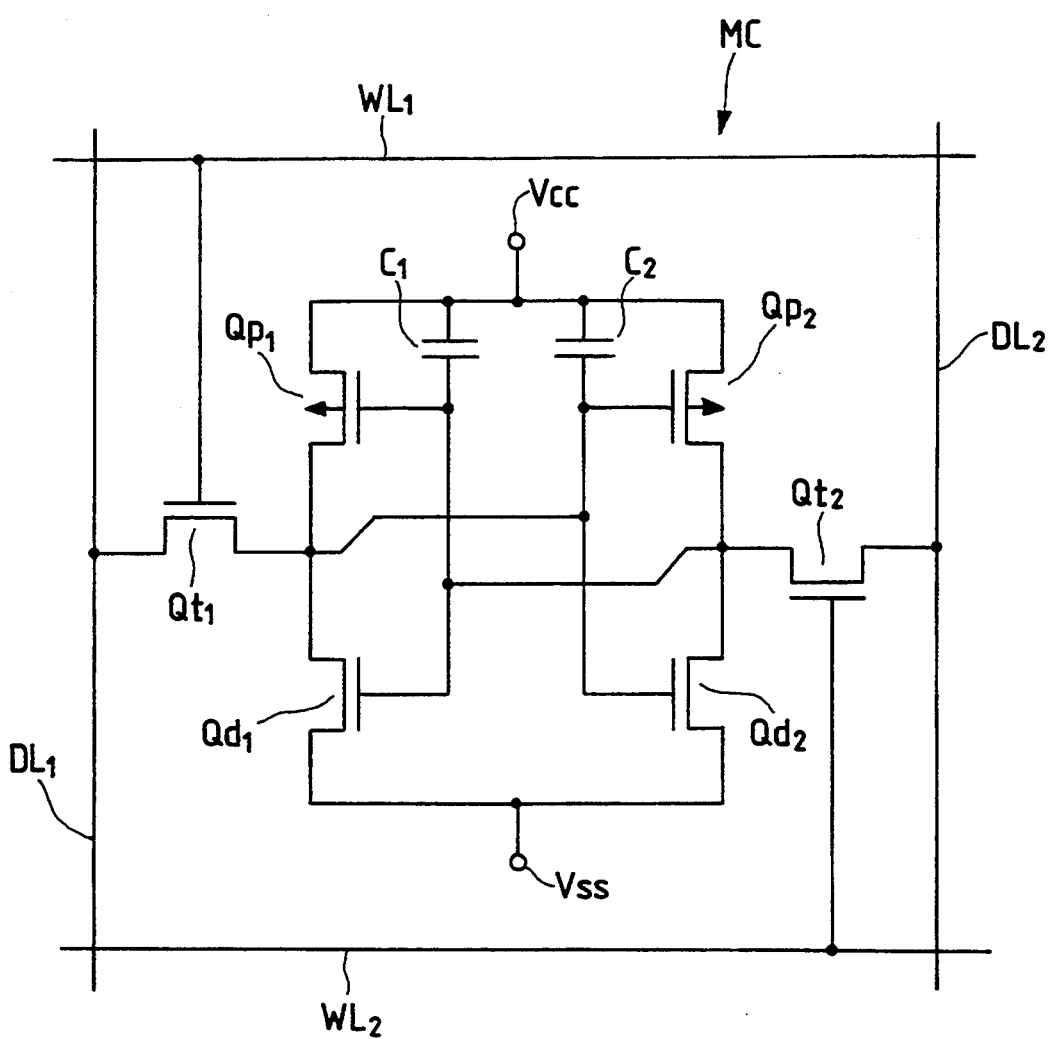
FIG. 4 is an equivalent circuit diagram of a memory cell used in the semiconductor integrated circuit device.

FIG. 4 is an equivalent circuit diagram of the memory cell MC. As shown in the same figure, the memory cell MC comprises a flip-flop circuit and two MIS (Metal-Insulator-Semiconductor) FETs $Qt_1$, $Qt_2$ for transfer.

The said flip-flop circuit comprises two n-channel type MISFETs $Qd_1$, $Qd_2$ for drive and two p-channel type MISFETs $Qp_1$, $Qp_2$ for load, and stores one bit of information ("1" or "0"). Thus, the memory cell MC in the SRAM of this embodiment has a complete CMOS structure which comprises six MISFETs.

The two MISFETs $Qt_1$, $Qt_2$ for transfer in the memory cell MC are n-channel type and the respective source or drain regions are connected to a pair of input-output terminals of the flip-flop circuit. One of source and drain regions of the MISFET $Qt_1$ for transfer is connected to the first data line $DL_1$, with its gate electrode connected to the first word line $WL_1$. On the other hand, one of source and drain regions of the MISFET $Qt_2$ for transfer is connected to the second data line $DL_2$, with its gate electrode connected to the second word line $WL_2$.

The MISFET $Qd_1$ for drive and MISFET $Qp_1$ for load are connected together at the respective drain regions (one input-output terminal of the flip-flop circuit) and also at the respective gate electrodes to constitute a CMOS. Likewise, the MISFET $Qd_2$ for drive and the MISFET $Qp_2$ are connected together at the respective drain regions (the other input-output terminal of the flip-flop) and also at the respective gate electrodes to constitute a CMOS.

The drain regions of the MISFET $Qd_1$ for drive and MISFET $Qp_1$ for load are connected to the other of source and drain regions of the MISFET $Qt_1$ for transfer and also connected to the gate electrodes of the MISFET $Qd_2$ for drive and MISFET $Qp_2$ for load. Likewise, the drain regions of the MISFET $Qd_2$ for drive and MISFET $QP_2$ for load are connected to the other of source and drain regions of the MISFET $Qt_2$ for transfer and also connected to the gate electrodes of the MISFET $Qd_1$ for drive and MISFET $QP_1$ for load. Source regions of the MISFET $Qd_1$ and $Qd_2$ for drive are connected to a reference voltage $V_{SS}$, while source regions of the MISFET $Qp_1$ and $Qp_2$ for load are connected to a supply voltage $V_{CC}$. The reference voltage $V_{SS}$ is, say, 0 V (ground potential) and the supply voltage $V_{CC}$, say, 5 V.

Between the gate electrodes of the MISFETs $Qp_1$, $Qp_2$ for load and the supply voltage $V_{CC}$ there are constituted capacitors $C_1$ and $C_2$ for improving the α-ray soft error resistance of the memory cell MC.

A concrete configuration of the memory cell MC in the SRAM will be described below with reference to FIGS. 5 to 10.

Figure 5:
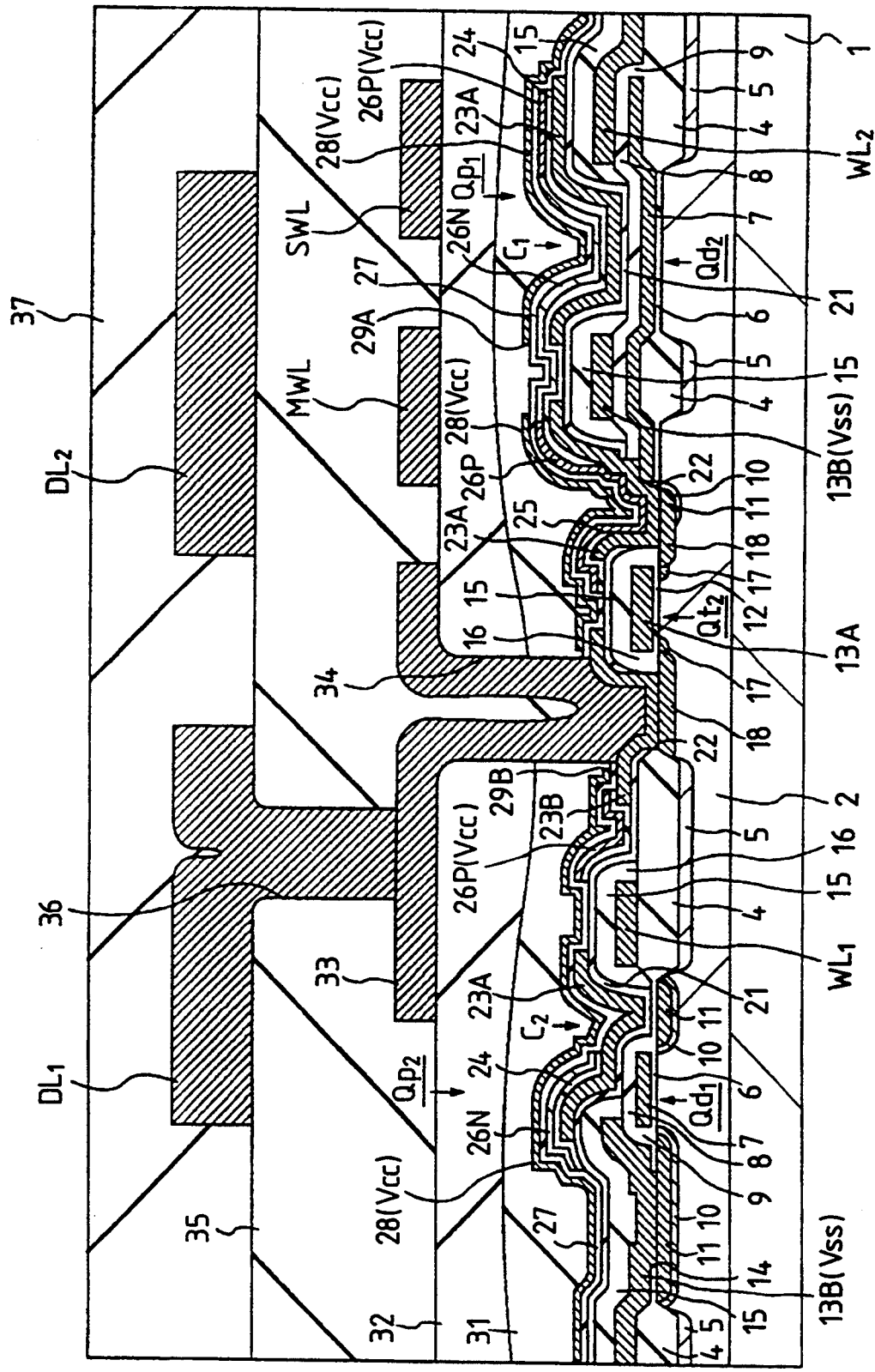
FIG. 5 is a sectional view of principal portions of a semiconductor substrate, showing the memory cell in the semiconductor integrated circuit device.

As shown in FIG. 5, a $p^-$-type well 2 is formed on a main surface of a semiconductor substrate (chip) 1 formed of an $n^-$-type silicon single crystal, and a field insulating film 4 for element isolation constituted by a silicon oxide film is formed on the main surface of an inactive region of the $p^-$-type well 2. Below the field insulating film 4 is formed a p-type channel stopper region 5 for the prevention of reflection.

Of the MISFETs $Qd_1$, $Qd_2$ for drive, MISFETs $Qt_1$, $Qt_2$ for transfer and MISFETs $Qp_1$, $Qp_2$ for load, which constitute the memory cell MC, the $Qd_1$, $Qd_2$ and $Qt_1$, $Qt_2$ are formed on the main surface of an active region of the $p^-$-type well 2 surrounded with the field insulating film 4.

Each of the MISFETs $Qd_1$ and $Qd_2$ for drive comprises a gate insulating film 6, a gate electrode 7, a source region and a drain region. The gate electrode 7 is formed, for example, by a polysilicon film in a first-layer gate material forming step. In this polysilicon film is incorporated an n-type impurity [e.g. phosphorus (P)] for reducing its resistance value.

An insulating film 8 is formed on the gate electrode 7 of each of the MISFETs $Qd_1$ and $Qd_2$ for drive. For example, the insulating film 8 is a silicon oxide film. A side wall spacer 9 is formed on a side wall extending in the gate length direction of the gate electrode 7. The side wall spacer 9 is formed by a silicon oxide film for example.

Source and drain regions of each of the MISFETs $Qd_1$ and $Qd_2$ for drive are each composed of an n-type semiconductor region 10 of a low impurity concentration and an $n^+$-type semiconductor region 11 of a high impurity concentration provided on the semiconductor region 10. Thus, the source and drain regions of each of $Qd_1$ and $Qd_2$ have a so-called double diffused drain structure.

Figure 6:
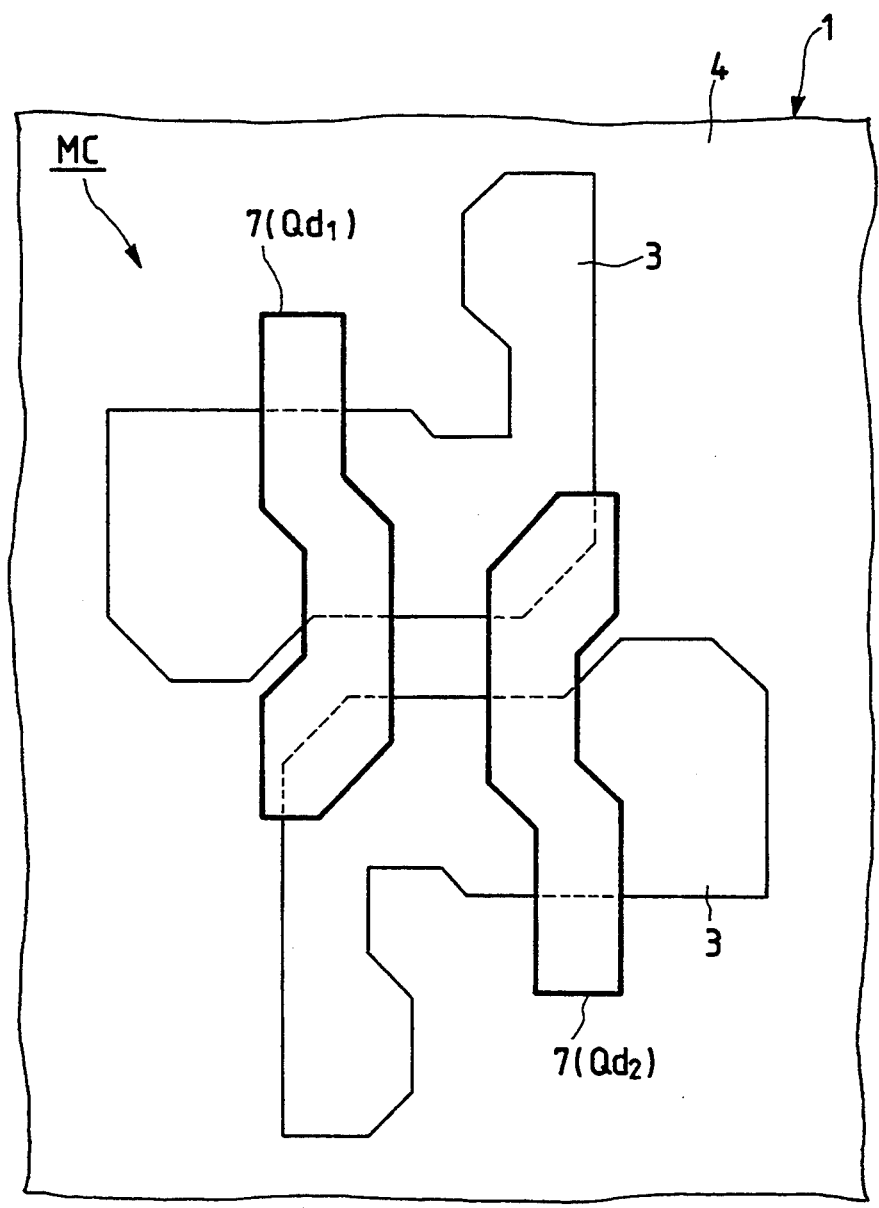
FIG. 6 is a plan view of principal portions, showing a pattern layout of the memory cell in the semiconductor integrated circuit device.

FIG. 6 shows a pattern layout of the field insulating film 4 formed on the main surface of the semiconductor substrate 1 and the gate electrodes 7 of the MISFETs $Qd_1$, $Qd_2$ for drive. In the same figure, two L-shaped regions. 3, 3 surrounded with the field insulating film 4 are active regions for one memory cell MC.

As shown in FIG. 6, one end side of the gate electrode 7 of each of the MISFETs $Qd_1$ and $Qd_2$ for drive projects onto the field insulating film 4 by a distance at least corresponding to a mask alignment margin in the manufacturing process. The opposite end side of the gate electrode 7 ($Qd_1$) of the MISFET $Qd_1$ for drive projects onto the drain region of the MISFET $Qd_2$ for drive through the field insulating film 4, while the opposite end side of the gate electrode 7 ($Qd_2$) of the MISFET $Qd_2$ for drive projects onto the drain region 7 of the MISFET $Qd_1$ for drive through the field insulating film 4.

As shown in FIG. 5, the MISFETs $Qt_1$ and $Qt_2$ for transfer in the memory cell MC are each composed of gate insulating film 12, gate electrode 13A, source region and drain region. The gate electrode 13A is formed in a second-layer gate material forming step and, for example, it is constituted by a laminate film (polycide film) of a polysilicon film and a refractory metal silicide film. In the polysilicon film as a lower layer is incorporated an n-type impurity (e.g. P) for decreasing its resistance value. The refractory metal silicide film as an upper layer is constituted by, for example, $WSi_x$, $MoSi_x$, $TiSi_x$ or $TaSi_x$.

Insulating films 15 and 21 are formed on the gate electrodes 13A of the MISFETs $Qt_1$ and $Qt_2$ for transfer. For example, the insulating films 15 and 21 are silicon oxide films. Further, a side wall spacer 16 is formed on a side wall of the gate electrode 13A, which spacer is formed by a silicon oxide film for example.

The source and drain regions of each of the MISFETs $Qt_1$ and $Qt_2$ for transfer are each composed of an n-type semiconductor region 17 of a low impurity concentration and an $n^+$-type semiconductor region 18 of a high impurity concentration. Thus, the said source and drain regions have an LDD (Lightly Doped Drain) structure.

Figure 7:
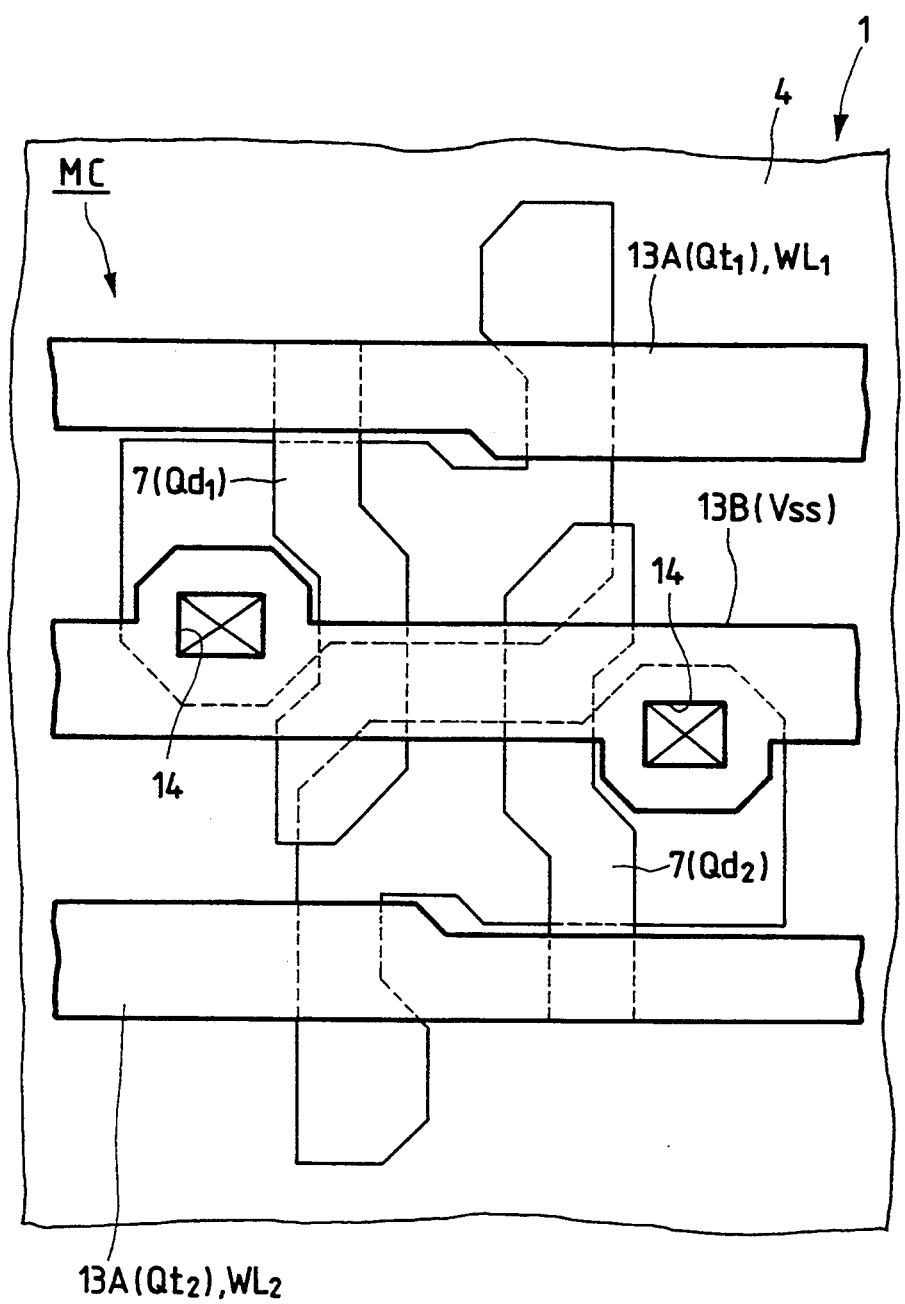
FIG. 7 is a plan view of principal portions, showing a pattern layout of the memory cell in the semiconductor integrated circuit device.

FIG. 7 shows a pattern layout of the gate electrodes 13A of the MISFETs $Qt_1$ and $Qt_2$ for transfer formed on the main surface of the semiconductor substrate 1. As shown in the same figure, the gate electrodes 13A are arranged so that their gate length (Lg) direction intersects the gate length (Lg) direction of the gate electrodes of the MISFETs $Qd_1$ and $Qd_2$ for drive.

As shown in FIGS. 5 and 7, one of the source and drain regions of the MISFET $Qt_1$ for transfer is formed integrally with the drain region of the MISFET $Qd_1$ for drive. Likewise, one of the source and drain regions of the MISFET $Qt_2$ for transfer is integral with the MISFET $Qd_2$ for drive.

A first word line $WL_1$ is connected to the gate electrode 13A of the MISFET $Qt_1$ for transfer, while a second word line $WL_2$ is connected to the gate electrode 13A of the MISFET $Qt_2$ for transfer. The gate electrode 13A of $Qt_1$ is formed integrally with the first word line $WL_1$ and likewise the gate electrode 13A of $Qt_2$ is integral with the second word line $WL_2$.

Between the first and second word lines $WL_1$, $WL_2$ is disposed a reference voltage line ($V_{SS}$) 13B which is formed as a source line common to both MISFETs $Qd_1$ and $Qd_2$ for drive. The reference voltage line ($V_{SS}$) 13B is formed in the same second-layer gate material forming step as that for the gate electrodes 13A of the MISFETs $Qt_1$, $Qt_2$ for transfer and the word line WL (comprising first and second word lines $WL_1$, $WL_2$) and it extends on the field insulating film 4 in the same direction as the word line WL. The reference voltage line ($V_{SS}$) 13B is connected to the source region ($n^+$-type semiconductor region 11) of each of the MISFETs $Qd_1$ and $Qd_2$ for drive through a contact hole 14 formed in the same insulating film as the gate insulating film 6 of $Qd_1$ ($Qd_2$).

As shown in FIG. 5, of the two MISFETs $Qp_1$ and $Qp_2$ for load in the memory cell MC, $Qp_1$ is disposed on the region of MISFET $Qd_2$ for drive, while $Qp_2$ is disposed on the region of MISFET $Qd_1$ for drive. $Qp_1$ and $Qp_2$ are each composed of gate electrode 23A, gate insulating film 24, channel region 26N, source region 26P and drain region 26P.

Figure 8:
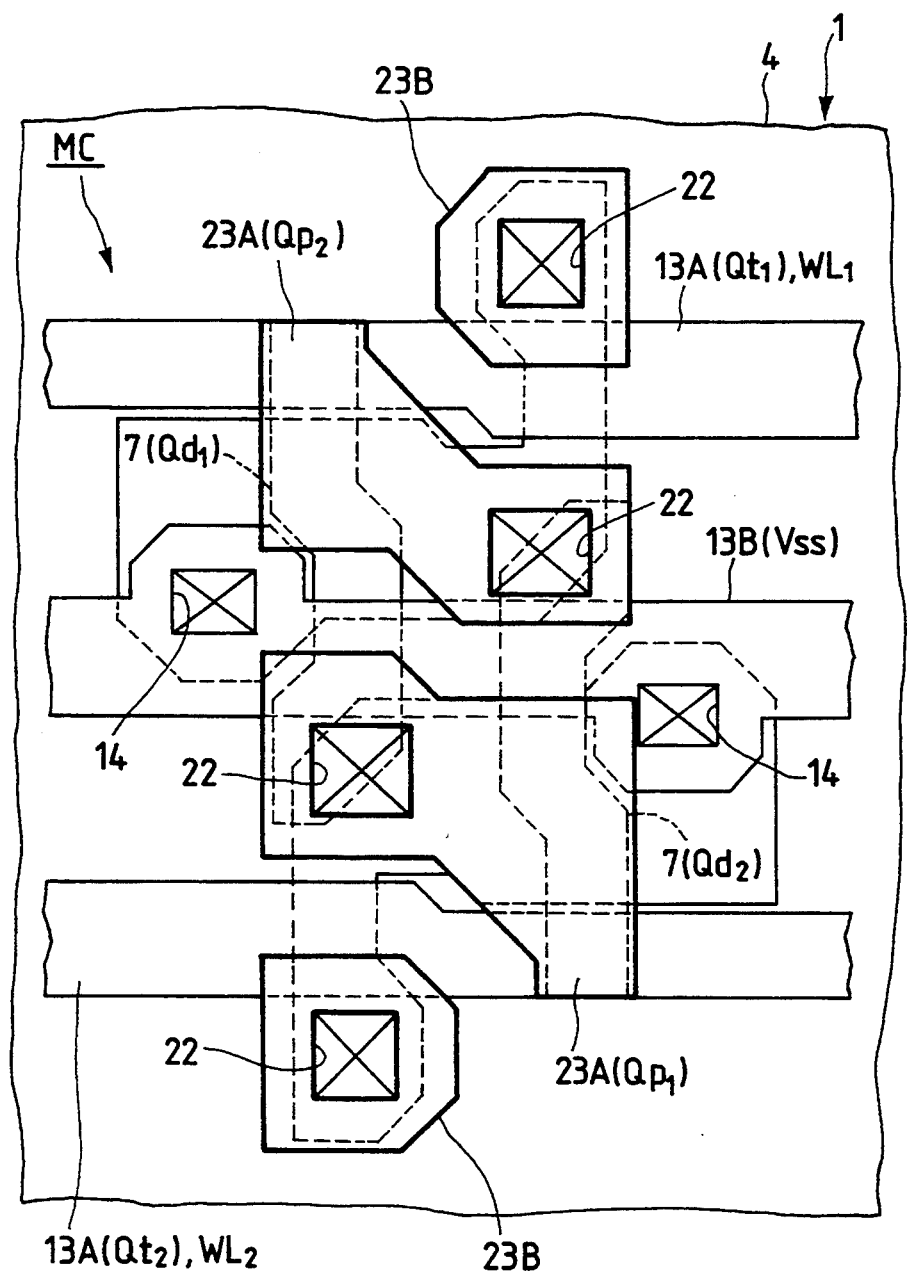
FIG. 8 is a plan view of principal portions, showing a pattern layout of the memory cell in the semiconductor integrated circuit device.

The gate electrodes 23A of the MISFETs $Qp_1$ and $Qp_2$ for load are formed in a third-layer gate material forming step and, for example, they are each constituted by a polysilicon film. In the polysilicon film is incorporated an n-type impurity [e.g. phosphorus (P)] for decreasing its resistance value. FIG. 8 shows a pattern layout of the gate electrodes 23A of $Qp_1$ and $Qp_2$.

As shown in FIGS. 5 and 8, the gate electrode 23A of the MISFET $Qp_1$ for load is connected to the gate electrode 7 of MISFET $Qd_1$ for drive and one of the source and drain regions of MISFET $Qt_2$ for transfer through a contact hole 22 formed in the insulating films 21, 8 and insulating film (the same layer of insulating film as the gate insulating film of $Qt_1$, $Qt_2$). Likewise, the gate electrode 23A of the MISFET $Qp_2$ for load is connected to the gate electrode 7 of MISFET $Q_2$ for drive an one of the source and drain regions of the MISFET $Qt_1$ for transfer through a contact hole formed in the insulating films 21, 8 and insulating film (the same layer of insulating film as the gate insulating film 12 of $Qt_1$, $Qt_2$).

On the other of the source and drain regions of $Qt_1$ ($Qt_2$) is disposed a pad layer 23B formed in the same third-layer gate material forming step as that for the gate electrode 23A of $Qp_1$ ($Qp_2$). The pad layer 23B is connected to the other of the source and drain regions of $Qt_1$ ($Qt_2$) through a contact hole 22 formed in the insulating film 21 and insulating film [the same layer of insulating film as the gate insulating film $Qt_1$ ($Qt_2$)].

As shown in FIG. 5, a gate insulating film 24, which is a silicon oxide film for example, is formed on the gate electrode 23A of $Qp_1$ ($Qp_2$).

Figure 9:
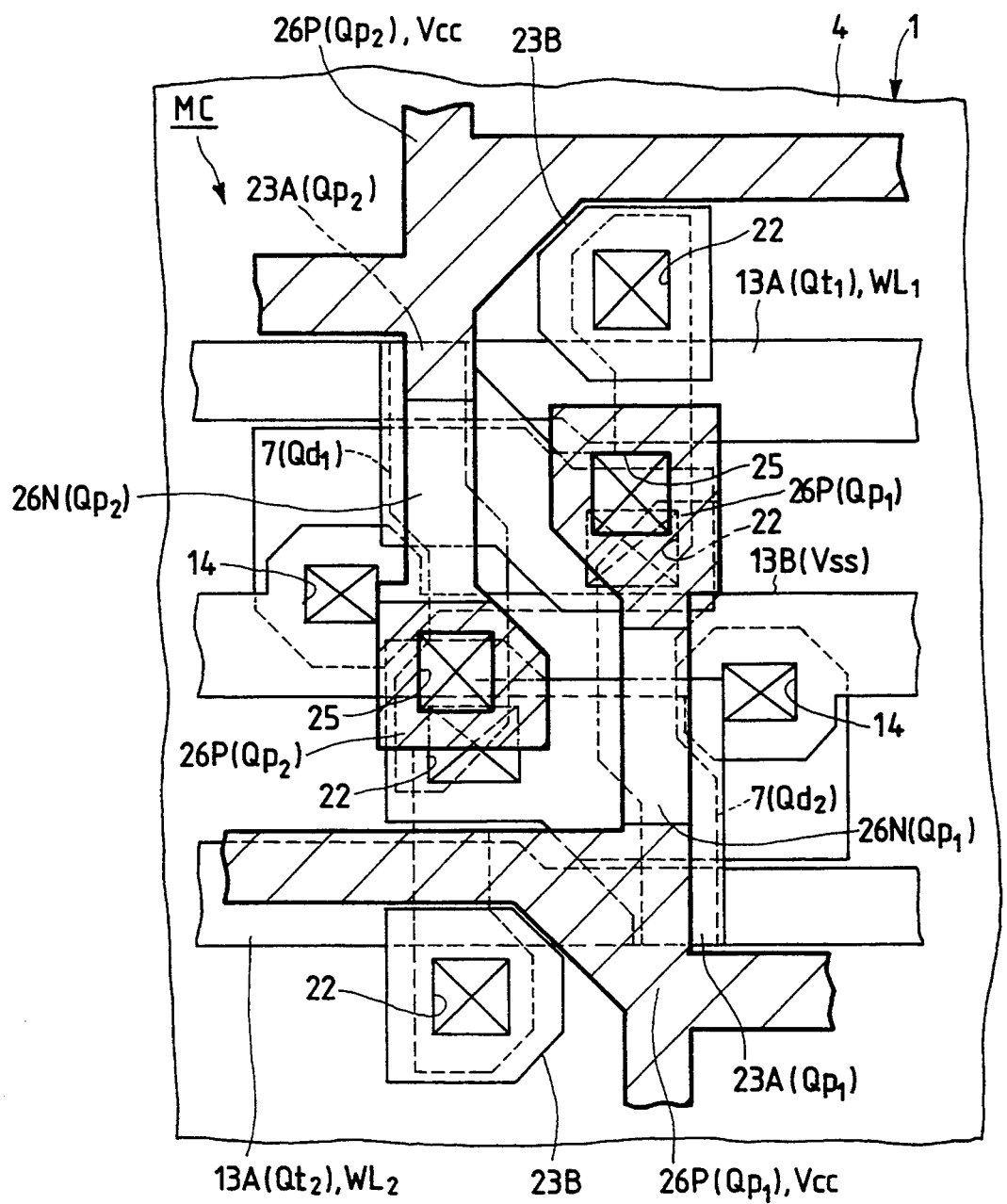
FIG. 9 is a plan view of principal portions, showing a pattern layout of the memory cell in the semiconductor integrated circuit device.

Further, on the gate insulating film 24 of $Qp_1$ ($Qp_2$) there are formed channel region 26N, source region 26P and drain region 26P. The channel region 26N is formed in a fourth-layer gate material forming step and, for example, it is constituted by a polysilicon film. In the polysilicon film is incorporated an n-type impurity [e.g. phosphorus (P)] for making the threshold voltage of MISFETs $Qp_1$ and $Qp_2$ for load into an enhancement type. FIG. 9 shows a pattern layout of channel regions 26N, source regions 26P and drain regions 26P of MISFETs $Qp_1$ and $Qp_2$ for load.

In each of the MISFETs $Qp_1$ and $Qp_2$ for load, a drain region 26P is formed on one end side of the channel region 26N, while a source region is formed on the opposite end side. The drain region 26P and source region 26P are formed in the same fourth-layer gate material (polysilicon) forming step as that for the channel region 26N. In the polysilicon film which constitutes the drain and source regions 26P there is incorporated a p-type impurity (e.g. $BF_2$). Thus, the MISFETs $Qp_1$ and $Qp_2$ in the memory cell MC according to this embodiment have a so-called bottom gate structure in which the channel regions 26N, source regions 26P and drain regions 26P formed in the fourth-layer gate material forming step are disposed on the gate electrodes 23A formed in the third-layer gate material forming step. In FIG. 9, the drain regions 26P and source regions 26P, exclusive of channel regions 26N, are hatched to make it easier to see the arrangement of the channel regions 26N, drain regions 26P and source regions 26P.

Figure 10:
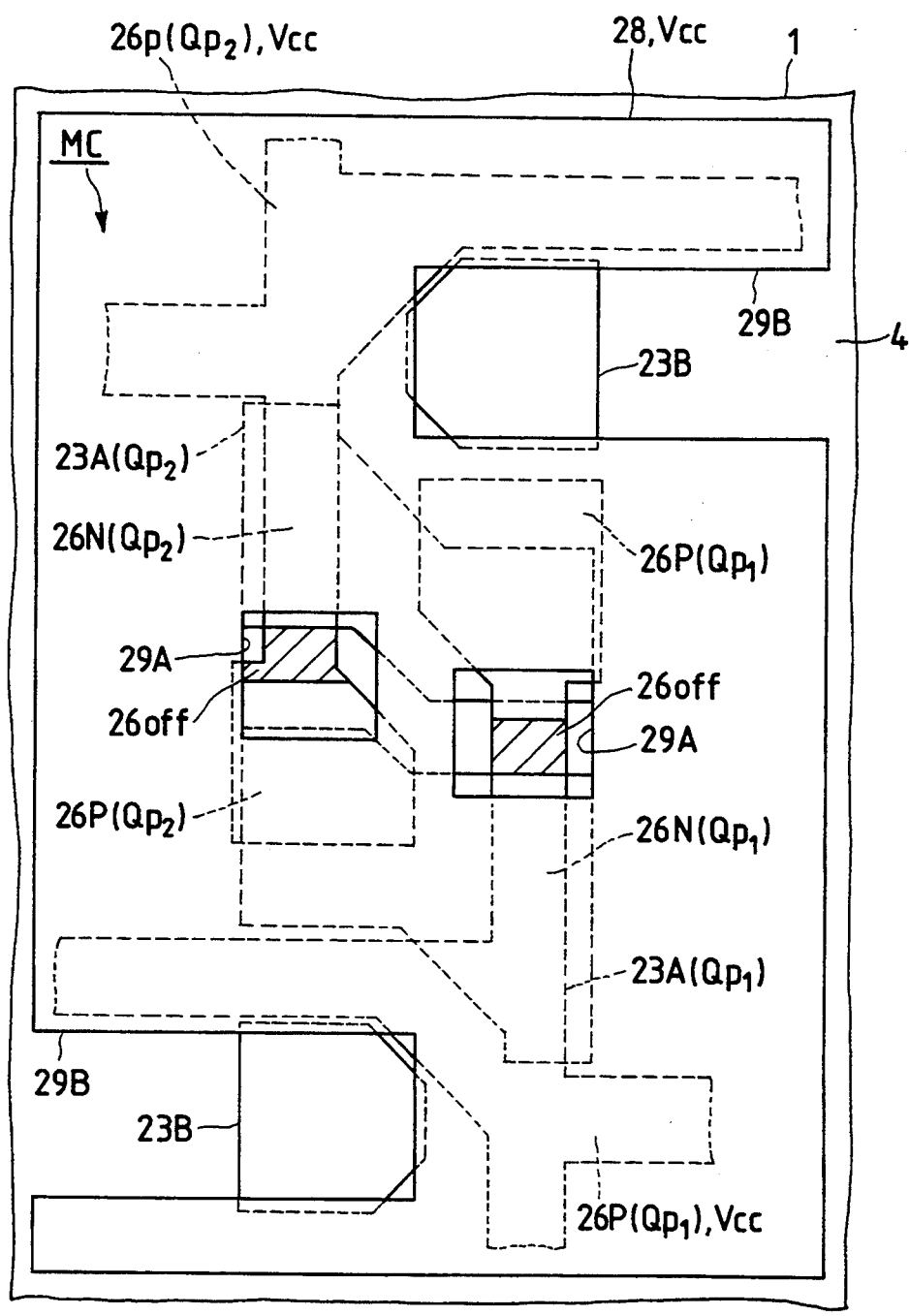
FIG. 10 is a plan view of principal portions, showing a pattern layout of the memory cell in the semiconductor integrated circuit device.

In each of the MISFETs $Qp_1$ and $Qp_2$ for load in the SRAM according to this embodiment, the drain region 26P and the gate electrode 23A are isolated from each other through the channel region 26N in order to prevent the occurrence of a leak current flow between the source region 26P and the drain region 26P which inconvenience is ascribable to the application of a strong electric field to between the gate electrode 23A and the drain region 26P thereon whose voltage level is reference voltage ($V_{SS}$) level, in the absence of the supply voltage ($V_{CC}$) applied to the gate electrode 23A, although no special limitation is made by this point. Thus, the MISFETs $Qp_1$ and $Qp_2$ for load have a so-called offset structure wherein the drain region P and the gate electrode 23A are isolated from each other without having any overlap. In the channel region 26N of each of $Qp_1$ and $Qp_2$, the area isolated from the gate electrode 23A will hereinafter be referred to as offset area 26 off. In FIG. 10, such offset areas 26 off are hatched to make their arrangement easier to see.

As shown in FIG. 5, the drain region 26P of the MISFET $Qp_1$ for load is connected to the gate electrode 23A of the MISFET $Qp_2$ for load through a contact hole 25 formed in the same layer of insulating film as the gate insulating film 24. Likewise, the drain region 26P of $Qp_2$ is connected to the gate electrode 23A of $Qp_1$ through a contact hole 25 formed in the same layer of insulating film as the gate insulating film 24.

A supply voltage line ($V_{CC}$) 26P is connected to the source region 26P of each of $Qp_1$ and $Qp_2$. The supply voltage line ($V_{CC}$) 26P is formed in the same fourth-layer gate material (polysilicon) forming step as that for the channel region 26N, drain region 26P and source region 26P as an integral structure with these regions.

As shown in FIG. 5, an insulating film 27 is formed on the MISFETs $Qp_1$ and $Qp_2$ for load. For example, the insulating film 27 is a laminate film of silicon oxide film and silicon nitride film and constitutes a dielectric film of capacitors $C_1$ and $C_2$ which will be described later.

On the insulating film 27 is formed a plate electrode 28, as shown in FIG. 5. The plate electrode 28 is formed in a fifth-layer gate material forming step and, for example, it is constituted by a polysilicon film. In the polysilicon film is incorporated an n-type impurity [e.g. phosphorus (P)]. FIG. 10 shows a pattern layout of the plate electrode 28. In the same figure, in order to make it easier to see, there are illustrated, out of the electroconductive layers which underlie the plate electrode 28, only the fourth gate layer [channel regions 26N, source regions 26P, drain regions 26P and supply voltage line ($V_{CC}$) 26P in MISFETs $Qp_1$ and $Qp_2$ for load] and the third gate layer (gate electrodes 23A and pad layers 23B in $Qp_1$ and $Qp_2$).

As shown in FIGS. 5 and 10, the plate electrode 28 is formed so as to cover the whole of the memory cell MC. To the plate electrode 28 is applied the circuit supply voltage ($V_{CC}$).

As shown in FIG. 4, the memory cell MC is provided with two capacitors $C_1$ and $C_2$. In the SRAM of this embodiment, the capacitors $C_1$ and $C_2$ are formed between the gate electrode 23A and the plate electrode 28 of $Qp_1$, $Qp_2$. That is, the capacitors $C_1$ and $C_2$ have a stack structure using the gate electrode 23A as a first electrode, the plate electrode 28 as a second electrode and the insulating film 27 between the gate electrode 23A and the plate electrode 28 as a dielectric film. Thus, in the SRAM of this embodiment, since the capacitors $C_1$ and $C_2$ are constituted between the MISFETs $Qp_1$, $Qp_2$ for load and the plate electrode 28 of a large area which covers $Qp_1$ and $Qp_2$, their capacity can be increased to a large extent, whereby the $\alpha$-ray soft error resistance of the memory cell MC can be greatly improved.

As shown in FIG. 10, apertures 29A and 29B are formed in the plate electrode 28. The apertures 29A are formed above the drain regions 26P of MISFET $Qp_1$ and $Qp_2$ for load to prevent the plate electrode 28 from covering the offset areas 26 off of $Qp_1$ and $Qp_2$. On the other hand, the apertures 29B are formed above the pad layers 23B which have been formed in the same third-layer gate material forming step as that for the gate electrodes 23A of $Qp_1$ and $Qp_2$.

Thus, in the SRAM of this embodiment there is adopted an offset structure wherein the offset area 26 off and the plate electrode 28 are isolated from each other through the aperture 29A formed in the plate electrode 28 above the drain region in each of $Qp_1$ and $Qp_2$. By this configuration it is made possible to prevent a strong electric field from being applied between the plate electrode 28 and the offset area 26 off in an OFF state of $Qp_1$ and $Qp_2$ with supply voltage ($V_{CC}$) applied to the gate electrode 23A, so that it is possible to prevent a leak current from being generated between the source region 26P and the drain region 26P by such strong electric field. Consequently, it is possible to diminish the source-drain current (OFF current) in an OFF state of $Qp_1$ and $Qp_2$, whereby the ON/OFF current ratio can be improved to ensure a stable operation of the memory cell MC. The other aperture 29B formed in the plate electrode 28 is for connection, without short-circuit, between the pad layer 23B which underlies the plate electrode 28 and the complementary data line DL (comprising first and second data lines $DL_1$, $DL_2$) which overlies the plate electrode 28.

As shown in FIG. 5, above the plate electrode 28 there are formed intermediate electroconductive layer 33, sub word line SWL and main word line MWL through an insulating film 31 and an interlayer insulating film 32. The intermediate electroconductive layer 33 is connected to the pad layer 23B through a contact hole 34 formed in the interlayer insulating film 32 and the insulating films 31, 27.

The intermediate electroconductive layer 33, sub word line SWL and main word line MWL are each formed by a refractory metal film, e.g. tungsten (W), in a first-layer wiring material forming step. For example, the insulating film 31 is a silicon oxide film and the interlayer insulating film 32 is BPSG film.

As shown in FIG. 5, above the intermediate electroconductive layer 33, sub word line SWL and main word line MWL there is disposed a complementary data line DL (comprising first and second data lines $DL_1$, $DL_2$) through a second interlayer insulating film 35. The complementary data line DL is connected to the intermediate electroconductive layer 33 through a contact hole 36 formed in the interlayer insulating film 35.

The complementary data line DL is formed in a second-layer wiring material forming step and, for example, it is constituted by a metallic three-layer film obtained by successively laminating a barrier metal film, an aluminum alloy film and a barrier metal film. For example, the barrier metal is TiW or TiN, and the aluminum alloy comprises aluminum, Cu and Si. The interlayer insulating film 35 is, for example, a three-layer insulating film obtained by successively laminating a silicon oxide film, a spin on glass film and a silicon oxide film.

In the complementary data line DL, the first data line $DL_1$ is connected to one (n+-type semiconductor region 18) of the source and drain regions of MISFET $Qt_1$ for transfer, while the second data line $DL_2$ is connected to one (n+-type semiconductor region 18) of the source and drain regions of MISFET $Qt_2$ for transfer. The connection between the complementary data line DL and the n+-type semiconductor region 18 of $Qt_1$, $Qt_2$ is effected through the intermediate electroconductive layer 33 and the pad layer 23B.

Over the complementary data line DL is formed a final passivation film 37. For example, the final passivation film 37 is a laminate film of a silicon oxide film and a silicon nitride film. The upper surface of the final passivation film 37 is coated with a polyimide resin for protecting the surface of the semiconductor chip 1, though not shown in FIG. 5.

As shown in FIG. 1, a plurality of bonding pads BP are disposed on the outermost peripheral portion of the semiconductor chip 1 with the memory cell MC formed thereon. The bonding pads BP are formed in the same second-layer wiring material forming step as that for the complementary data line DL and are arranged on the interlayer insulating film 35, as shown in FIG. 11. As illustrated in the same figure, a fuse 40 for repairing a defect of the memory cell MC is formed on the field insulating film 4 near a bonding pad BP. Though not specially limited, the fuse 40 is formed in the second-layer gate material forming step as that for the gate electrode 13A, word line WL and reference voltage line ($V_{SS}$) of MISFETs $Qt_1$, $Qt_2$ for transfers and a wiring line 44 connected to the fuse 40 is formed in the same first-wiring material forming step as that for the intermediate electroconductive layer 33, sub word line SWL and main word line MWL.

A method for manufacturing the SRAM of this embodiment will be described below with reference to FIGS. 12 to 32.

First, a semiconductor substrate 1 of an $n^-$-type silicon single crystal having a specific resistance value of 10 [$\Omega$/cm] or so is provided, and a $p^-$-type well 2 is formed in the memory cell array forming region and part of a peripheral circuitry forming region (not shown), as illustrated in FIG. 12. The $p^-$-type well 2 is formed by stretching and diffusing $BF_2$ (boron fluoride) ion-implanted in a main surface of the semiconductor substrate 1.

Next, a field insulating film 4 for element isolation is formed on the main surface of an inactive region of the $p^-$-type well 1. At this time, a p-type channel stopper region 5 for the prevention of inversion is formed under the field insulating film 4. The field insulating film 4 is formed by allowing a silicon oxide film to grow to a thickness of about 420–480 nm in accordance with a thermal oxidation method (LOCOS method) using a silicon nitride film as an anti-oxidation mask.

Then, $BF_2$ is ion-implanted in a main surface of an active region of the $p^-$-type well 2 for adjusting the threshold voltage of MISFETs $Qd_1$ and $Qd_2$ for drive, and thereafter a gate insulating film 6 of $Qd_1$ and $Qd_2$ is formed at a thickness of about 13 to 14 nm by the thermal oxidation method.

Next, a polysilicon film (not shown), which is a first-layer gate material, is deposited on the whole surface of the semiconductor substrate 1. The polysilicon film is formed at a thickness of about 90 to 110 nm by CVD. At the time of deposition of the polysilicon film, phosphorus (P) is introduced therein for decreasing its resistance value. Next, an insulating film 8, which is a silicon oxide film, is deposited on the polysilicon film. The insulating film 8 is formed at a thickness of about 135 to 165 nm by CVD. It is for electrical separation between a gate electrode 7 of MISFETs $Qd_1$, $Qd_2$ for drive and an electroconductive layer formed thereon.

Next, as shown in FIG. 13, the gate electrode 7 referred to above of $Qd_1$, $Qd_2$ is formed by successively etching the insulating film 8 and the underlying polysilicon film, using as mask a photoresist film formed on the insulating film 8. Then, a silicon oxide film (not shown) is deposited over the whole surface of the semiconductor substrate 1 at a thickness of about 160 to 200 nm by CVD.

Figure 14:
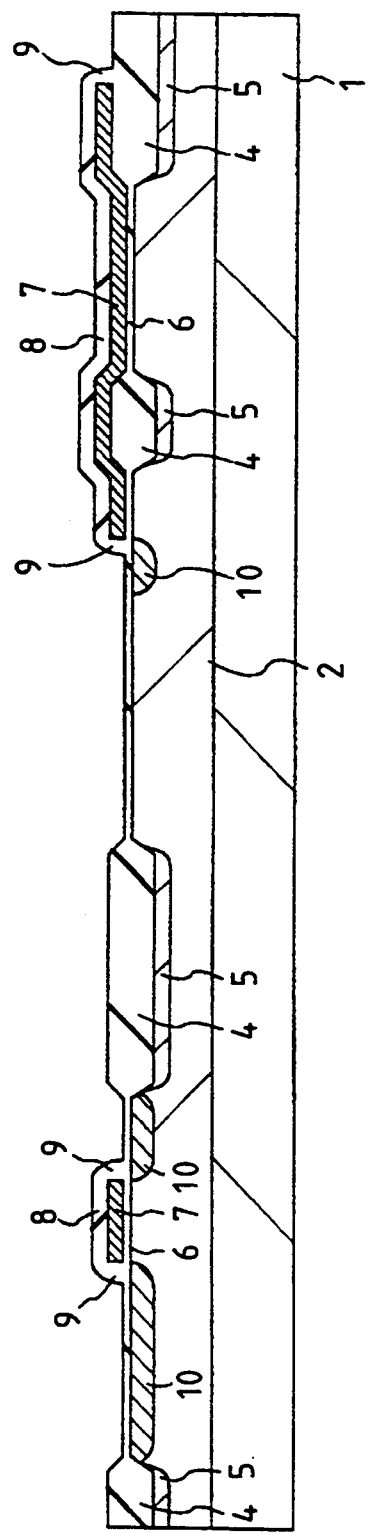
FIG. 14 is a sectional view of principal portions of the semiconductor substrate, showing the fabricating method.

Next, as shown in FIG. 14, side wall spacers 9 are formed on side walls of $Qd_1$, $Qd_2$ by subjecting the above silicon oxide film to such an anisotropic etching as RIE (Reactive Ion Etching).

Then, the gate insulating film 6 on the main surface of an active region exclusive of the portion located under the gate electrode of $Qd_1$, $Qd_2$ by etching using an dilute aqueous hydrofluoric acid solution, and thereafter a new silicon oxide film (not shown) is formed on the main surface of the active region. This silicon oxide film is formed at a thickness of about 9 to 11 nm by the thermal oxidation method.

Next, a photoresist film is formed on the main surface of the semiconductor substrate 1. Thereafter, using this photoresist film as mask, phosphorus (P) is ion-implanted in the main surface of the $p^-$-type well 2 in the $Qd_1$, $Qd_2$ forming region and is stretched and diffused to form an n-type semiconductor region 10 of $Qd_1$, $Qd_2$ (FIG. 14).

Then, $BF_2$ is ion-implanted in the main surface of the active region of $p^-$-type well 2 and thereafter the silicon oxide film on the active region main surface is removed by etching using a dilute aqueous hydrofluoric acid to form a gate insulating film 12 of $Qt_1$, $Qt_2$. The gate insulating film 12 is formed at a thickness of about 13 to 14 nm by thermal oxidation.

Next, a second-layer gate material (not shown) is deposited over the whole surface of the semiconductor substrate 1. This gate material is constituted by a laminate film (polycide film) of a polysilicon film and a tungsten silicide film. At this time, first a polysilicon film is deposited to a thickness of about 36 to 44 nm, thereafter a photoresist film is formed on the main surface of the substrate 1, and then using the photoresist film as mask, the insulating film (the same layer of insulating film as that of the gate insulating film 12) on the n-type semiconductor region 10 of MISFETs $Qd_1$, $Qd_2$ is etched to form a contact hole 14.

Next, the polysilicon film is further deposited 36–44 nm or so on the polysilicon film deposited above, by CVD. At the time of deposition of this polysilicon film, phosphorus (P) is introduced therein to decrease its resistance value. Then, tungsten silicide film is deposited on the polysilicon film at a thickness of about 72 to 88 nm by CVD.

Subsequently, an insulating film 15, which is a silicon oxide film, is deposited on the tungsten silicide film at a thickness of about 270 to 330 nm by CVD. The insulating film 15 is for electrical separation between the gate electrode 12 of MISFETs $Qt_1$, $Qt_2$ for transfer and an electroconductive layer formed thereon.

Figure 15:
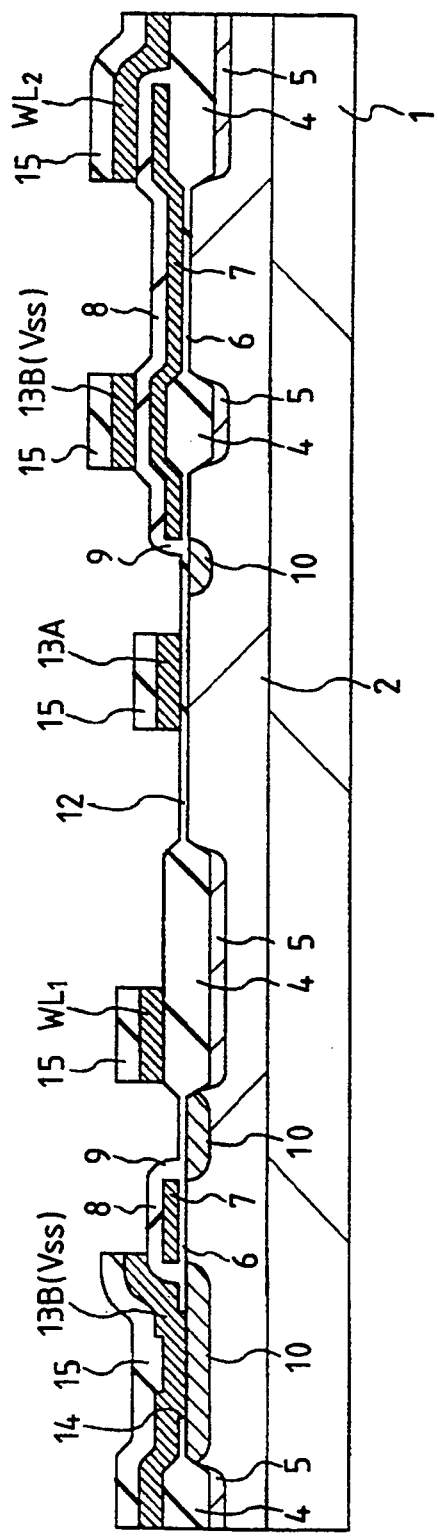
FIG. 15 is a sectional view of principal portions of the semiconductor substrate, showing the fabricating method.
Figure 16:
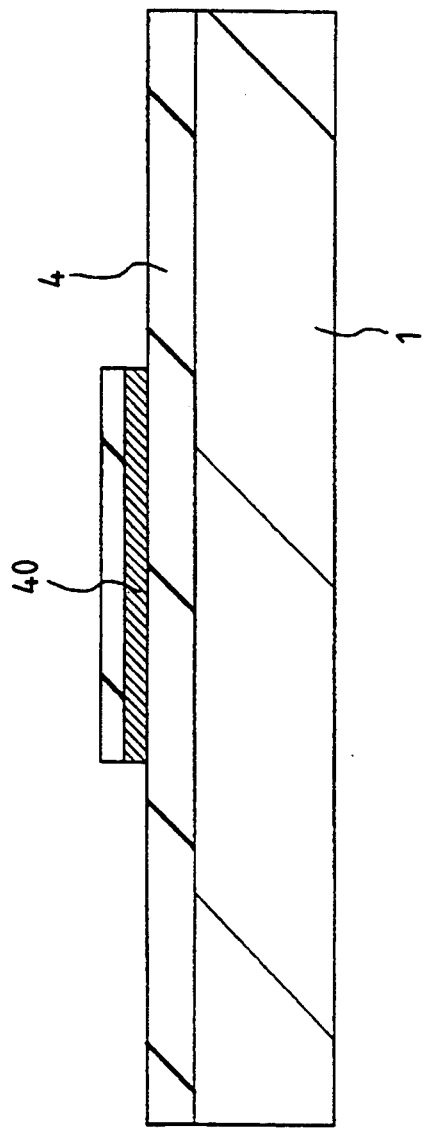
FIG. 16 is a sectional view of principal portions of the semiconductor substrate, showing the fabricating method.

Next, as shown in FIG. 15, a photoresist film is formed on the insulating film 15 and, using this photoresist film as mask, the insulating film 15 and the underlying second-layer gate material (polycide film) are etched successively to form gate electrode 13A, word line WL (first and second word lines $WL_1$, $WL_2$) and reference voltage line ($V_{SS}$) 13B. Further, as shown in FIG. 16, a fuse 40 is formed on the field insulating film 4 in an outer peripheral position of the semiconductor chip 1, using the second-layer gate material (polycide film).

Figure 17:
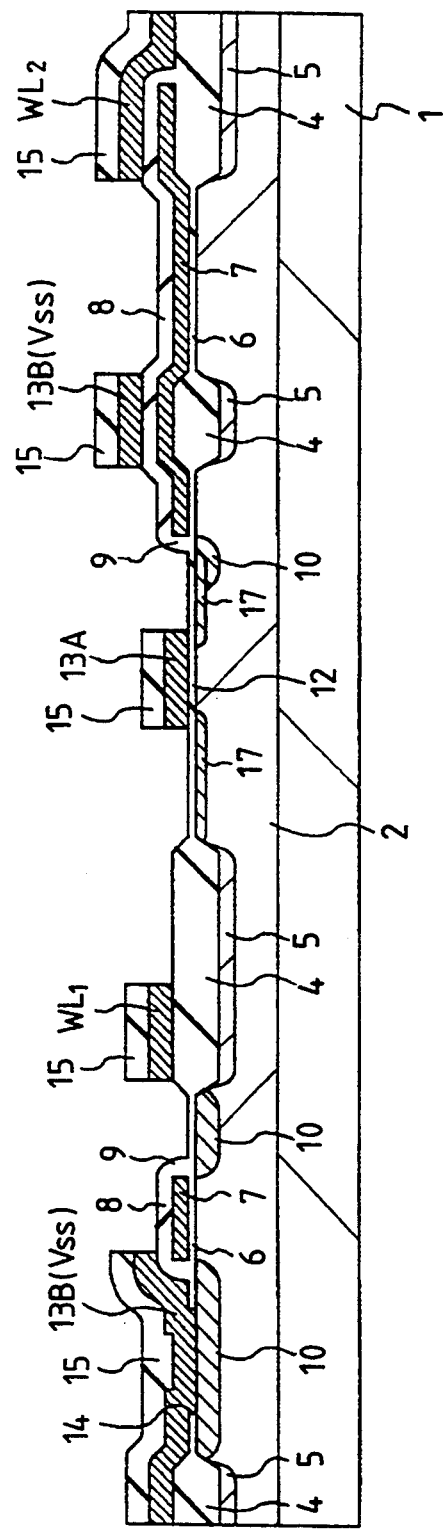
FIG. 17 is a sectional view of principal portions of the semiconductor substrate, showing the fabricating method.

Then, as shown in FIG. 17, a photoresist film is formed on the main surface of the semiconductor substrate 1 and, using this photoresist film as mask, phosphorus (P) is ion-implanted in the main surface of the $p^-$-type well 2 at the $Qt_1$, $Qt_2$ forming region, then is stretched and diffused to form an n-type semiconductor region 17 of $Qt_1$, $Qt_2$.

Figure 18:
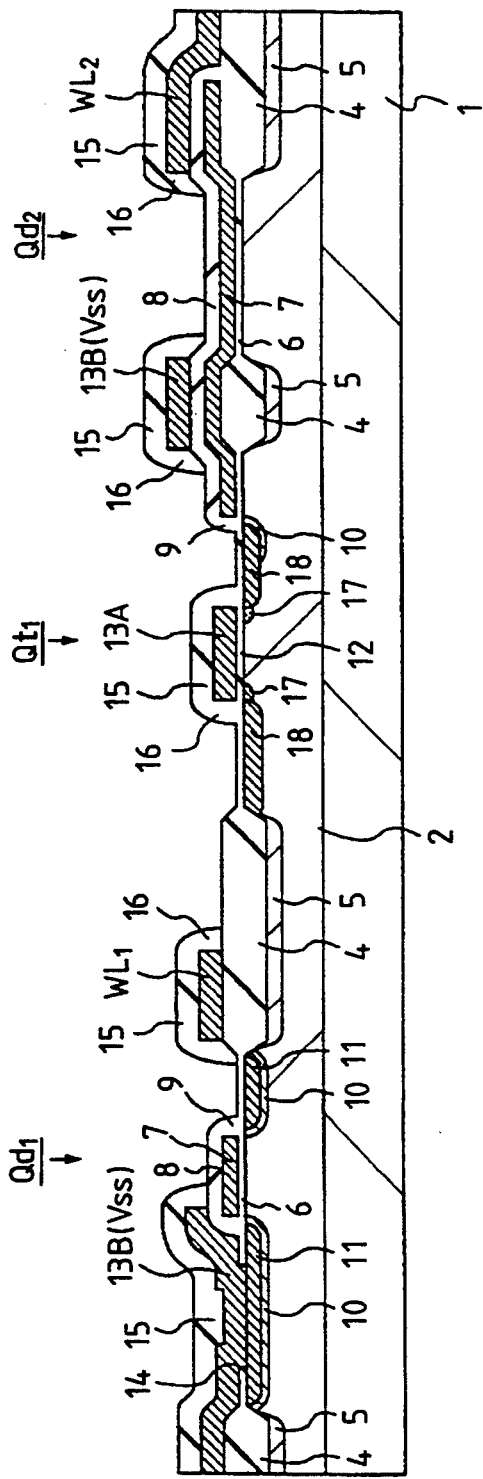
FIG. 18 is a sectional view of principal portions of the semiconductor substrate, showing the fabricating method.

Next, a silicon oxide film (not shown) is deposited over the whole surface of the substrate 1 at a thickness of about 270 to 330 nm by CVD. Subsequently, as shown in FIG. 18, the silicon oxide film is subjected to such an anisotropic etching as RIE to form side wall spacers 16 on the side walls of gate electrode 13A, word line WL (first and second word lines $WL_1$, $WL_2$) and reference voltage line ($V_{SS}$) 13B in $Qt_1$, $Qt_2$.

Then, arsenic (As) is ion-implanted in the main surface of the $p^-$-type well 2 at each of the forming region of MISFETs $Qd_1$, $Qd_2$ for drive and that of MISFETs $Qt_1$, $Q_2$ for transfer. Subsequently, the As is stretched and diffused to form an $n^+$-type semiconductor region 11 on the main surface of the $p^-$-type well 2 at the $Qd_1$, $Qd_2$ forming region and an $n^+$-type semiconductor region 18 on the main surface of the $p^-$-type well 2 at the $Qt_1$, $Qt_2$ forming region.

Since the n-type semiconductor region 10 is formed beforehand on the main surface of the $p^-$-type well 2 at the $Qd_1$, $Qd_2$ forming region, the formation of the $n^+$- type semiconductor region 11 results in completion of MISFETs $Qd_1$ and $Qd_2$ for drive each having source and drain regions of a double diffused drain structure. Likewise, since the n-type semiconductor region 17 is formed beforehand on the main surface of the $p^-$-type well 2 at the $Qt_1$, $Qt_2$ forming region, the formation of the $n^+$-type semiconductor region 18 results in completion of MISFETs $Qt_1$ and $Qt_2$ for transfer each having source and drain regions of LDD structure (FIG. 18).

Figure 19:
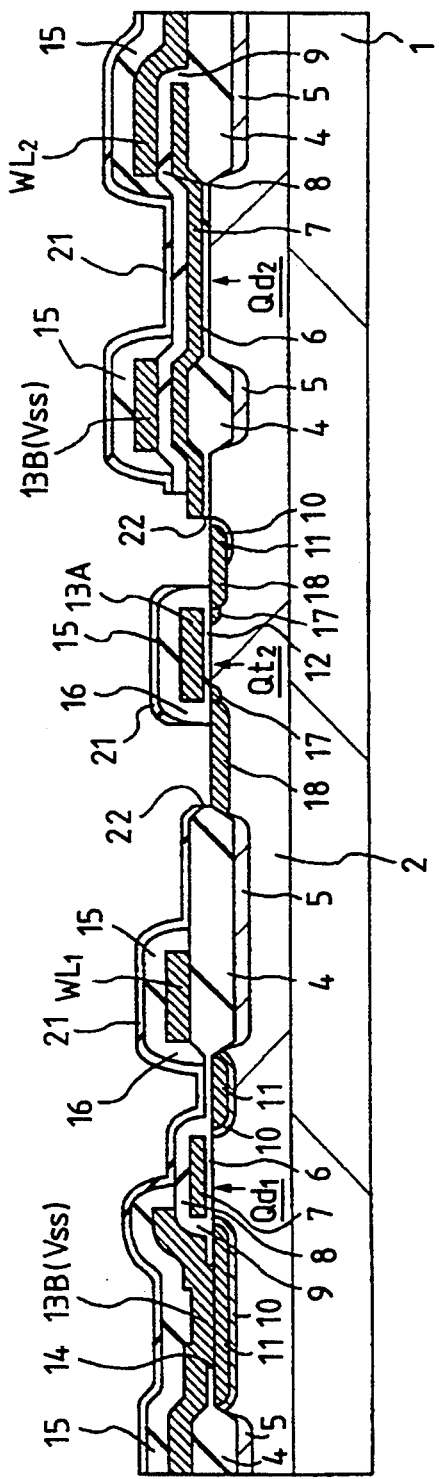
FIG. 19 is a sectional view of principal portions of the semiconductor substrate, showing the fabricating method.

Next, as shown in FIG. 19, an insulating film 21, which is a silicon oxide film, is deposited on the whole surface of the semiconductor substrate 1 at a thickness of about 54 to 66 nm by CVD. Thereafter, a photoresist film is formed on the insulating film 21 and, using this photoresist film as mask, the insulating films 21, 8 and insulating film (the same layer of insulating film as the gate insulating film of $Qt_1$, $Qt_2$) are etched to form a contact hole 22 over one of the source and drain regions of $Qt_1$, $Qt_2$. At the same time, using the said photoresist film as mask, the insulating film 21 and insulating film 20 (the same layer of insulating film as the gate insulating film 12 of $Qt_1$, $Qt_2$) to form a contact hole 22 over the other of the source and drain regions of $Qt_1$, $Qt_2$ (one of the source and drain regions of MISFETs $Qd_1$, $Qd_2$ for drive).

Figure 20:
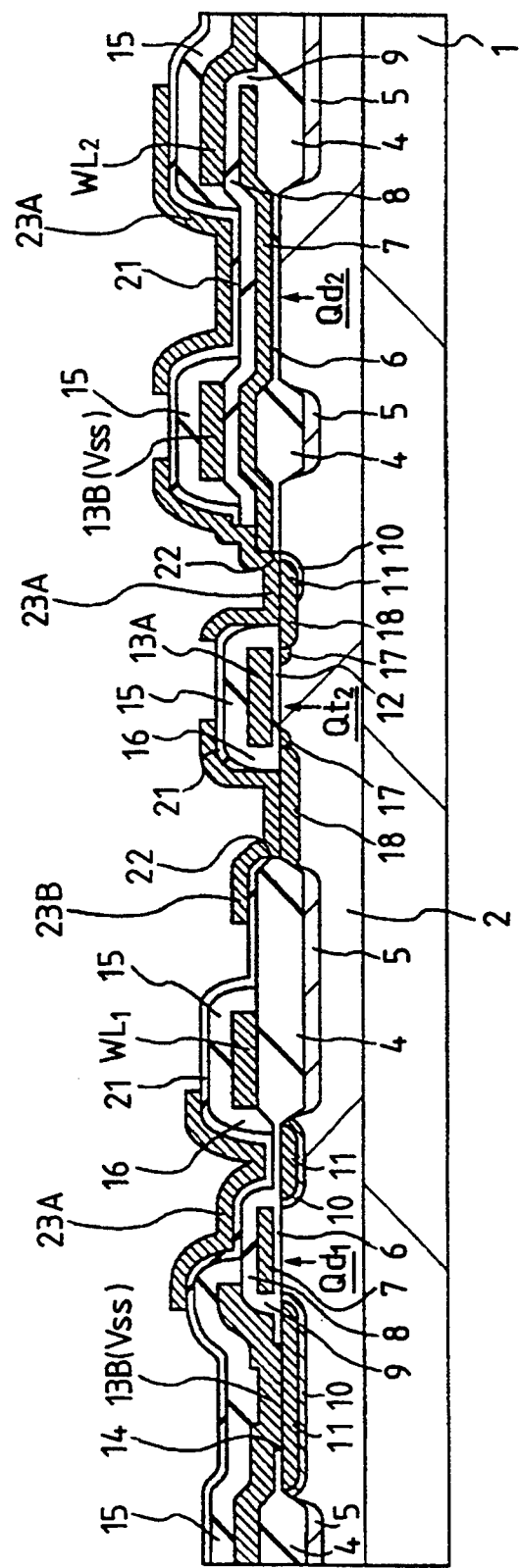
FIG. 20 is a sectional view of principal portions of the semiconductor substrate, showing the fabricating method.

Subsequently, a polysilicon film (not shown) as a third-layer gate material is deposited over the whole surface of the semiconductor substrate 1 at a thickness of about 63 to 77 nm by CVD. Phosphorus (P) is introduced in the polysilicon film at the time of deposition thereof for decreasing its resistance value. Then, as shown in FIG. 20, the polysilicon film is etched using a photoresist film formed thereon as mask to form gate electrode 23A and pad layer 23B of MISFETs $Qp_1$, $Qp_2$ for load.

Figure 21:
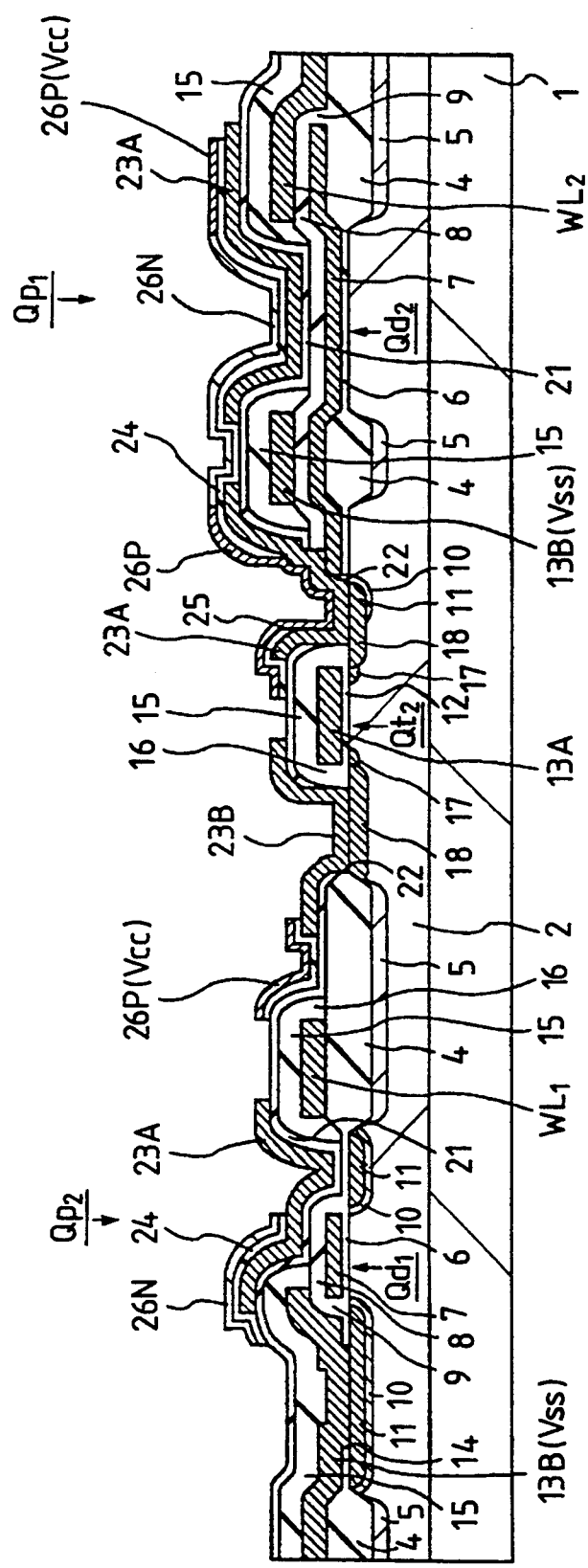
FIG. 21 is a sectional view of principal portions of the semiconductor substrate, showing the fabricating method.

Next, as shown in FIG. 21, a gate insulating film 24 of $Qp_1$, $Qp_2$ is deposited over the whole surface of the semiconductor substrate 1 by CVD, then a photoresist film is formed on the gate insulating film 24, and by etching the gate insulating film 24 using the photoresist film as mask there is formed a contact hole 25 over the gate electrode 23A of $Qp_1$, $Qp_2$.

Then, a polysilicon film (not shown) as a fourth-layer gate material is deposited over the entire surface of the semiconductor substrate 1 at a thickness of about 36 to 44 nm by CVD. Thereafter, using a photoresist film formed on the polysilicon film as mask, phosphorus is ion-implanted in the polysilicon film of the region for forming a channel region 26N of $Qp_1$, $Qp_2$. Next, using as mask a photoresist film newly formed on the polysilicon film, BF is ion-implanted in the regions for forming source region 26P and supply voltage line ($V_{CC}$) 26P of $Qp_1$, $Qp_2$. Next, the polysilicon film is etched using as mask a photoresist film newly formed on the polysilicon film to form channel region 26N, source region 26P, drain region 26P and supply voltage line ($V_{CC}$) 26P of $Qp_1$, $Qp_2$. In this way, MISFETs $Qp_1$ and $Qp_2$ for load are completed (FIG. 21).

Figure 22:
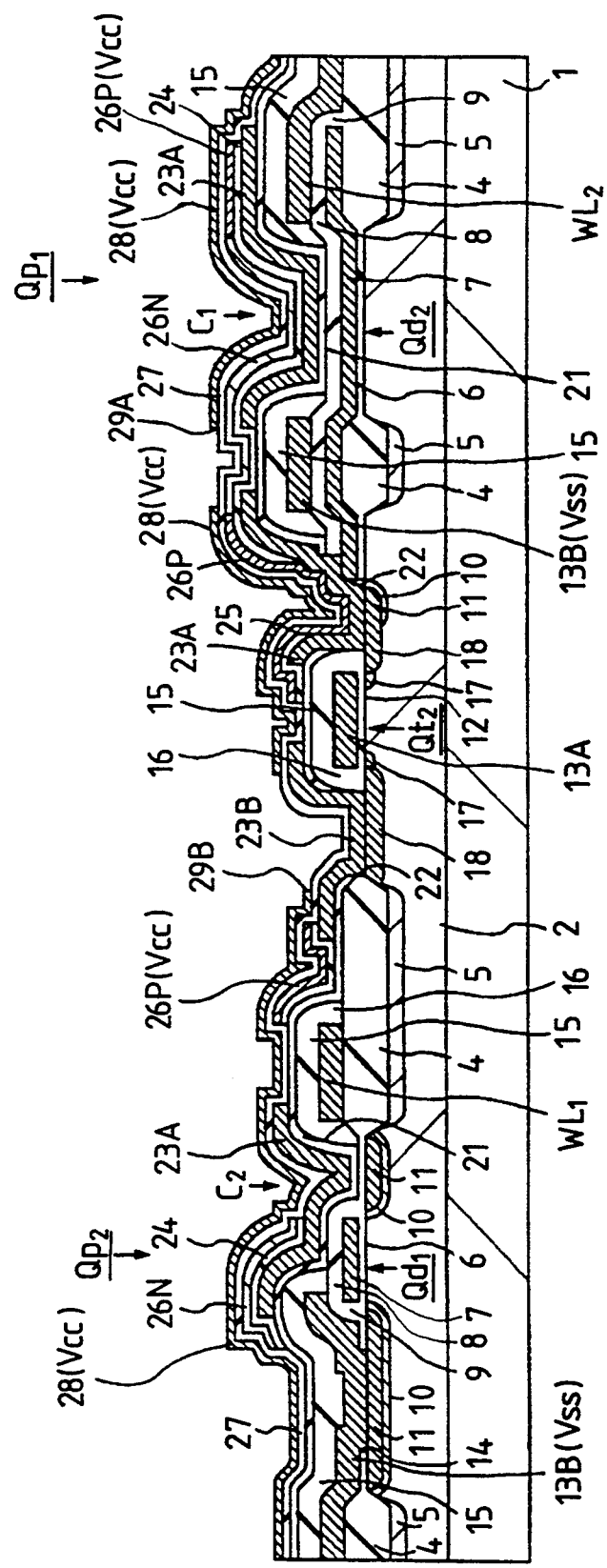
FIG. 22 is a sectional view of principal portions of the semiconductor substrate, showing the fabricating method.

Then, as shown in FIG. 22, an insulating film 27 serving as a dielectric film of the capacitors $C_1$ and $C_2$ is deposited over the entire surface of the semiconductor substrate 1 by CVD. The insulating film 27 is a laminate film of a silicon oxide film and a silicon nitride film. The thickness of the silicon oxide film as a lower layer is set at about 13 to 17 nm and that of the silicon nitride film as an upper layer is set at about 5 to 7 nm.

Next, a polysilicon film (not shown) as a fifth-layer gate material is deposited over the entire surface of the semiconductor substrate 1 at a thickness of about 27 to 33 nm by CVD. At the time of deposition of the polysilicon film, phosphorus is introduced therein for decreasing the resistance value of the polysilicon film.

Then, by etching the polysilicon film using as mask a photoresist film formed on the polysilicon film, there is completed a plate electrode 28 having an aperture 29A above the drain region 26P and an aperture 29B above the pad layer 23B, in MISFETs $Qp_1$, $Qp_2$ for load. At the same time there are completed capacitors $C_1$ and $C_2$ of a stacked structure using the gate electrode 23A as the first electrode, the plate electrode 28 as the second electrode and the insulating film 27 between the gate electrode 23A and the plate electrode 28 as a dielectric film, in $Qp_1$, $Qp_2$ (FIG. 22).

Figure 23:
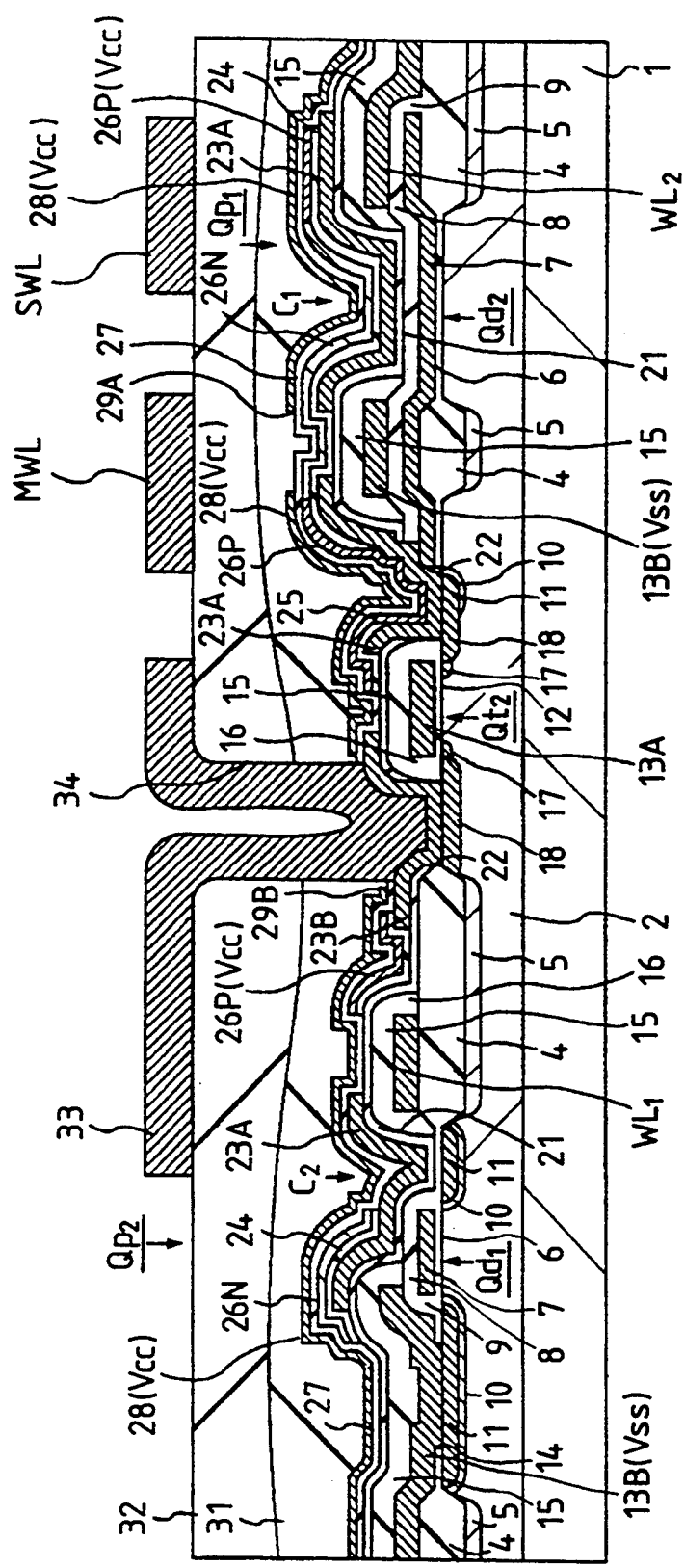
FIG. 23 is a sectional view of principal portions of the semiconductor substrate, showing the fabricating method.

Next, as shown in FIG. 23, an insulating film 31 which is a silicon oxide film and an interlayer insulating film 32 which is a BPSG film are successively deposited over the entire surface of the semiconductor substrate 1. The insulating film 31 is formed at a thickness of about 135 to 165 nm and the interlayer insulating film 32 formed at a thickness of about 270 to 330 nm both by CVD.

Then, by etching the interlayer insulating film 32 and insulating films 31, 27 using as mask a photoresist film formed on the interlayer insulating film 32, there is formed a contact hole 34 over the pad layer 23B which overlies one of the source and drain regions of MISFETs $Qt_1$, $Qt_2$ for transfer.

Next, tungsten film (not shown) as a first-layer wiring material is deposited over the whole surface of the semiconductor substrate 1 at a thickness of about 300 nm by sputtering. Thereafter, using as mask a photoresist film formed on the tungsten film, the tungsten film is etched to form an intermediate electroconductive layer 33, a sub word line SWL and a main word line MWL (FIG. 23). At the same time, a wiring line 44 for a fuse 40 is formed by the tungsten film.

Figure 24:
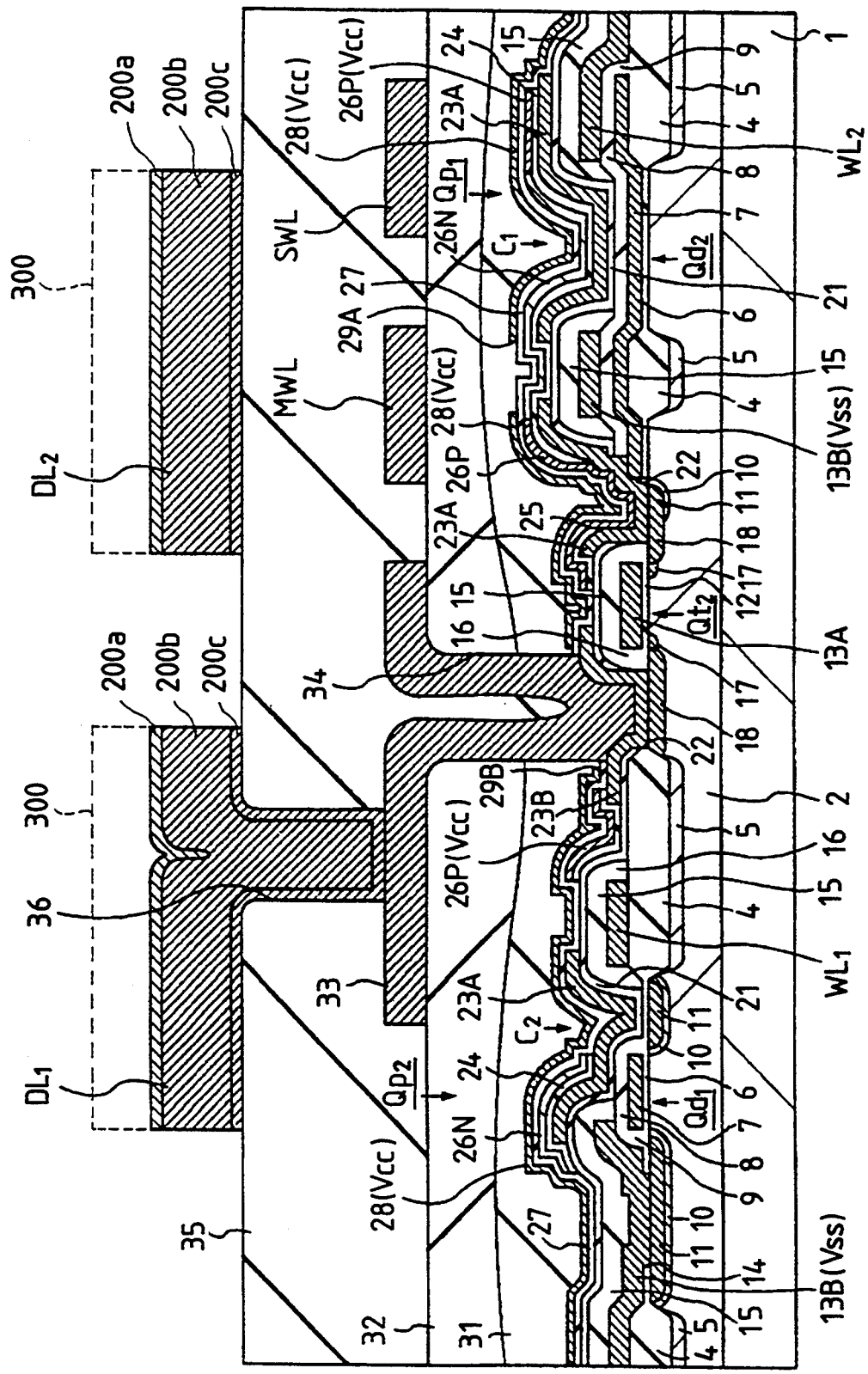
FIG. 24 is a sectional view of principal portions of the semiconductor substrate, showing the fabricating method.
Figure 25:
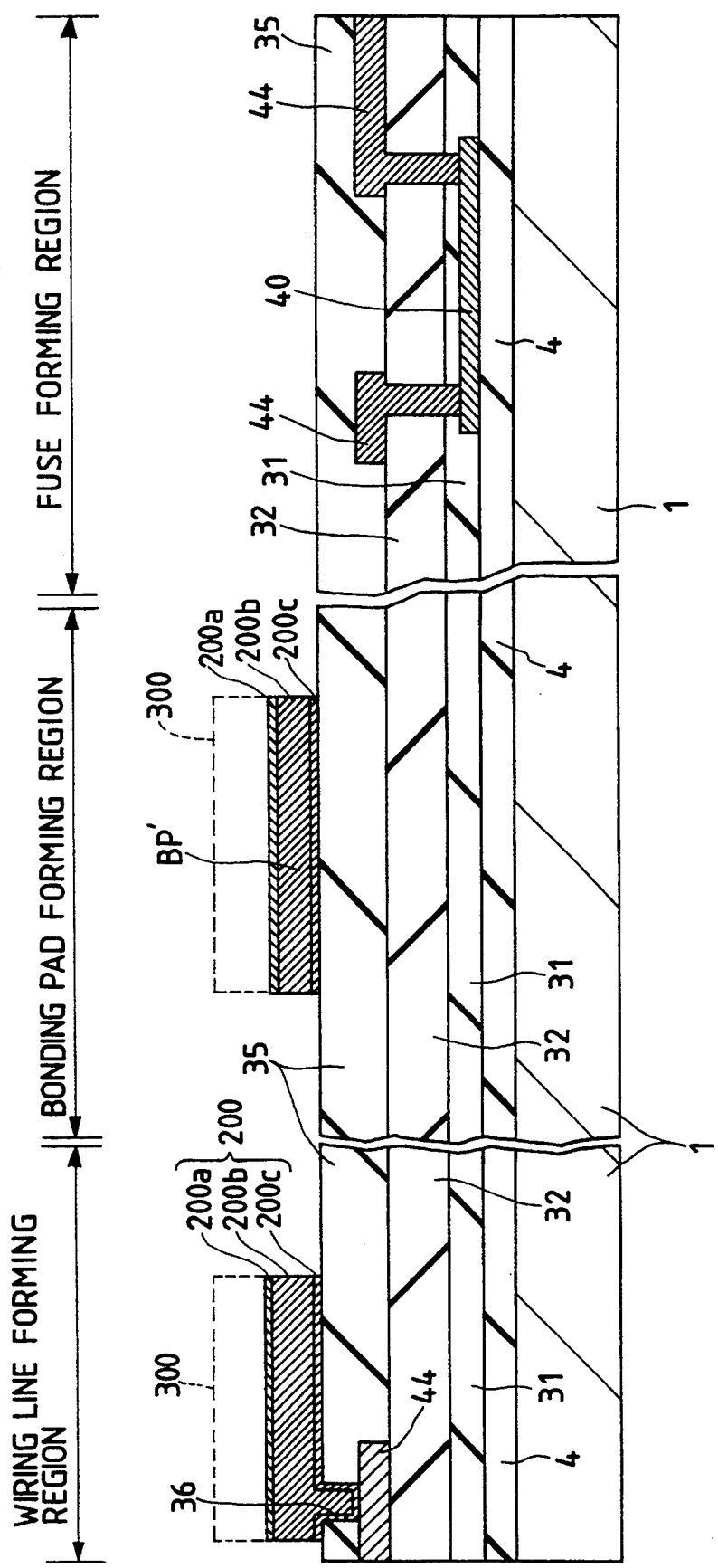
FIG. 25 is a sectional view of principal portions of the semiconductor substrate, showing the fabricating method.

Then, as shown in FIG. 24, an interlayer insulating film 35 which is a three-layer film formed by successive lamination of silicon oxide film, spin on glass film and silicon oxide film, is deposited over the whole surface of the semiconductor substrate 1. The silicon oxide films are formed by plasma CVD using oxygen ($O_2$) and tetraethoxysilane [$Si(OC_2H_5)_4$] as source gases. The thickness of the interlayer insulating film 35 is set at about 500 nm.

Figure 51A:
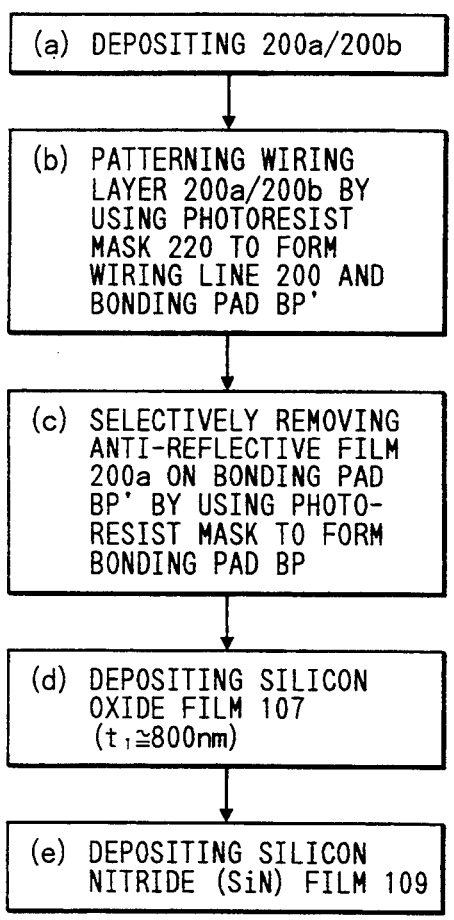
FIG. 51A shows a flow of the second manufacturing process corresponding to FIGS. 45A, 45B, 45C and 46 which the present inventor has studied.
Figure 51B:
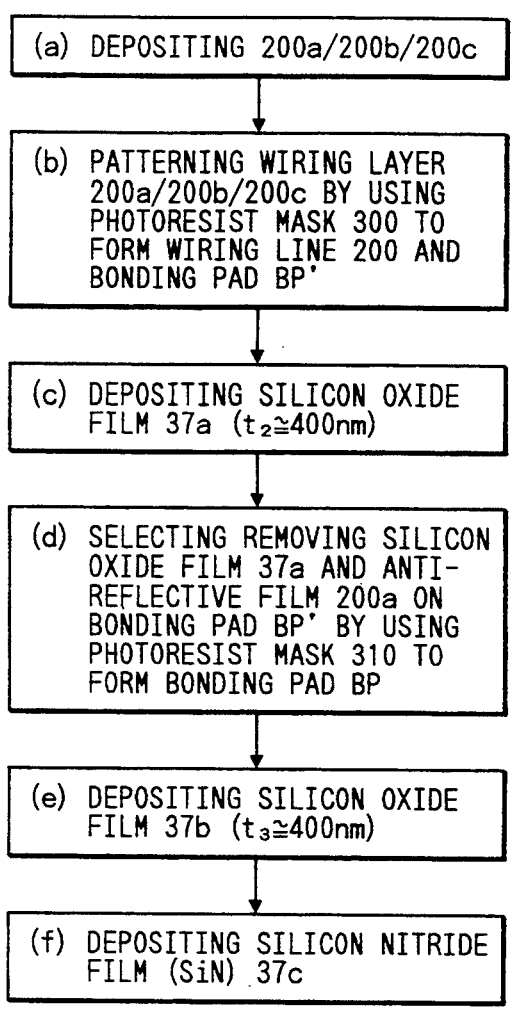
FIG. 51B shows a process flow corresponding to FIGS. 25-28 which illustrate a semiconductor integrated circuit device fabricating method embodying the present invention.
Figure 52A:
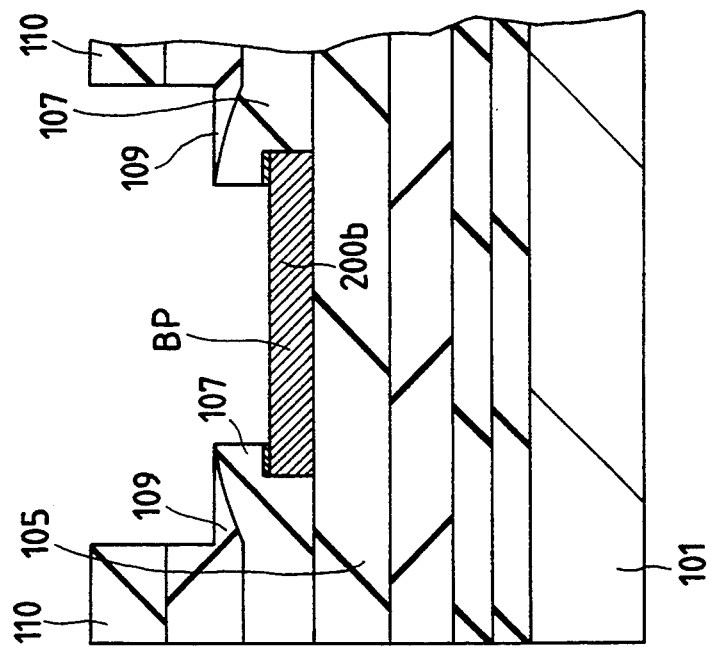
FIGS. 52A and 52B are sectional views of principal portions, showing a semiconductor integrated circuit device fabricating method which the present inventor has studied.
Figure 52B:
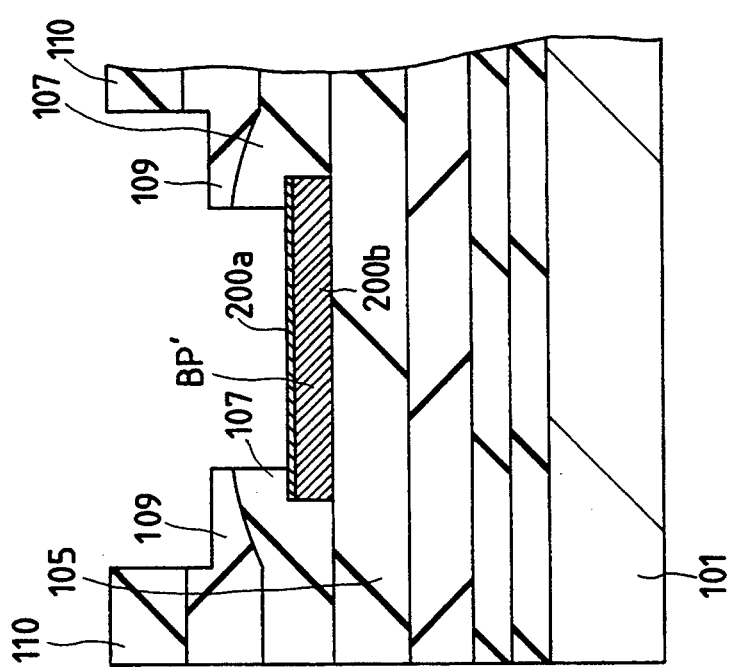

Next, a contact hole 36 is formed on the intermediate electroconductive layer 33 by etching the interlayer insulating film 35 using as mask a photoresist film formed on the interlayer insulating film 35, followed by deposition of a second-layer wiring material (not shown) over the whole surface of the substrate 1 [step (a) in FIG. 51B]. This wiring material is a three-layer film formed by successive lamination of TiW film 200c, aluminum alloy film 200b and TiW film 200a. The TiW films are formed by sputtering so that the thickness of the TiW film 200c as a lower layer is about 60 nm and that of the TiW film 200a as an upper layer is about 200 nm. The aluminum alloy film 200b is formed at a thickness of about 800 nm by sputtering. Then, a complementary data line DL (comprising a first data line $DL_1$ and a second data line $DL_2$) by etching the TiW film 200a, aluminum alloy film 200b and TiW film 200c successively using as mask a photoresist film 300 formed on the TiW film 200a (FIG. 24). At this time, the second-layer wiring material on the interlayer insulating insulating film 35 at the Outermost peripheral portion of the substrate 1 is also etched to form a bonding pad BP' and a wiring line 200 [step (b) in FIG. 51B].

The upper TiW layer 200a acts as an anti-reflection film. As the wiring pattern of 200 and DL can be rendered fine. By providing the upper and lower TiW layers 200a, 200c, the wiring line 200 can be prevented from being broken by electromigration.

FIGS. 25 to 32 are sectional views of principal portions of the semiconductor substrate, in each of which the right-hand side, central portion and left-hand side represent a fuse forming region, a bonding pad forming region and a wiring line forming region, respectively.

The wiring forming region represents a connection between the second-layer wiring line 200 and the first-layer wiring line 44 through the contact hole 36.

Figure 26:
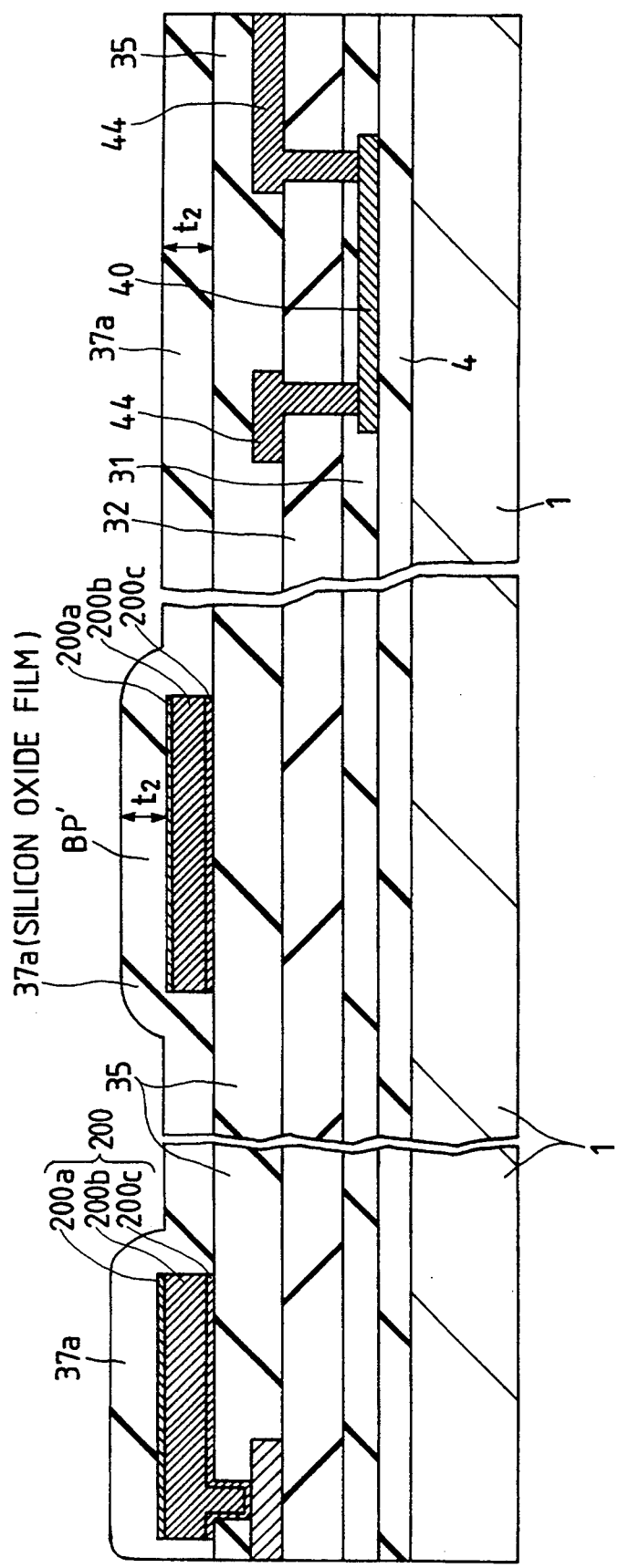
FIG. 26 is a sectional view of principal portions of the semiconductor substrate, showing the fabricating method.

Next, as shown in FIG. 26, a silicon oxide film 37a as a constituent of a final passivation film 37 is deposited on the interlayer insulating film 35 [step (c) in FIG. 51B]. The silicon oxide film 37a is deposited at a thickness $t_2$ of about 400 nm by plasma CVD using oxygen and tetraethoxysilane as source gases.

Figure 27:
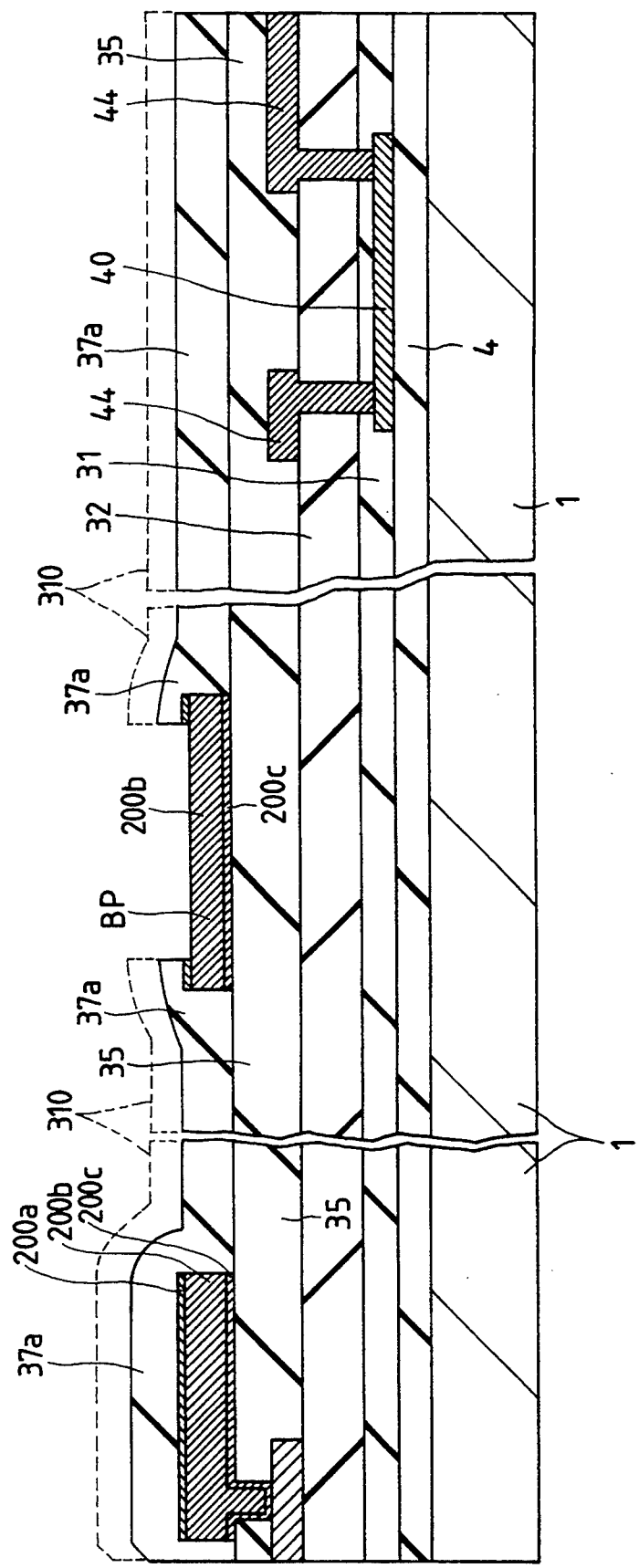
FIG. 27 is a sectional view of principal portions of the semiconductor substrate, showing the fabricating method.

Then, as shown in FIG. 27, the bonding pad BP is once exposed by etching the silicon oxide film 37a using as mask a photoresist film 310 formed on the silicon oxide film 37a [step (d) in FIG. 51B]. At this time, in the wiring material which constitutes the bonding pad BP', the top TiW film 200a is etched to expose the underlying aluminum alloy film 200b. Since the aluminum alloy film 200b is lower in electrical resistance than the TiW film 200a, it is possible to reduce the contact resistance between the bonding pad BP and a probe when there is conducted an electrical test with the probe applied to the surface of the bonding pad BP in a step which will be described later.

By removing the top TiW film 200a which acts as an anti-reflection film of the bonding pad BP' it is made possible to improve the accuracy of position detection for the bonding pad BP.

Further, since the top TiW film 200a on the bonding pad BP' alone can be removed selectively, the top TiW film 200a remains on the other wiring line 200 portion, whereby the wiring line 200 can be prevented from being broken by electromigration.

The top wiring layer 200a acting as an anti-reflection film is not limited to TiW film. It may be TiN film.

Figure 37A:
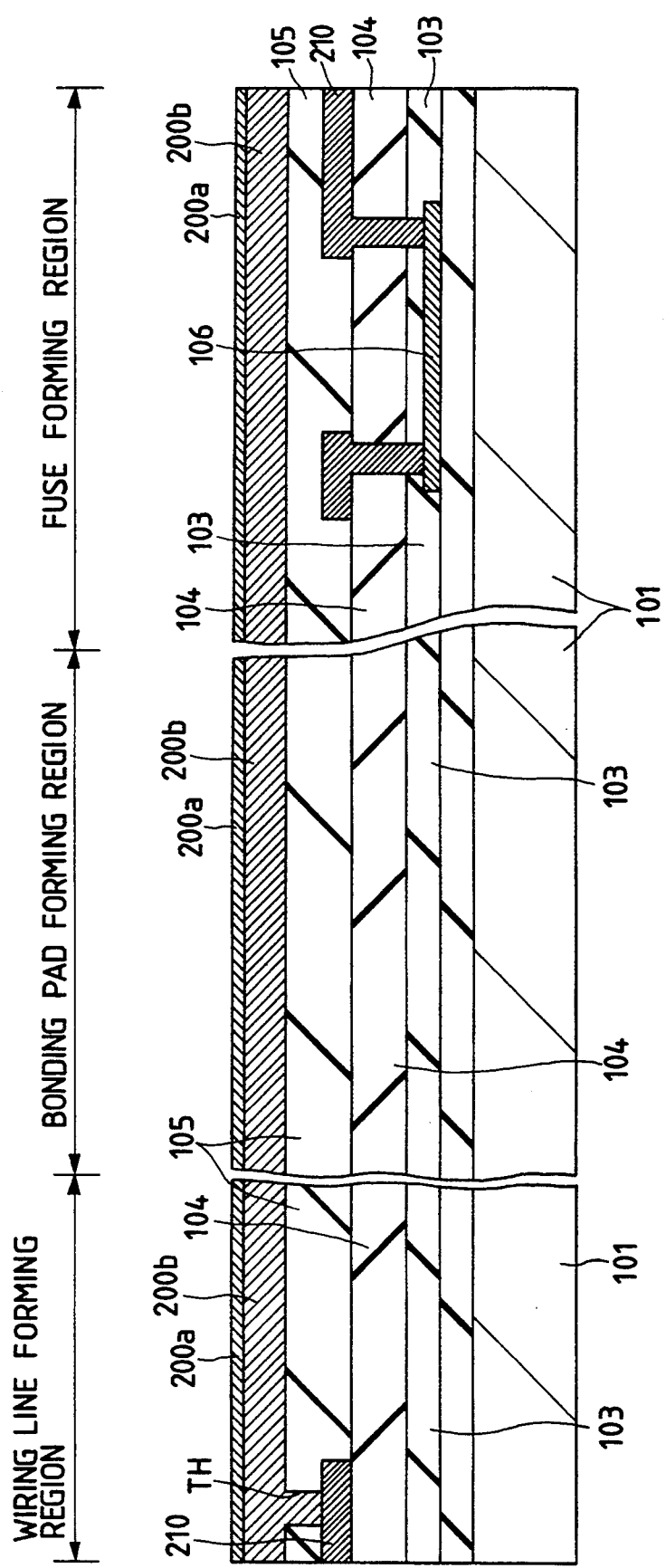
Figure 38:
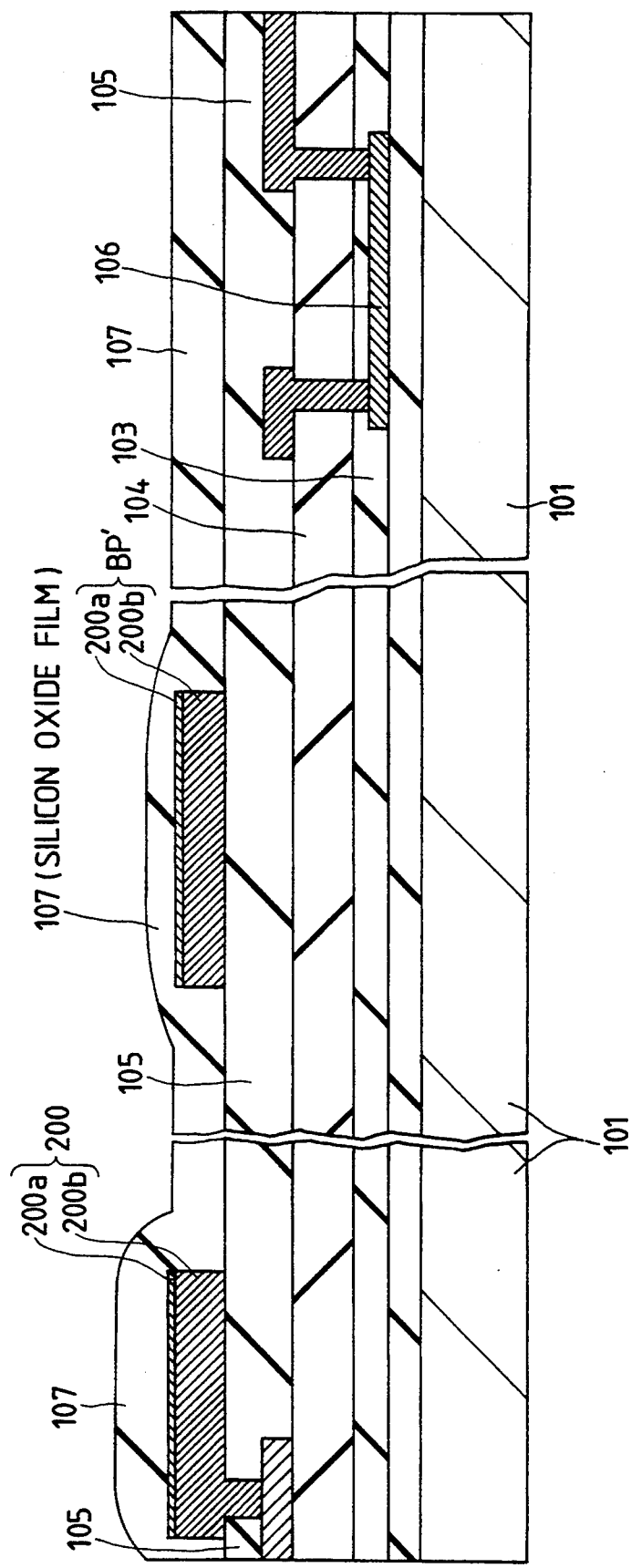
FIG. 38 is a sectional view of principal portions of the semiconductor substrate, showing the first example of the fabricating method.
Figure 39:
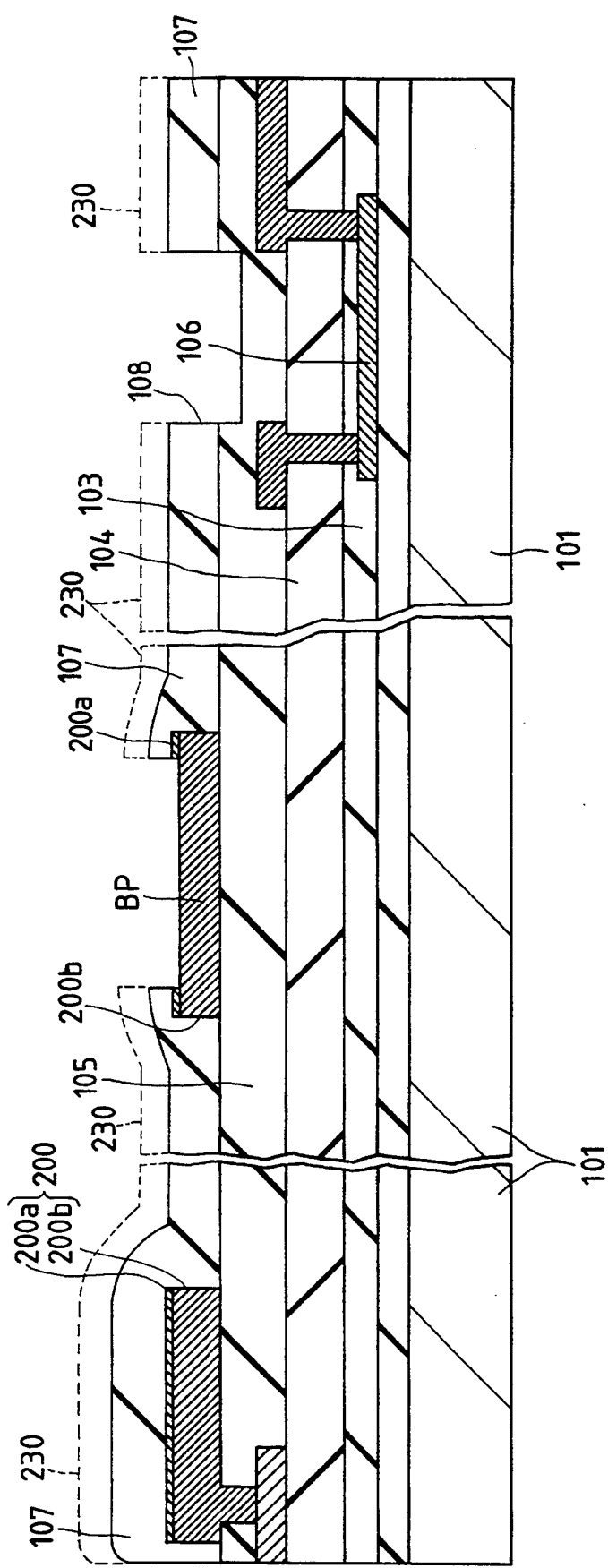
FIG. 39 is a sectional view of principal portions of the semiconductor substrate, showing the first example of the fabricating method.
Figure 40:
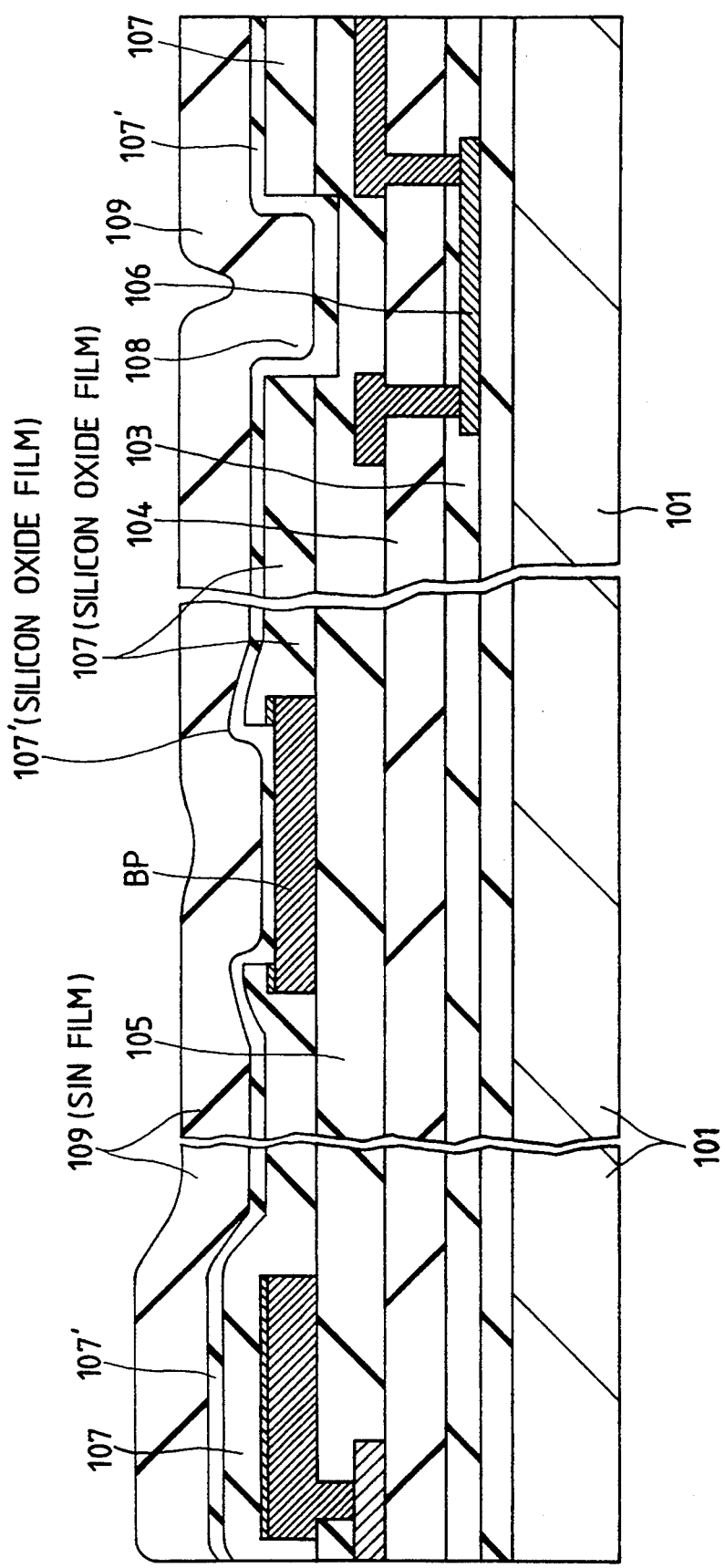
FIG. 40 is a sectional view of principal portions of the semiconductor substrate, showing the first example of the fabricating method.
Figure 41:
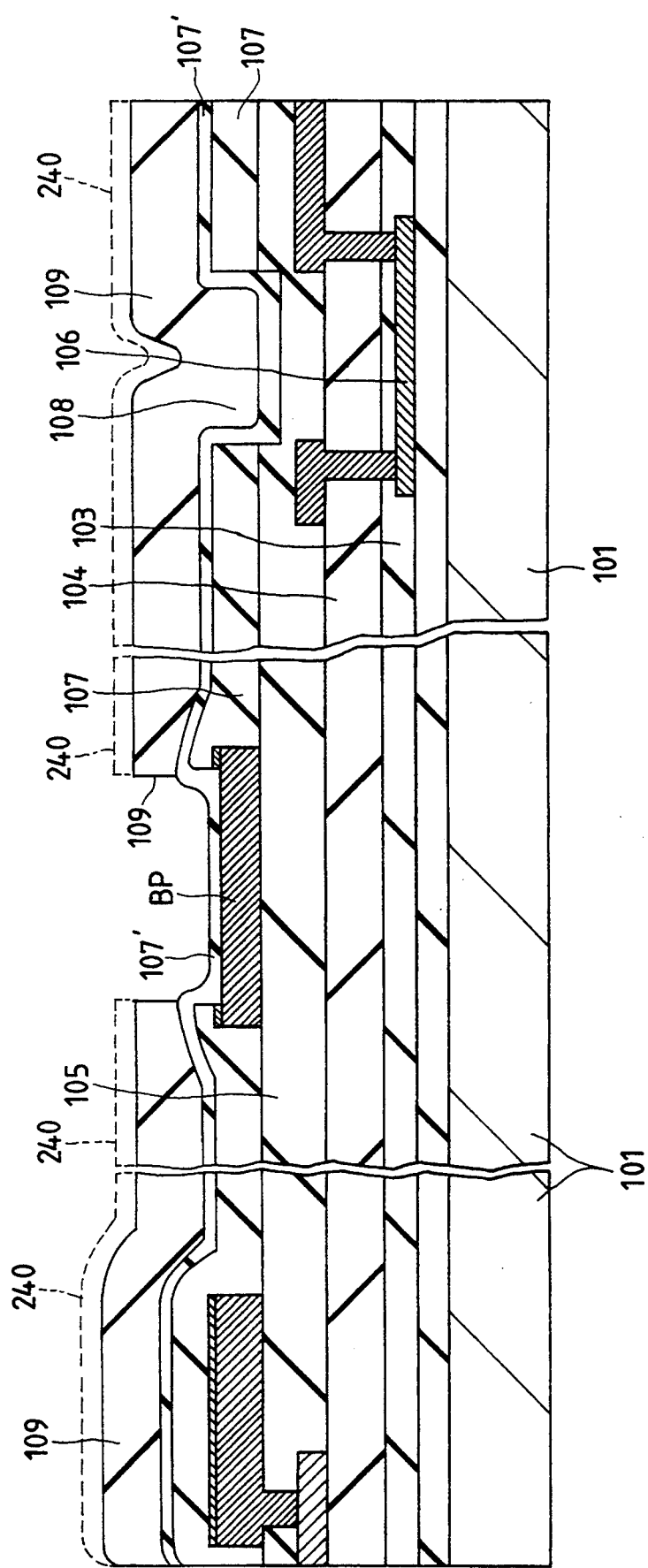
FIG. 41 is a sectional view of principal portions of the semiconductor substrate, showing the first example of the fabricating method.
Figure 42:
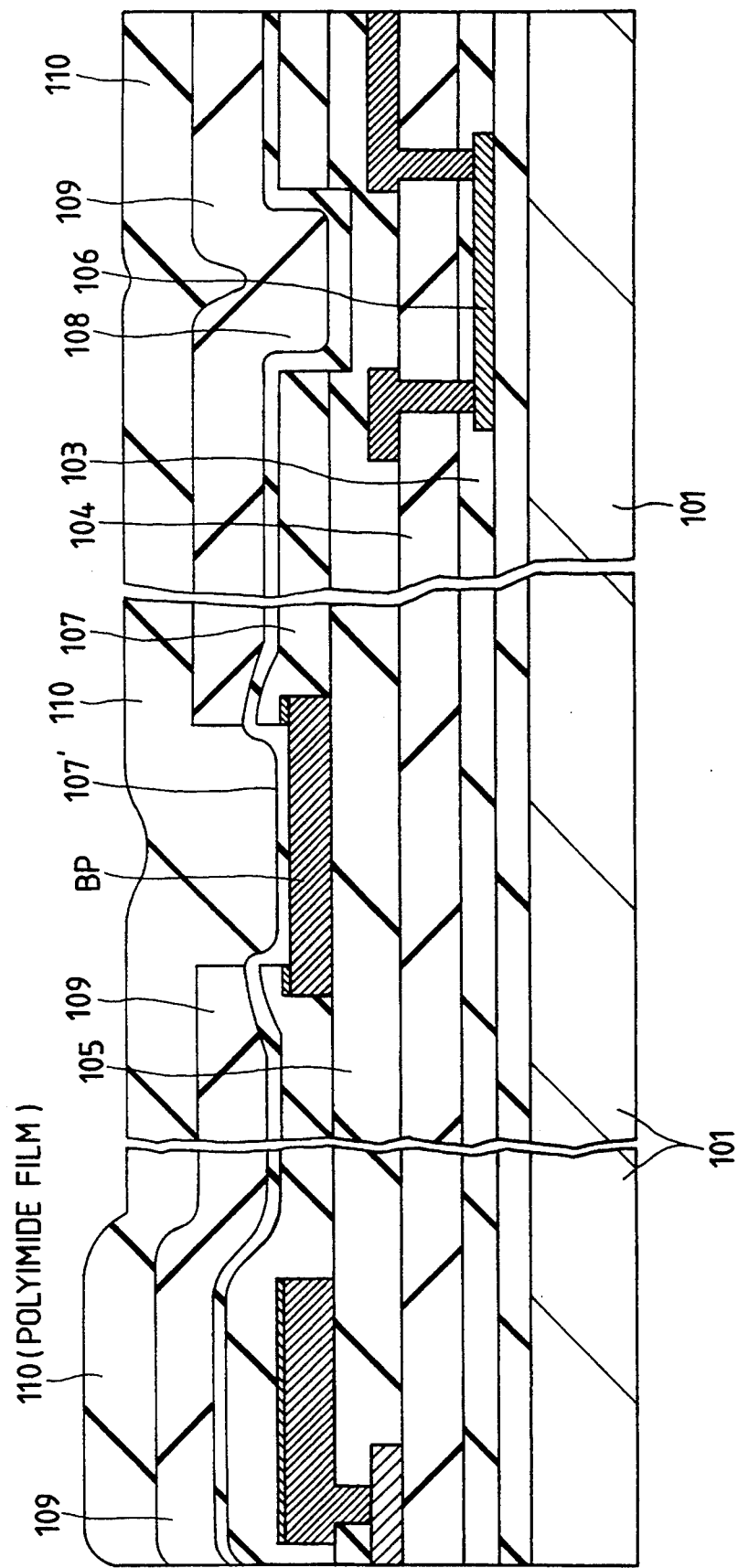
FIG. 42 is a sectional view of principal portions of the semiconductor substrate, showing the first example of the fabricating method.
Figure 43:
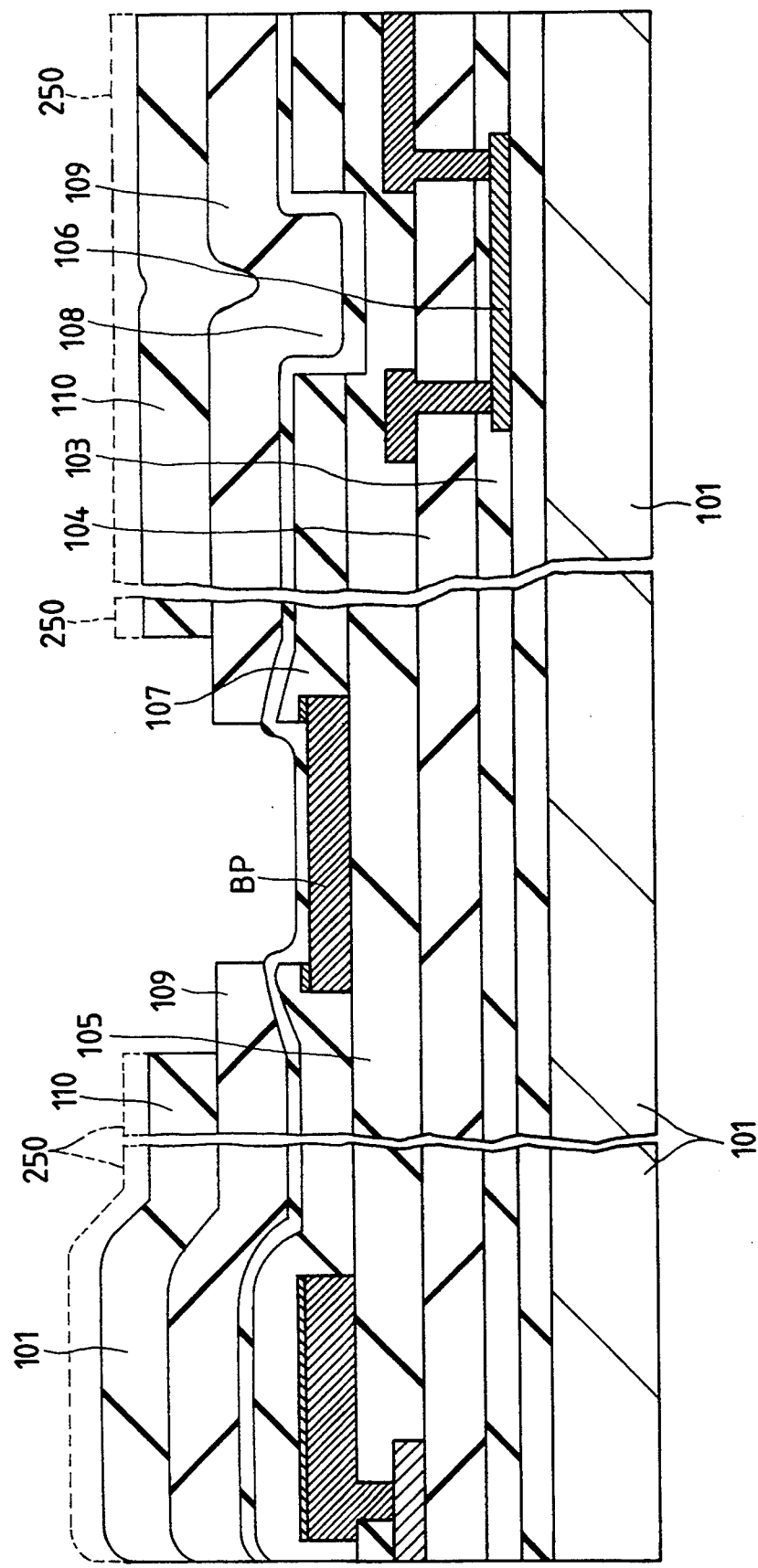
FIG. 43 is a sectional view of principal portions of the semiconductor substrate, showing the first example of the fabricating method.
Figure 44:
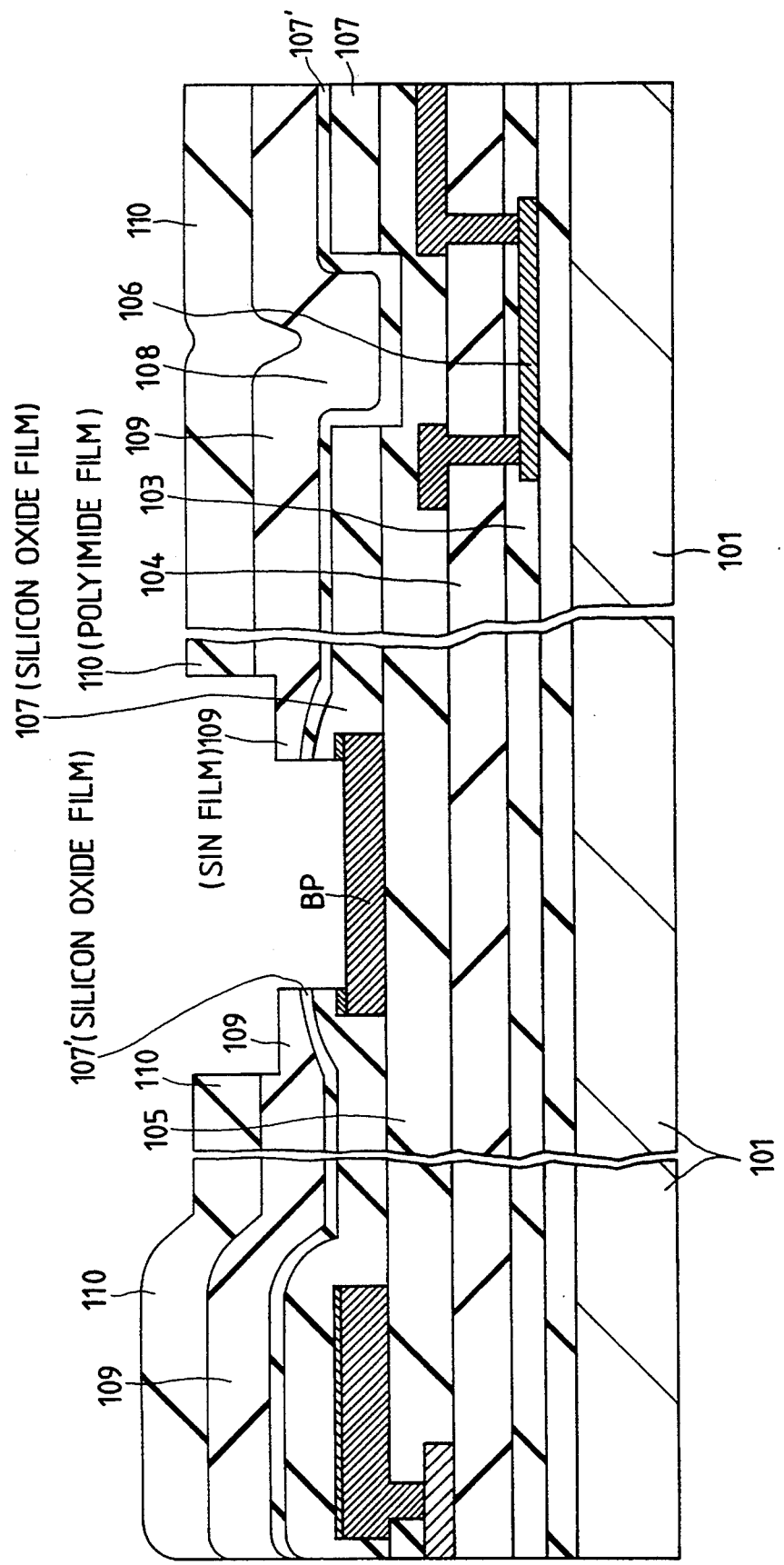
FIG. 44 is a sectional view of principal portions of the semiconductor substrate, showing the first example of the fabricating method.
Figure 45A:
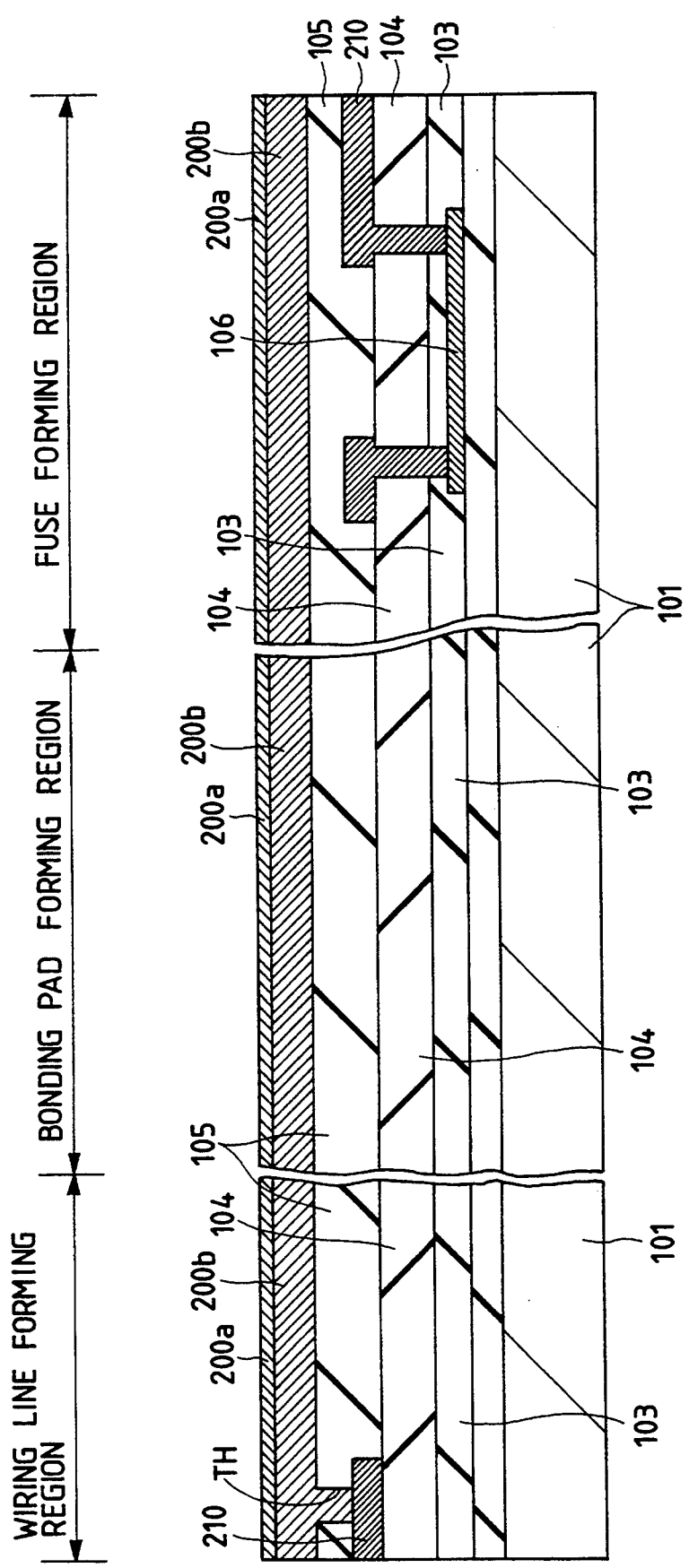
Figure 46:
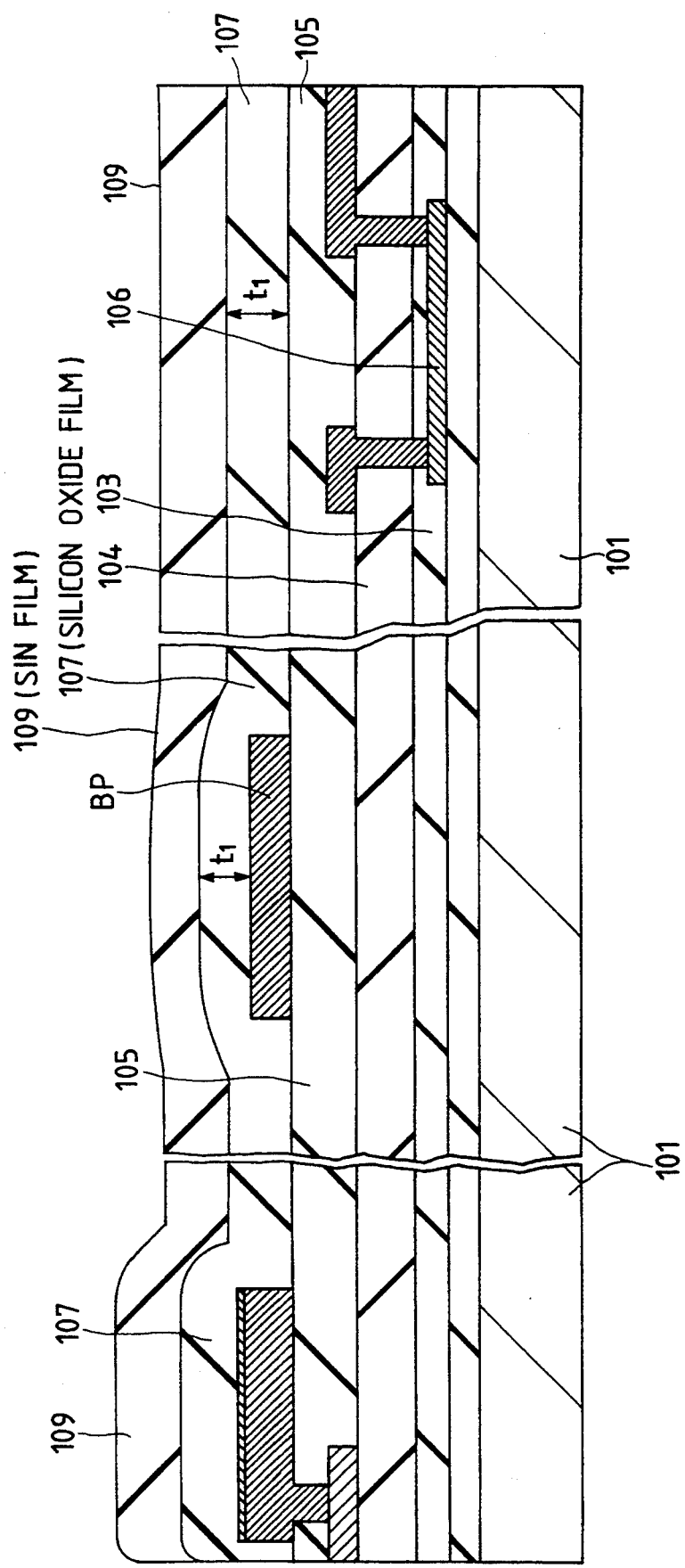
FIG. 46 is a sectional view of principal portions of the semiconductor substrate, showing the second example of the fabricating method.
Figure 47:
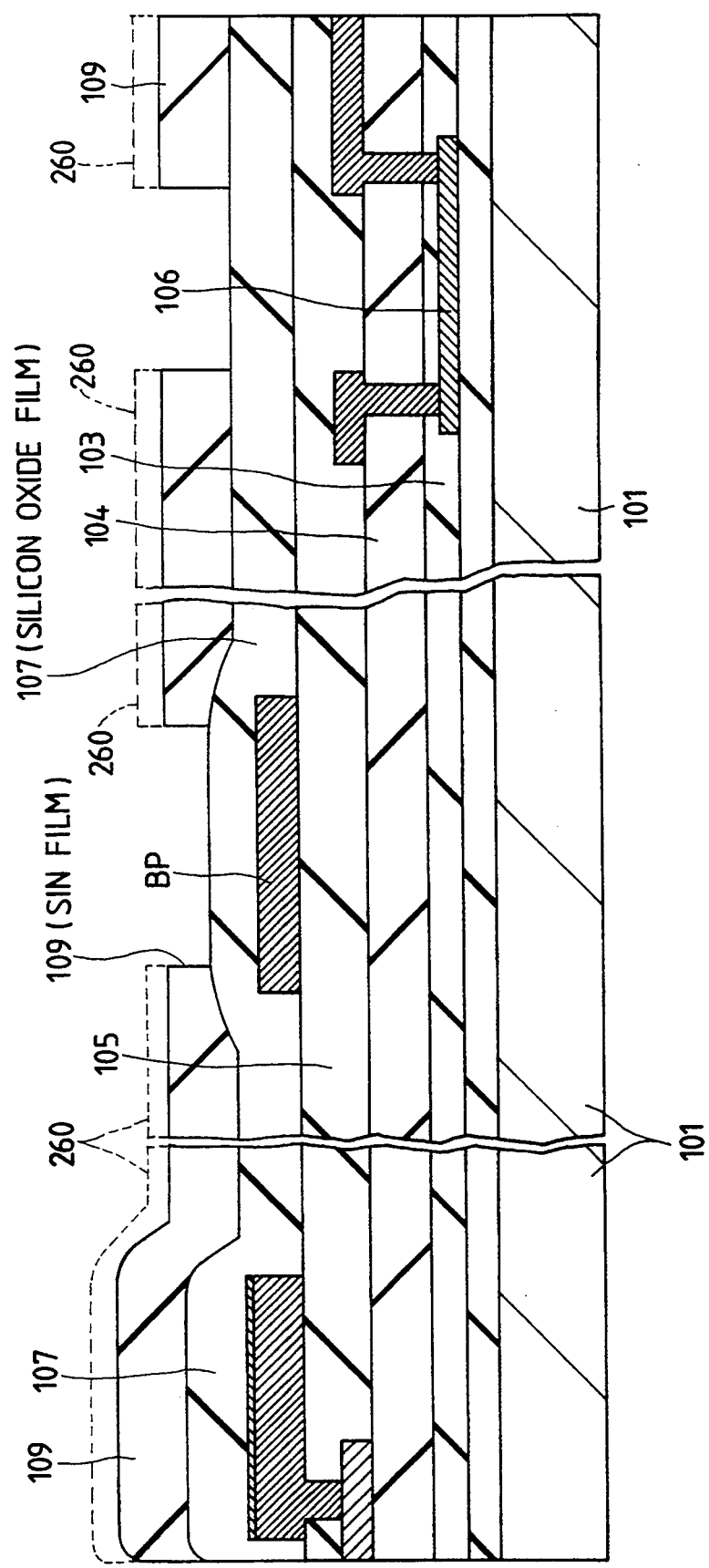
FIG. 47 is a sectional view of principal portions of the semiconductor substrate, showing the second example of the fabricating method.

Next, as shown in FIG. 37, a silicon oxide film 37b is again deposited on the silicon oxide film 37a at a thickness $t_3$ of about 400 nm [step (e) in FIG. B]. Further, a silicon nitride film 37c as a constituent of the final passivation film (37) is deposited thereon [step (f) in FIG. 51B]. The silicon nitride film 37c is formed at a thickness of about 1.2 μm by plasma CVD using monosilane (SiH$_4$) and nitrogen (or ammonia) as source gases.

Thus, in this embodiment, the silicon oxide films 37a and 37b are deposited in two stages, at a thickness of about 400 nm each time, and during this period, the silicon oxide film 37a on the bonding pad BP is once removed, so that the thickness $t_3$ of the silicon oxide film 37b on the bonding pad BP finally becomes 400 nm or so.

Figure 28:
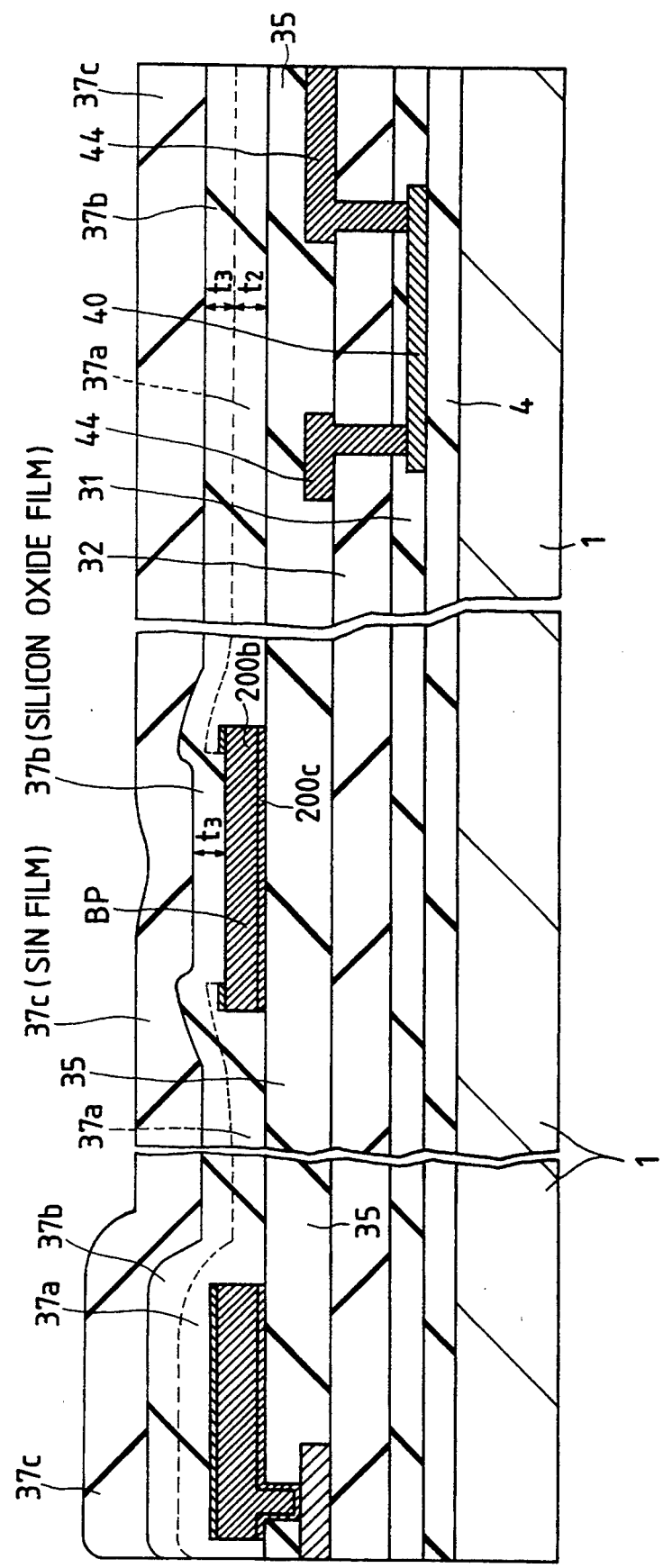
FIG. 28 is a sectional view of principal portions of the semiconductor substrate, showing the fabricating method.

On the other hand, since the silicon oxide films 37a and 37b are deposited on the fuse 40, the thickness $t_2+t_3$ of both films 37a and 37b on the fuse 40 is about 800 nm. Thus, as shown in FIGS. 51A and 51B, the number of steps increases by one deposition step in comparison with the second manufacturing process, but any further step is added to the step of photolithography involving deposition of a photoresist and making exposure using a photolithograph to prepare a master pattern. That is, without adding to the photolithography step, the thickness of the silicon oxide film 37c on the bonding pad can be made smaller than the thickness of the silicon oxide films 37b and 37c on the fuse 40, as shown in FIG. 28.

In this embodiment, though not specially limited, annealing is performed using hydrogen during deposition of the final passivation film 37 to feed hydrogen to the polysilicon film as a constituent of MISFETs $Q_{P1}$, $Q_{P2}$ for load. More specifically, after the silicon oxide films 37a and 37b are deposited in two stages about 400 nm each time, the semiconductor substrate 1 is annealed in a nitrogen atmosphere containing hydrogen at about 400° C. for 30 minutes or so and then silicon nitride film 37c is deposited on the silicon oxide film 37b.

By the above annealing using hydrogen, hydrogen is fed to the polysilicon film as a constituent of $Q_{P1}$, $Q_{P2}$ through the interlayer insulating films 35, 32 and insulating film 31. As a result, sufficient hydrogen atoms are fed to a dangling bond present on the crystal grain boundary of the polysilicon film as a constituent of $Q_{P1}$, $Q_{P2}$, whereby the mutual inductance (Gm) of $Q_{P1}$, $Q_{P2}$ is improved and hence the characteristics of the memory cell MC in the SRAM are improved. Although the plate electrode 28 is formed so as to cover the whole area of the memory cell MC, since the aperture 29A is formed in part of the plate electrode 28 as mentioned previously, hydrogen can be fed through the aperture 29A to the polysilicon film which constitutes $Q_{P1}$, $Q_{P2}$.

Figure 48:
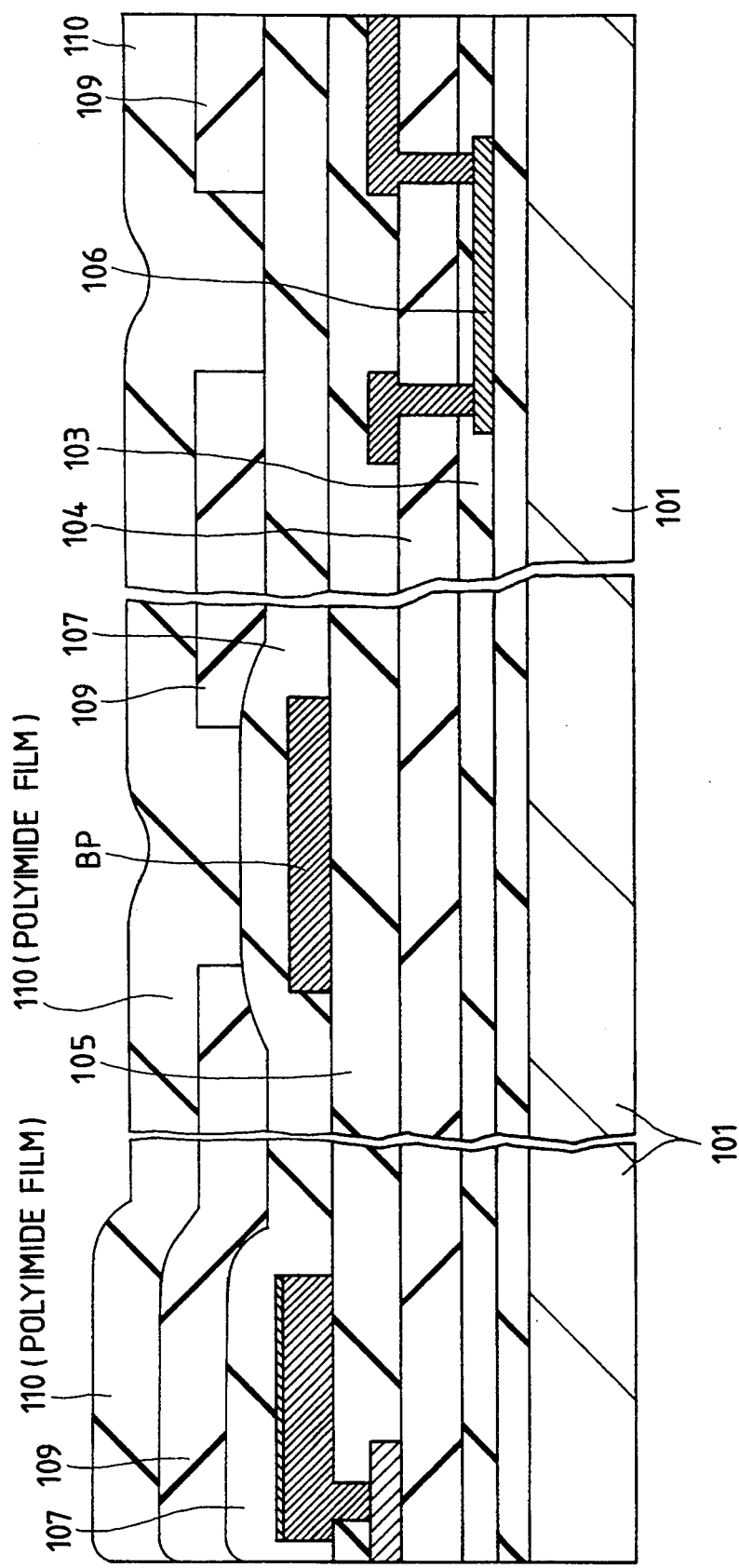
FIG. 48 is a sectional view of principal portions of the semiconductor substrate, showing the second example of the fabricating method.
Figure 49:
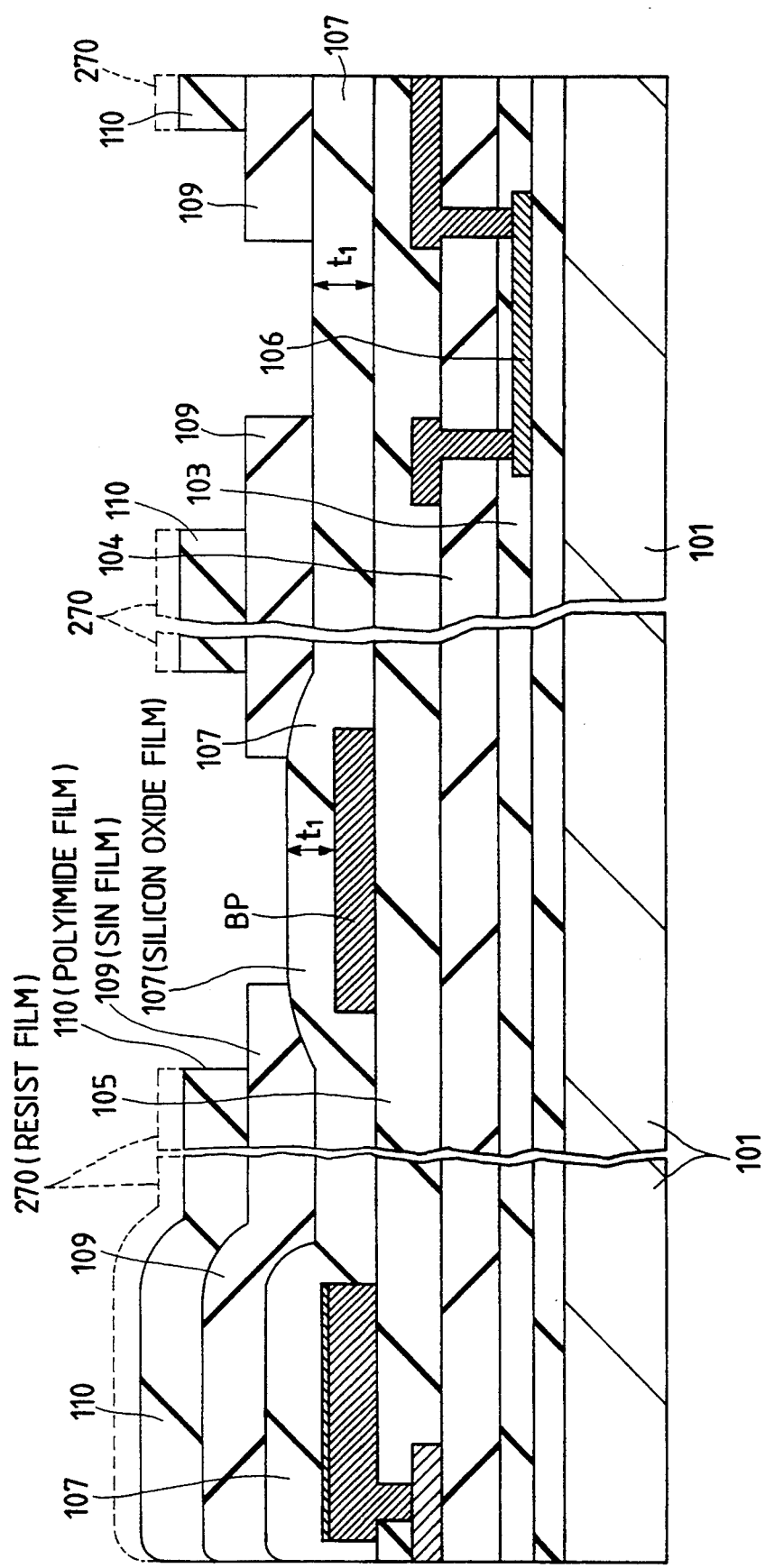
FIG. 49 is a sectional view of principal portions of the semiconductor substrate, .showing the second example of the fabricating method.
Figure 50:
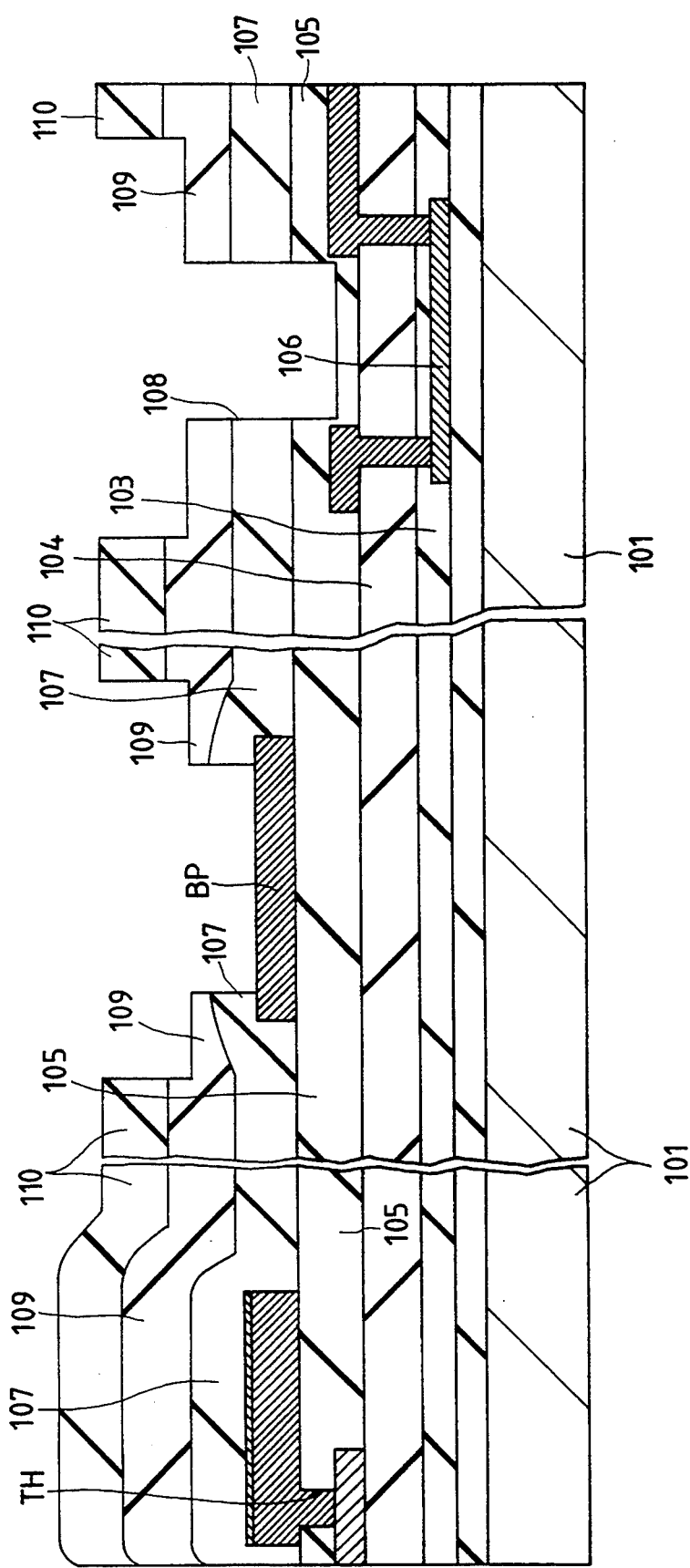
FIG. 50 is a sectional view of principal portions of the semiconductor substrate, showing the second example of the fabricating method.

The following steps illustrated in FIGS. 29 to 32 are basically the same as the steps of FIGS. 48 to 50 in the second manufacturing process.

Figure 29:
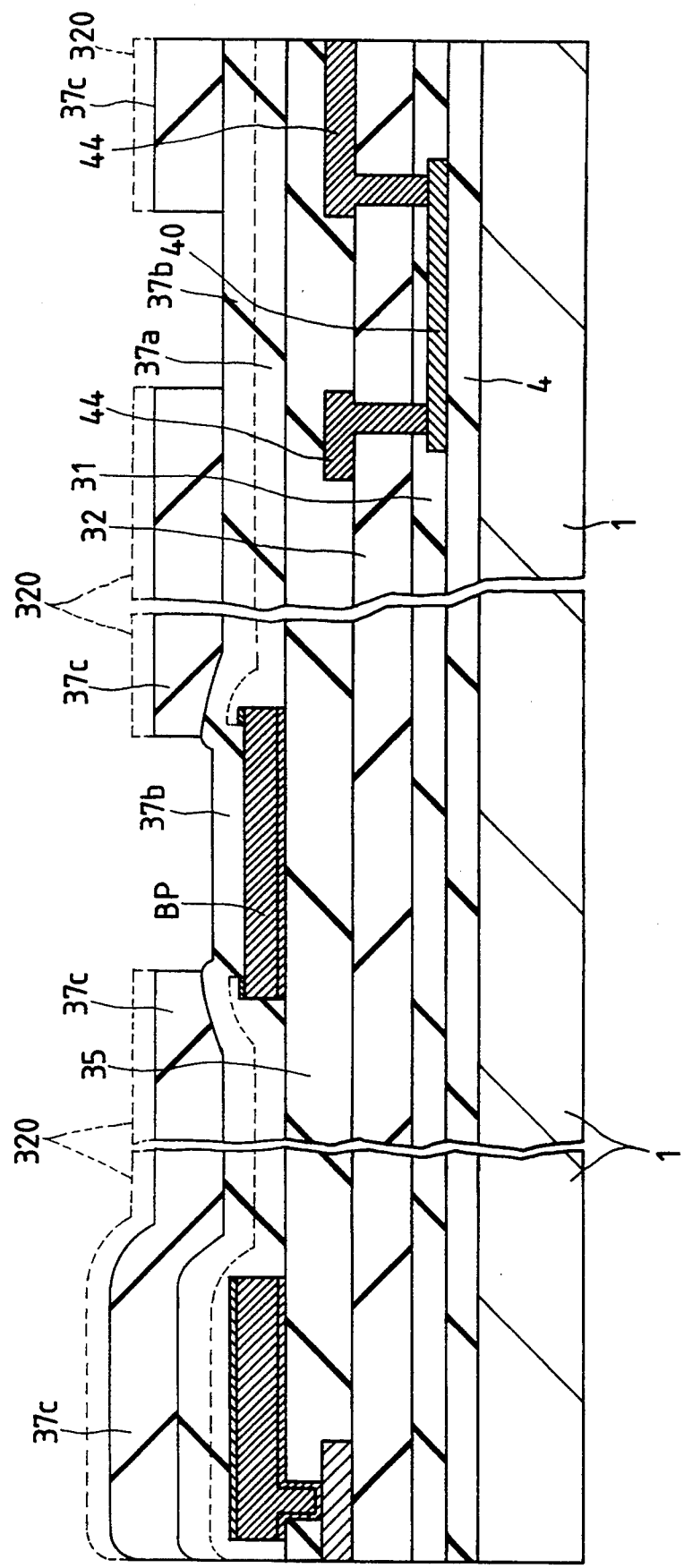
FIG. 29 is a sectional view of principal portions of the semiconductor substrate, showing the fabricating method.
Figure 30:
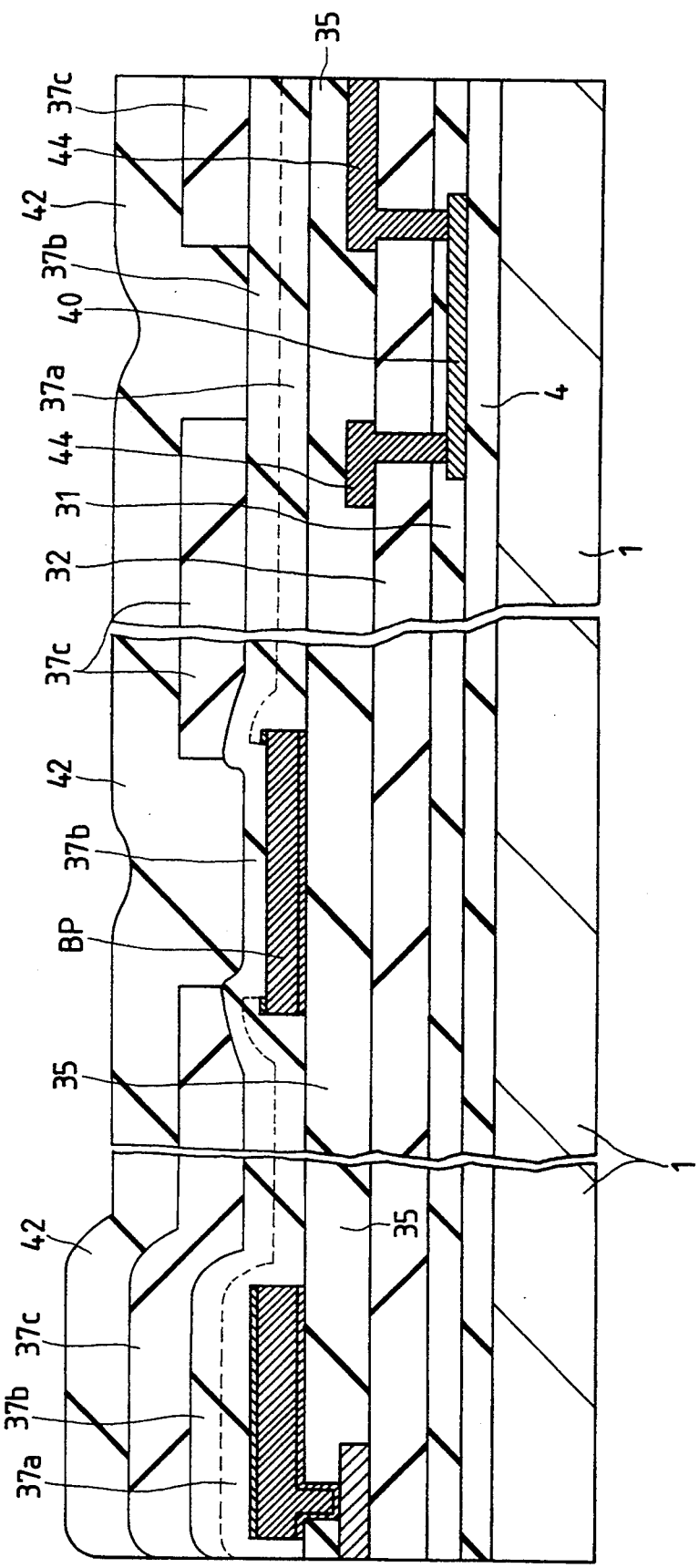
FIG. 30 is a sectional view of principal portions of the semiconductor substrate, showing the fabricating method.

As shown in FIG. 29, the silicon oxide film 37b is exposed by etching the silicon nitride film 37c above both bonding pad BP and fuse 40, using a mask 320, followed by removal of the mask 320. Then, a polyimide film 42 is applied onto the silicon nitride film 37c at a thickness of about 10 μm.

Figure 31:
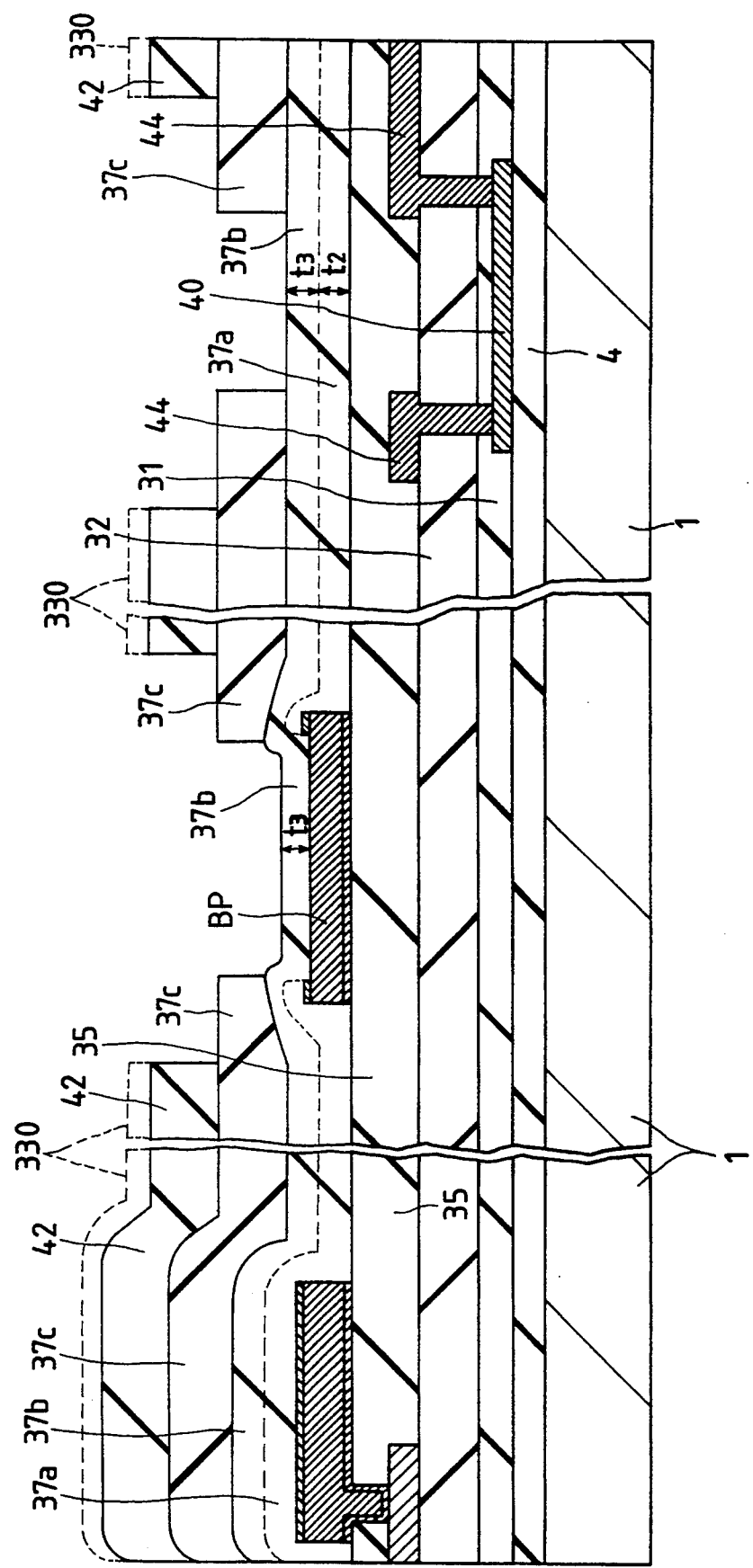
FIG. 31 is a sectional view of principal portions of the semiconductor substrate, showing the fabricating method.
Figure 32:
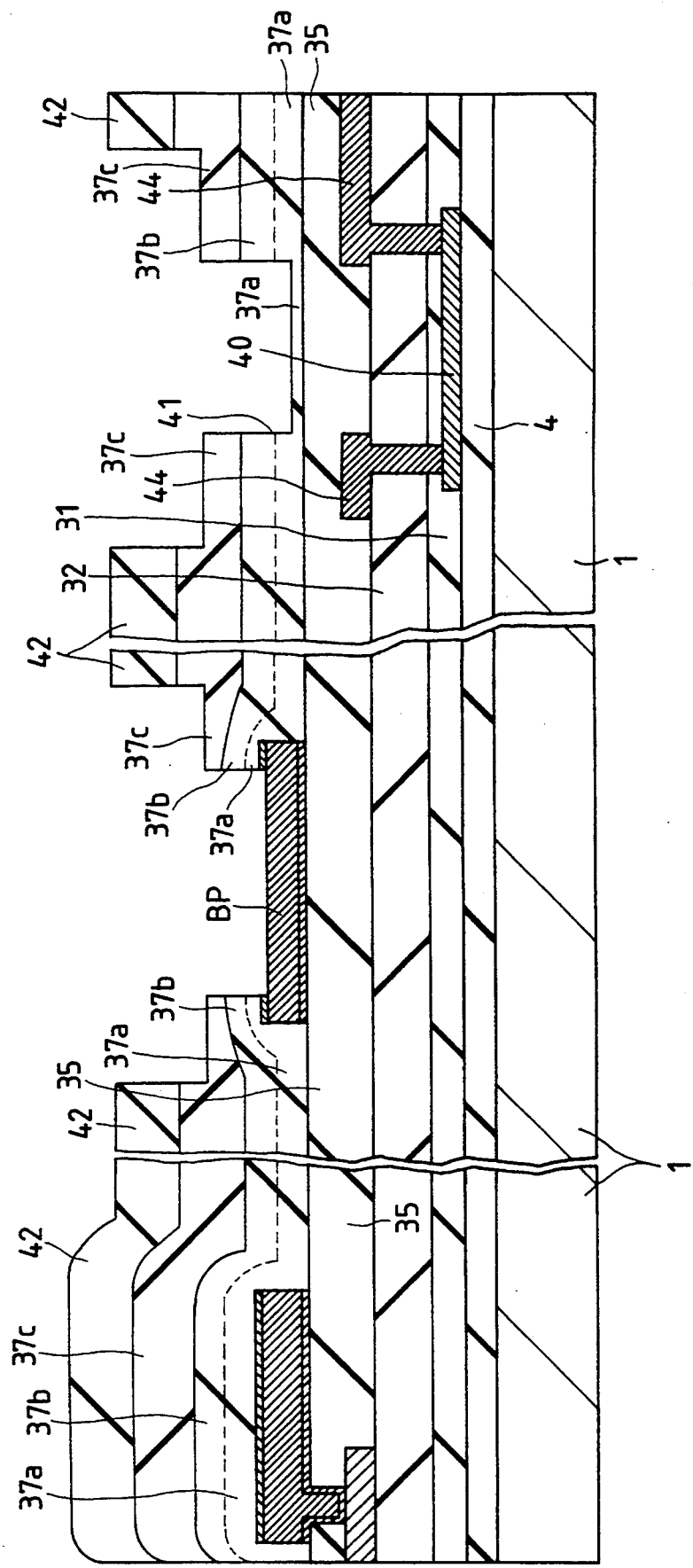
FIG. 32 is a sectional view of principal portions of the semiconductor substrate, showing the fabricating method.

Next, as shown in FIG. 31, the silicon nitride film 37c and the silicon oxide film 37b are exposed by etching the polyimide resin 42 above both bonding pad BP and fuse 40, using a mask 330, followed by removal of the mask 330. Subsequently, as shown in FIG. 32, the bonding pad BP is exposed and an aperture 41 is formed above the fuse 40 by etching the silicon oxide film 37b, using the silicon nitride film 37c as mask.

Thus, in this embodiment, the aperture 41 is formed simultaneously with exposure of the bonding pad BP by etching the silicon oxide film 37b on the bonding pad BP. At this time, the thickness $t_3$ of the silicon oxide film 37b on the bonding pad BP is about 400 nm as mentioned above, provided it is actually 300 nm or so because the surface of the silicon oxide film 37b is also etched to some extent at the time of etching the silicon nitride film 37c on the silicon oxide film 37b, while the thickness $t_2+t_3$ of the silicon oxide films 37a and 37b above the fuse 40 is about 800 nm, provided it is actually 700 nm or so for the reason just mentioned above. Thus, the thickness $t_2$ of the silicon oxide film 37b on the bonding pad BP is about half of the thickness $t_2+t_3$ of the silicon oxide films 37a and 37b located above the fuse 40. In other words, when the bonding pad BP is exposed by etching the silicon oxide film 37b on the bonding pad, the silicon oxide film 37a about 400 nm in thickness still remains at the bottom of the aperture 41 which is formed at the same time. As a result, the reliability of the fuse aperture 41 can be improved.

Next, though not shown, there is conducted the first electrical test while applying a probe to the surface of the bonding pad BP. Low temperature characteristics of the device are mainly checked in the first electrical test. When a defective memory cell MC was found out in this electrical test, a laser beam is radiated to the fuse 40 through the silicon oxide film 37a, interlayer insulating films 35, 32 and insulating film 31 located below the aperture 41 to cut the fuse 40, thereby switching from the defective memory cell MC to a memory cell MC in the redundancy circuit SMB.

Next, with the probe applied to the surface of the bonding pad PB, there is conducted the second electrical test. High temperature characteristics of the device are mainly checked in the second electrical test. By this electrical test it is judged whether each chip on the semiconductor wafer 1 is good or bad, and the semiconductor memory manufacturing process (wafer process) is completed. Thereafter, the substrate 1 undergoes an assembly step and is then sealed into a plastic package.

(1) According to this embodiment, as set forth above, when the bonding pad BP is exposed by etching the silicon oxide film 37b on the bonding pad, the insulating films 37a and 35 can be retained in sufficient thickness between the bottom of the aperture 41 which is formed at the same time and the fuse 40, so even in the event of entry of moisture from the bottom of the aperture 41 in a pressure cooker test or the like, there is no fear of corrosion near the fuse 40 and wiring line 44.

(2) According to this embodiment, moreover, at the time of etching the silicon oxide film 37b on the bonding pad BP, the over-etching volume of the silicon nitride film 37c becomes smaller, so that sufficient margin against the entry of moisture can be ensured and hence the reliability of the fuse aperture is further improved.

(3) Because the above effects (1) and (2) are attained, it is possible to prevent a change in characteristics of MISFETs $Qp_1$ and $Qp_2$ for load which are easily influenced by moisture, and therefore the reliability of the memory cell MC is improved.

(4) In this embodiment, moreover, since two electrical tests and the repair of defect of the memory cell MC are performed continuously in the final stage of the wafer process, it is not likely at all that between the first and the second electrical test there will occur a change in characteristics of MISFETs $Qp_1$ and $Qp_2$ for load which are apt to undergo thermal damage and the influence of charge-up and other heat treatments at the time of deposition of the final passivation film 37. Consequently, it is possible to judge exactly whether each semiconductor chip is good or bad, thus permitting improvement in both reliability and yield of the chip sorting step.

(5) Further, according to this embodiment, as shown in FIGS. 51A and 51B, since the silicon oxide films 37a and 37b which constitute part of the final passivation film 37 are deposited in two stages, there is no increase in the number of photomasks and the number of steps in etching although the number of manufacturing steps increases by one as compared with the case where the silicon oxide film is deposited thick at a time. Thus, according to this embodiment, by merely modifying the conventional manufacturing process slightly, it is made possible to ensure the reliability of the fuse aperture and judge exactly whether each semiconductor chip is good or bad.

Although the invention accomplished by the present inventor has been described above concretely, it goes without saying that the invention is not limited to the above embodiment and that various modifications may be made within the scope not departing from the gist of the invention.

Figure 33:
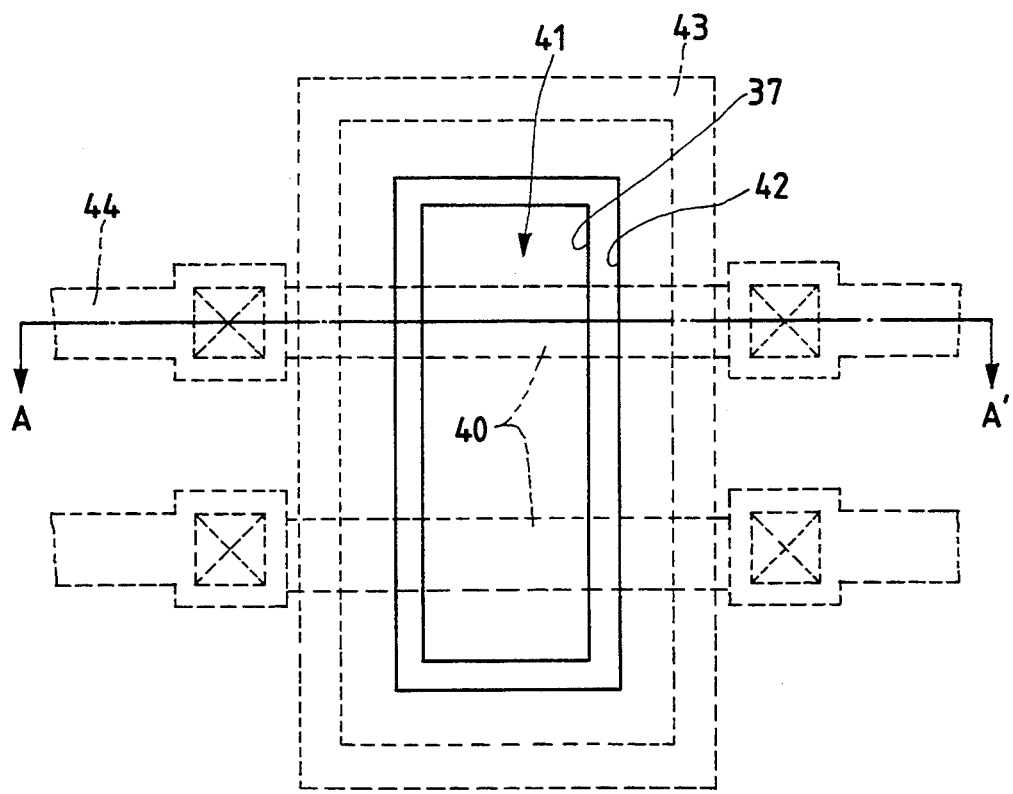
FIG. 33 is a plan view of principal portions of the semiconductor substrate, showing a layout of a guard ring disposed around a fuse.
Figure 34:
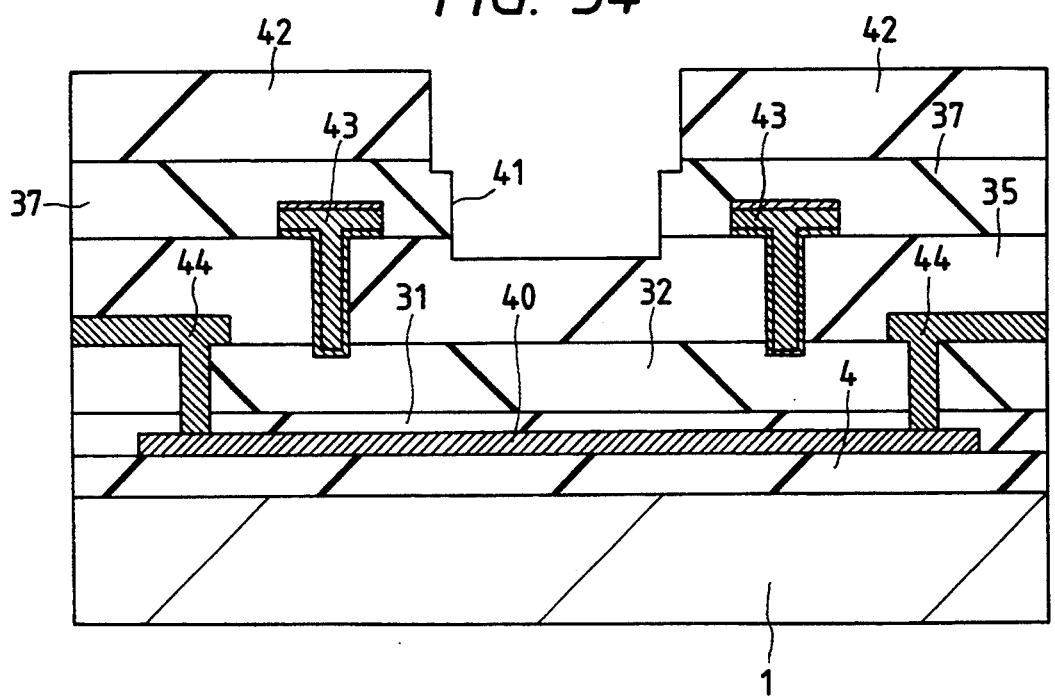
FIG. 34 is a sectional view taken on line A—A' in FIG. 33.
Figure 35:
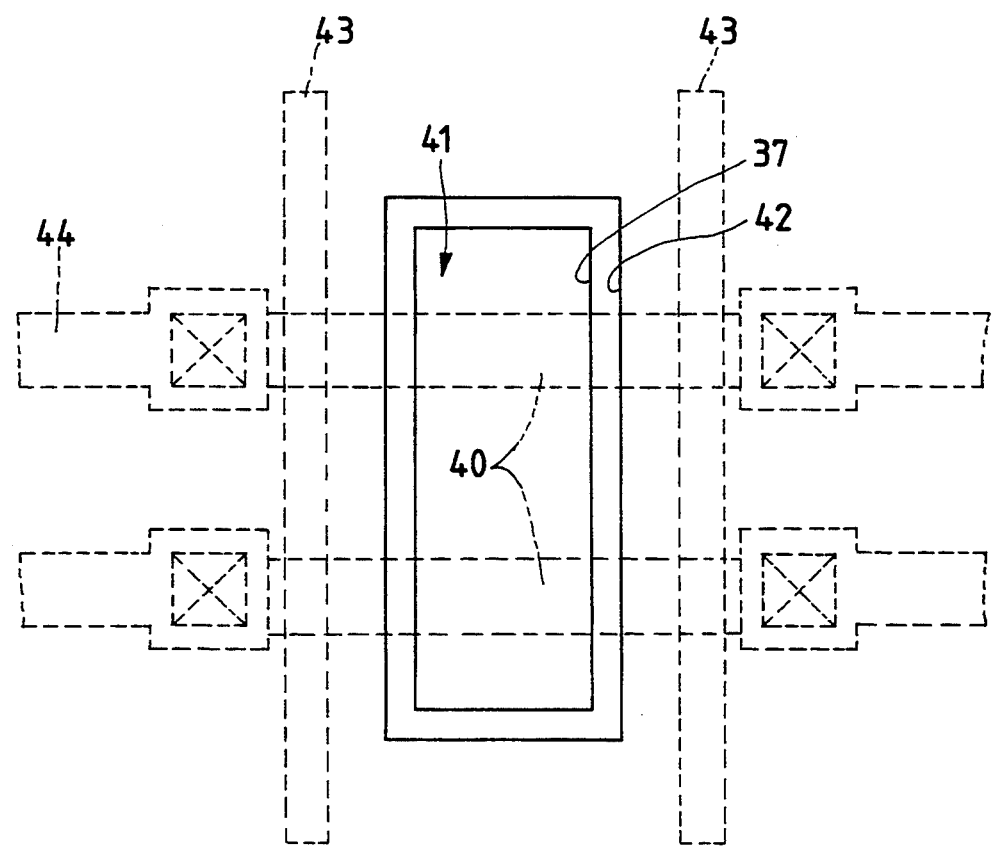
FIG. 35 is a plan view of principal portions of the semiconductor substrate, showing another layout example of guard rings disposed around the fuse.

For example, as shown in FIGS. 33 and 34, the aperture 41 formed above the fuse 40 may be surrounded with a guard ring 43 formed of the wiring material. If the guard ring 43 is formed simultaneously with formation of the complementary data line DL and bonding pad BP using the second-layer wiring material 200 (200a, 200b, 200c), there is no increase in the number of manufacturing steps. By surrounding the fuse 40 with the guard ring 43 it is made possible to prevent the entry of moisture in the transverse direction of the bottom of the aperture 41, so that the reliability of the fuse aperture can be further improved. It is not always necessary to dispose the guard ring 43 throughout the whole circumference of the aperture 41. For example, it may be provided in the longitudinal direction of the aperture 41, as shown in FIG. 35.

Figure 36:
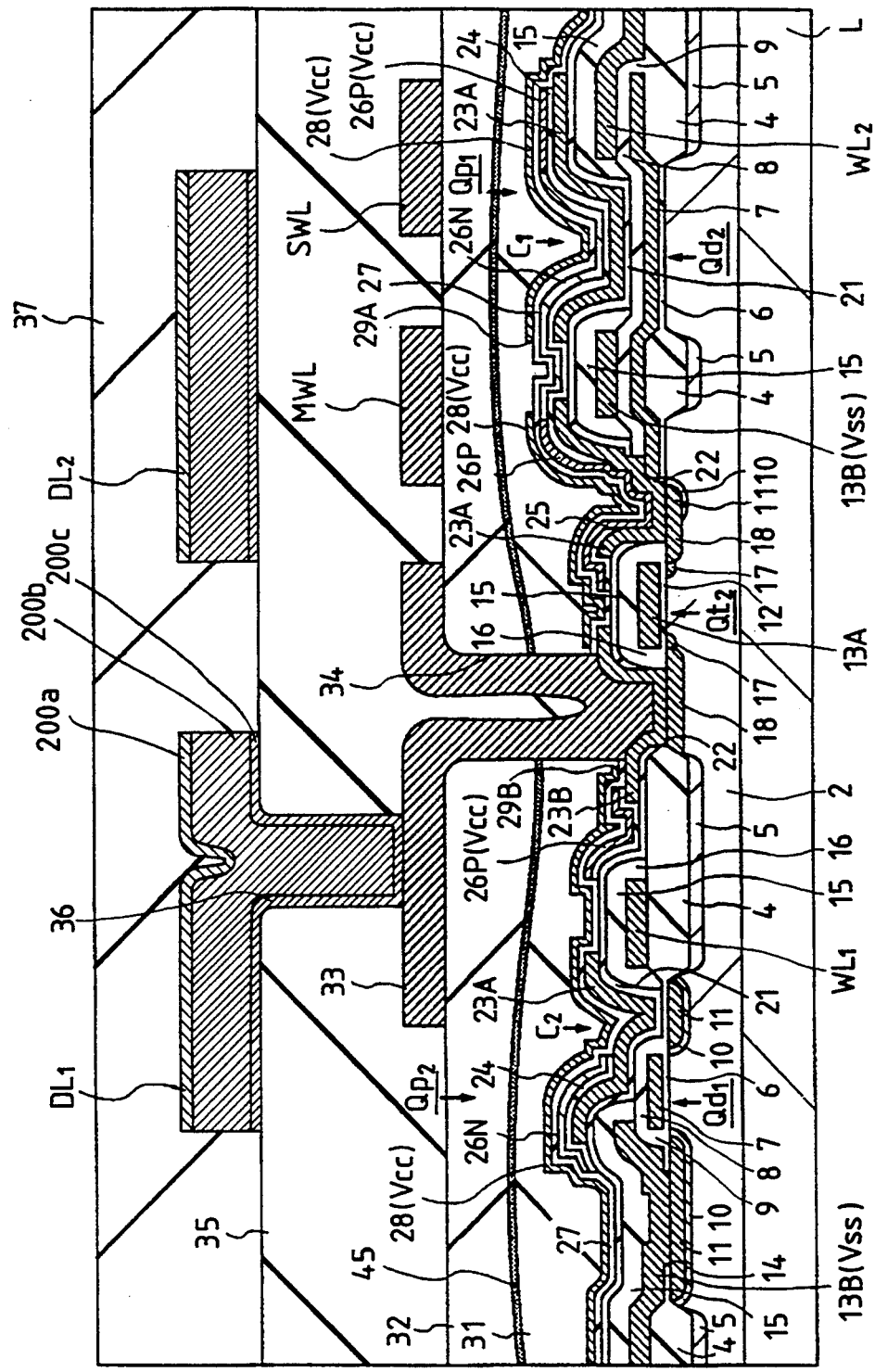
FIG. 36 is a sectional view of principal portions of a semiconductor substrate, showing a memory cell used in a semiconductor integrated circuit device according to another embodiment of the present invention.

Further, as shown in FIG. 36, a silicon nitride film 45 may be formed thin in an upper portion (for example between the insulating film 31 and the interlayer insulating film 32) of the memory cell MC. In this case, even in the event of entry of moisture through the aperture 41, the entry thereof into the memory cell MC is prevented by the silicon nitride film 45 which is highly resistant to wafer, so that it is possible to prevent a change in characteristics of MISFET $Qp_1$ and $Qp_2$ for load which are influenced by moisture very easily, thus permitting improvement in the reliability of the memory cell MC.

Although in the foregoing embodiment the present invention was applied to a SRAM having MISFETs $Qp_1$ and $Qp_2$ for load constituted by a polysilicon film, the present invention is not limited thereto, but is applicable also to a SRAM having a load resistance constituted by a polysilicon film. Moreover, the present invention can be applied not only to SRAMs but also to semiconductor memories at large each having a redundancy circuit provided with a fuse formed by a polysilicon film. Further, the invention is applicable not only to semiconductor memories but also to semiconductor integrated circuit devices each having a circuit which makes fine adjustment of an internal voltage by cutting a fuse formed by a polysilicon film.

The following is a brief explanation of effects attained by typical inventions out of those disclosed herein.

According to the present invention, at the time of exposing a bonding pad by etching the polyimide resin and final passivation film (silicon oxide film) deposited on the bonding pad, a sufficient thickness of insulating film can be allowed to remain between the bottom of an aperture which is formed at the same time and a fuse, so the reliability of the fuse aperture against the entry of moisture is improved. Besides, at the time of etching the silicon oxide film on the bonding pad, the over-etching volume of the silicon nitride film becomes smaller, so it is possible to ensure sufficient margin against the entry of moisture.

According to the present invention, since electrical tests and the cutting of fuse are conducted in the final stage of the wafer process, there is no fear of change in device characteristics after the electrical tests. As a result, it is possible to judge exactly whether each semiconductor chip is good or bad, and therefore the reliability of the chip sorting step and yield are improved.

According to the present invention, moreover, by providing a highly water-resistant silicon nitride film in an overlying relation to the fuse, it is possible to suppress corrosion near the fuse which is caused by the entry of moisture.

Further, according to the present invention, by surrounding the fuse aperture with a guard ring, it is possible to suppress corrosion near the fuse caused by the entry of moisture.

What is claimed is:

1. A method for manufacturing a semiconductor integrated circuit device, comprising steps of:
   (a) providing a semiconductor substrate having a main surface, with a fuse element on said main surface;
   (b) forming an interlayer insulating film over said fuse element so as to cover said fuse element and said main surface;
   (c) forming a wiring line having a bonding pad forming region on said interlayer insulating film;
   (d) forming a first insulating film on said wiring line and said interlayer insulating film so as to cover said main surface;
   (e) selectively removing said first insulating film on said bonding pad forming region by etching;
   (f) forming a second insulating film on said bonding pad forming region and said first insulating film so as to cover said main surface;
   (g) selectively removing said second insulating film on said bonding pad forming region and said fuse element so as to expose said bonding pad forming region of said wiring line and so as to form an aperture over said fuse element by etching;
   (h) conducting an electrical test while applying a probe to said bonding pad forming region; and
   (i) cutting the fuse element under said aperture in accordance with the results of said electrical test.

2. A method for manufacturing a semiconductor integrated circuit device according to claim 1, wherein, in said step (c), said wiring line comprises at least a metallic film and an anti-reflection film formed on said metallic film, and wherein, in said step (e), the anti-reflection film and the first insulating film on said bonding pad forming region are removed by etching.

3. A method for manufacturing a semiconductor integrated circuit device according to claim 2, wherein said semiconductor integrated circuit device has a SRAM including a memory cell, said memory cell comprising a MISFET for transfer controlled by a word line and a flip-flop circuit which comprises a MISFET for drive and a MISFET for load, said MISFET for load being constituted by a polysilicon film deposited on said MISFET for drive, and said interlayer insulating film is formed on said MISFET for load.

4. A method for manufacturing a semiconductor integrated circuit device according to claim 3, wherein after said step (i) there is conducted a second electrical test while applying the probe to said bonding pad forming region.

5. A method for manufacturing a semiconductor integrated circuit device according to claim 3, wherein said first insulating film and said second insulating film are each a silicon oxide film, and said interlayer insulating film is a BPSG film, and wherein said fuse element is formed by a polysilicon film simultaneously with formation of a gate electrode of said MISFET for transfer in the same step as that of forming said gate electrode.

6. A method for manufacturing a semiconductor integrated circuit device according to claim 3, further comprising, between said steps (b) and (c), steps of:
   (j) forming an opening in said interlayer insulating film and around said fuse element; and
   (k) providing a guard ring over said opening and said interlayer insulating film, said guard ring being formed by the same layer of wiring line as said wiring line,
   wherein said guard ring is formed around said aperture formed in said step (g).

7. A method for manufacturing a semiconductor integrated circuit device according to claim 2, wherein said semiconductor integrated circuit device has a SRAM including a memory cell, said memory cell comprising a MISFET for transfer controlled by a word line and a flip-flop circuit which comprises a MISFET for drive and a load resistor, said load resistor being constituted by a polysilicon film deposited on said MISFET for drive, and said interlayer insulating film is formed on said load resistor.

8. A method for manufacturing a semiconductor integrated circuit device according to claim 3, wherein said anti-reflection film is formed of TiN or TiW.

9. A method for manufacturing a semiconductor integrated circuit device which method, in forming a bonding pad on an interlayer insulating film which covers a fuse element, etching a final passivation film deposited on said bonding pad to expose the bonding pad and forming an aperture over said fuse element, comprises the steps of:
   (a) forming a wiring line integrally with said bonding pad on said interlayer insulating film which covers said fuse element;
   (b) depositing a silicon oxide film which constitutes part of said final passivation film over the whole surface of said interlayer insulating film;
   (c) etching said silicon oxide film on said bonding pad to expose the bonding pad, and thereafter depositing again the silicon oxide film which constitutes part of said final passivation film over the whole surface of the silicon oxide film deposited initially;
   (d) depositing a silicon nitride film which constitutes part of said final passivation film over the whole surface of said silicon oxide film;
   (e) etching said silicon nitride film on said bonding pad to expose said silicon oxide film;
   (f) depositing a polyimide resin over the whole surface of said silicon nitride film;
   (g) etching successively said polyimide resin and said silicon oxide on said bonding pad and said fuse element to expose the bonding pad and form an aperture over the fuse element;
   (h) conducting an electrical test while applying a probe to said bonding pad and, where required, cutting said fuse element located under said aperture.

10. A method for manufacturing a semiconductor integrated circuit device according to claim 9,
   wherein, in said step (a), said wiring line comprises at least a metallic film and an anti-reflection film formed on said metallic film,
   wherein by said etching in said step (c) the anti-reflection film and the silicon oxide film are removed and said bonding pad is exposed thereby,
   wherein said anti-reflection film is formed of TiN or TiW, wherein said semiconductor integrated circuit device has a SRAM including a memory cell, said memory cell comprising a MISFET for transfer controlled by a word line and a flip-flop circuit which comprises a MISFET for drive and a MISFET for load, said MISFET for load being constituted by a polysilicon film deposited on said MISFET for drive, wherein said interlayer insulating film includes a BPSG film, and said silicon oxide film is formed on said BPSG film, wherein after said step (h) there is conducted a second electrical test while applying the probe to said bonding pad, and wherein said fuse element is formed by a polysilicon film simultaneously with formation of a gate electrode of said MISFET for transfer in the same step as that of forming said gate electrode.

11. A method for manufacturing a semiconductor integrated circuit device according to claim 10, wherein hydrogen annealing is performed between said steps (c) and (d).

12. A method for manufacturing a semiconductor integrated circuit device according to claim 10, wherein a guard ring formed by the same layer of wiring line as said wiring line is disposed around said aperture formed over said fuse element.

* * * * *